(12) United States Patent
Fujiwara et al.

(10) Patent No.: US 7,961,769 B2
(45) Date of Patent: Jun. 14, 2011

(54) WAVELENGTH TUNABLE SEMICONDUCTOR LASER DEVICE, CONTROLLER FOR THE SAME, AND CONTROL METHOD FOR THE SAME

(75) Inventors: Naoki Fujiwara, Atsugi (JP); Hiroyuki Ishii, Atsugi (JP); Hiromi Oohashi, Atsugi (JP); Hiroshi Okamoto, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 12/529,337

(22) PCT Filed: Mar. 7, 2008

(86) PCT No.: PCT/JP2008/054212
§ 371 (c)(1),
(2), (4) Date: Aug. 31, 2009

(87) PCT Pub. No.: WO2008/108475
PCT Pub. Date: Sep. 12, 2008

(65) Prior Publication Data
US 2010/0103963 A1    Apr. 29, 2010

(30) Foreign Application Priority Data
Mar. 8, 2007    (JP) .................................. 2007-058090

(51) Int. Cl.
*H01S 5/00*    (2006.01)
(52) U.S. Cl. ............... 372/50.121; 372/50.12; 372/50.1; 372/20

(58) Field of Classification Search ............. 372/50.121, 372/50.12, 50.1, 20
See application file for complete search history.

(56) References Cited

U.S. PATENT DOCUMENTS

| | | | |
|---|---|---|---|
| 2001/0005388 A1 | 6/2001 | Hirata et al. | |
| 2003/0194827 A1* | 10/2003 | Lentz et al. | ............ 438/71 |
| 2004/0188518 A1 | 9/2004 | McDonald | |
| 2005/0041699 A1 | 2/2005 | White et al. | |
| 2007/0071055 A1 | 3/2007 | Fuji | |
| 2009/0086206 A1 | 4/2009 | Mori | |

FOREIGN PATENT DOCUMENTS

| | | |
|---|---|---|
| EP | 1 737 089 A1 | 12/2006 |
| EP | 1 750 336 A1 | 2/2007 |
| JP | 07106548 | 4/1995 |

(Continued)

OTHER PUBLICATIONS

Extended European Search Report dated Apr. 1, 2010, issued in related European Application No. 08721629.7.

(Continued)

*Primary Examiner* — Kinam Park
(74) *Attorney, Agent, or Firm* — Workman Nydegger

(57) ABSTRACT

An object is to provide a wavelength tunable semiconductor laser device, a controller for the same and a control method for the same, which prevent wavelength drifts. The wavelength tunable semiconductor laser device includes an active region for oscillating a laser beam, and a wavelength tuning region for shifting a wavelength of the laser beam. In this device, a thermal compensation region for converting most of the inputted electric power to heat is provided adjacent to the wavelength tuning region, and the sum of an electric power inputted into the wavelength tuning region and an electric power inputted into the thermal compensation region is always kept constant.

26 Claims, 30 Drawing Sheets

FOREIGN PATENT DOCUMENTS

| | | |
|---|---|---|
| JP | 8-236869 | 9/1996 |
| JP | 10-256676 | 9/1998 |
| JP | 3168855 | 3/2001 |
| JP | 3257185 | 7/2001 |
| JP | 2001-326418 | 11/2001 |
| JP | 2002-43698 | 2/2002 |
| JP | 2004-536459 | 12/2004 |
| JP | 2005-101039 | 4/2005 |
| JP | 2005101039 A * | 4/2005 |
| JP | 2005-276902 | 10/2005 |
| JP | 2006-261424 | 9/2006 |
| WO | WO 2005/117217 A1 | 12/2005 |

OTHER PUBLICATIONS

Tetsuhiko Ikegami, *Semiconductor Photonics*, Corona Publishing, Oct. 10, 1995, pp. 306-311.

Nunzio P. Caponio et al., *Analysis and Design Criteria of Three-Section DBR Tunable Lasers*, IEEE Journal on Selected Areas in Communications, vol. 8, No. 6, Aug. 1990, pp. 1203-1213.

Osamu Ishida et al., *Fast and Stable Frequency Switching Employing a Delayed Self-Duplex (DSD) Light Source*, IEEE Photonics Technology Letters, vol. 6, No. 1, Jan. 1994, pp. 13-16.

Hiroyuki Ishii, *Doctoral Dissertation: Research on Enhancing Performance of Wavelength Tunable Semiconductor Laser Device*, Mar. 1999, Chapter 4.

Hiroyuki Ishii et al., *Super Structure Grating (SSG) for Broadly Tunable DBR Lasers*, IEEE Photonics Technology Letters, vol. 4, No. 4, Apr. 1993, pp. 393-395.

Yuichi Tohmori et al., *Broad-Range Wavelength-Tunable Superstructure Grating (SSG) DBR Lasers*, IEEE Journal of Quantum Electronics, vol. 29, No. 6, Jun. 1993, pp. 1817-1823.

European Extended Search Report issued on Sep. 8, 2010 in corresponding European Patent Application No. 10167736.7.

Office Action issued on Sep. 15, 2010 in counterpart European Patent Application 08721629.7.

* cited by examiner

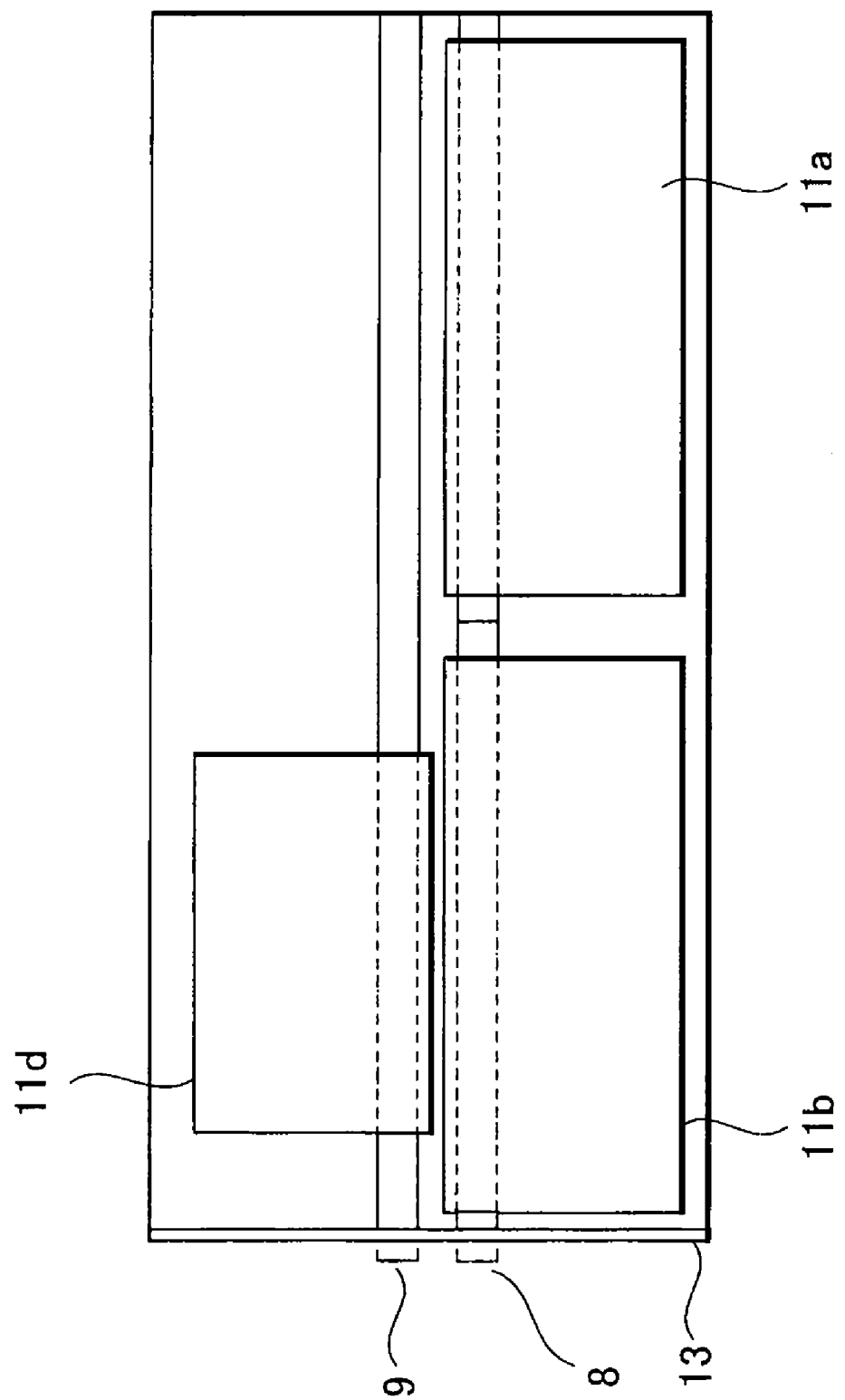

WAVELENGTH TUNABLE SEMICONDUCTOR LASER DEVICE, CONTROLLER FOR THE SAME, AND CONTROL METHOD FOR THE SAME

TECHNICAL FIELD

The present invention relates to a wavelength tunable semiconductor laser device used as a wavelength tunable light source, a controller for the same, and a control method for the same.

BACKGROUND ART

A distributed Bragg reflector laser (hereinafter referred to as a "DBR laser." DBR: Distributed Bragg Reflector) is used as a high-speed wavelength tunable laser by injecting an electric current into a DBR region serving as a distributed Bragg reflector and into a phase control region (Non-Patent Document 1). Once an electric current is injected into the DBR region and the phase control region, the refractive index of a waveguide core layer decreases due to a plasma effect. This allows shifting the lasing wavelength to its shorter wavelength side. The response speed of the wavelength tuning due to the plasma effect is extremely high, and is the order of $10^{-9}$ seconds in theory. However, heat is generated due to a resistance component of the semiconductor device when the electric current is injected, and makes the lasing wavelength change gradually. As a result, it takes approximately $10^{-3}$ seconds for the lasing wavelength to become stable. The wavelength drift due to the heat in the order of $10^{-3}$ seconds is extremely slower than the response speed of the wavelength tuning due to the plasma effect, which causes a serious problem of making the tuning speed slower. To solve this problem, a number of methods have been proposed (Patent Documents 1 and 2 as well as Non-Patent Documents 2 and 3).

To solve the above-described problem, calculated in Non-patent Document 2 is the temperature rise of the top surface of a device in the case where an electric current injected into the device is changed. However, this method is incapable of directly monitoring the junction voltage. In addition, this method requires investigation of the thermal resistance between an optical waveguide on a top surface of the device and a heat sink on a bottom surface of the device. For these reasons, this method is unsuitable for mass production.

In Non-patent Document 3, detailed control is periodically provided by use of an apparatus comprising an optical branching filter and a delay optical fiber, to prevent wavelength drifts. In practice, this method branches a part of light with a stable wavelength into two portions, and thereafter duplexes together the thus-branched portions of the light in a final stage with one of the two branched portions thereof being delayed. However, this method requires the quantity of inputted heat, heat capacity, and parameters for the heat exhaustion rate and the like called thermal resistance to be found beforehand in order to keep the temperature constant. Thus, this method requires various preparations to be made in order to provide precise control. Moreover, this method needs equipment such as the optical branching filter and the delay optical fiber in order to configure a light source, and is thus disadvantageous in cost as well.

In Patent Document 1, thermal compensation is provided by use of a thermal compensation controlling electrode. To this end, a value of an electric current injected into a thermal compensation region is determined by use of a correction coefficient. Patent Document 1 describes in Paragraph 0024 that this correction coefficient is automatically determined by an apparatus. However, determination of the correction coefficient requires an extraordinarily long time. This is because, for the determination of the correction coefficient, the parameters need to be determined on the basis of a result of monitoring the lasing wavelengths of the laser at the time of static drive and high-speed wavelength switching while frequently changing the thermal compensation current. Furthermore, the method is incapable of precise fitting since the fitting expression for controlling the laser includes neither a first-order term nor a constant term.

Thermal compensation is provided by use of a thermal compensation controlling electrode in Patent Document 2 as well. However, in Patent Document 2, neither a device resistance of a wavelength tuning region nor a device resistance of a thermal compensation region is included as a control element. As a result, this thermal compensation region needs to have a resistance equal to that of the wavelength tuning region. This requires the thermal compensation region and the wavelength tuning region to have the same shape and electric resistance. For this reason, this control method has a problem of being incapable of dealing with anything but a specific device, and of being accordingly incapable of preventing the wavelength drifts when the device resistance is different from one another. Furthermore, this control method requires the device manufacturing process to be pursued with high precision, with high uniformity, and with high reproducibility. As a result, this control method causes a problem of decrease in yields and increase in cost in the device manufacturing process. Moreover, this control method includes neither a second-order term nor a constant term in the fitting expression for controlling the laser, and is hence incapable of precise fitting.

As described above, the methods having so far been proposed bear various problems. Accordingly, no practical method has been proposed yet.

In the following, a configuration of a conventional DBR laser will be shown. In addition, a measurement result of wavelength drifts which occur due to heat will be shown. FIG. 27 shows a top view of a 2-section DBR laser as the conventional DBR laser, in which a total of two regions including an active region and a DBR region are illustrated with their respective simplified configurations. FIGS. 28A, 28B, 28C respectively show cross-sectional views of the DBR laser taken along a XXVIIIA-XXVIIIA line, a XXVIIIB-XXVIIIB line, and a XXVIIIC-XXVIIIC line in FIG. 27.

The conventional DBR laser shown in FIGS. 27, 28A, 28B and 28C includes: an active region 173 for oscillating a laser beam; and a DBR region 175 for shifting the wavelength of the laser beam. The active region 173 includes: an active layer 172 linearly formed on a substrate serving as a lower clad 171; and an upper clad 177 formed in a convex shape on the active layer 172. The DBR region 175 includes: a non-active layer 174 formed on the lower clad 171; a diffraction grating 176 formed in the top surface of a portion of the non-active layer 174, the portion and the active layer 172 being arranged in a straight line; and an upper clad 177 formed in a convex shape on the diffraction grating 176. With this configuration, an optical waveguide in each of the active region 173 and the DBR region 175 is formed in a mesa structure.

In addition, the conventional DBR laser includes an insulating film 178 which is formed on surfaces of the active layer 172, the non-active layer 174 and the upper clad 177 excluding the top surface of the upper clad 177. As electrodes, an active region electrode 179a, a DBR region electrode 179b and a lower electrode 180 are included. The active region electrode 179a is formed on the top surface of a portion, which constitutes the active region 173, of the upper clad 177.

The DBR region electrode 179b is formed on the top surface of a portion, which constitutes the DBR region 175, of the upper clad 177. The lower electrode 180 is formed on the bottom surface of the lower clad 171. Moreover, an antireflection coating (hereinafter referred to as an "AR coating") 181 is formed on a side end surface of the non-active layer 174, which constitutes the DBR region 175.

As described above, the conventional DBR laser comprises the active region 173 and the DBR region 175, and forms a laser cavity with the reflectance factor of approximate 30% of the cleavage end surface of the active layer 173, and the reflection structure of the DBR region 175. Thus, the conventional DBR laser oscillates a laser beam when an electric current is injected into the active region electrode 179a, while shifting the wavelength of the laser beam when an electric current is injected into the DBR region electrode 179b.

FIG. 29 shows how wavelengths (frequencies) behave when the wavelengths are switched back and forth by changing a value of an electric current to be injected into the DBR region electrode 179b in the conventional DBR laser.

In this case, the value of the electric current injected into the DBR region electrode 179b is alternately switched between 20 mA and 53 mA every 4 milliseconds to thereby output wavelengths corresponding to 192.75 THz and 193.15 THz alternately. For clear understanding of how the wavelengths are drifted due to heat, FIGS. 30A and 30B respectively show behaviors of the wavelengths by magnifying the vertical axis scale of FIG. 29 to 10 GHz. The wavelength shown in FIG. 30A is drifted by approximately 2 GHz, whereas the wavelength shown in FIG. 30B is drifted by approximately 6 GHz. The wavelength drift shown in FIG. 30B which occurs due to the heat each time the electric current is switched from the lower to higher levels is larger than the wavelength drift shown in FIG. 30A.

The present invention has been conceived in consideration of the above-described problems. An object of the present invention is to provide a wavelength tunable semiconductor laser device, a controller for the same and a control method for the same, which are capable of preventing wavelength drifts attributable to a heat collaterally generated when a wavelength is tuned by use of a plasma effect.

[Patent Document 1] Japanese Patent No. 3168855
[Patent Document 2] Japanese Patent No. 3257185
[Non-patent Document 1] Tetsuhiko Ikegami, "Semiconductor Photonics," Corona Publishing, Oct. 10, 1995, pp. 306-311.
[Non-patent Document 2] Nunzio P. Caponio et al., "Analysis and Design Criteria of Three-section DBR Tunable Lasers," IEEE Journal on Selected Areas in Communications, August 1990, vol. 8, no. 2, pp. 1203-1213.
[Non-patent Document 3] Osamu Ishida et al., "Fast and stable Frequency Switching Employing a Delayed Self-Duplex (DSD) Light Source," IEEE Photonics Technology Letters, January 1994, vol. 6, no. 1, pp. 13-16.
[Non-patent Document 4] Ishii Hiroyuki, "Doctoral dissertation: Research on Enhancing Performance of Wavelength Tunable Semiconductor Laser Device," March 1999, Chapter 4.

DISCLOSURE OF THE INVENTION

A wavelength tunable semiconductor laser device according to a first aspect of the present invention for solving the above-described problems is a wavelength tunable semiconductor laser device comprising an active region for oscillating a laser beam and a wavelength tuning region for shifting a wavelength of the laser beam. The wavelength tunable semiconductor laser device is characterized in that a thermal compensation region is provided adjacent to the wavelength tuning region, the thermal compensation region receiving an input of an electric power and converting most of the inputted electric power to heat. The sum of the electric power inputted into the thermal compensation region and an electric power inputted into the wavelength tuning region is always kept constant.

A wavelength tunable semiconductor laser device according to a second aspect of the present invention for solving the above-described problems is a wavelength tunable semiconductor laser device comprising an active region for oscillating a laser beam, and a plurality of wavelength tuning regions each for shifting a wavelength of the laser beam. The wavelength tunable semiconductor laser device is characterized in that a thermal compensation region corresponding to each of the plurality of wavelength tuning regions is provided adjacent to the wavelength tuning region. The thermal compensation region receives an input of an electric power and converts most of the inputted electric power to heat. The sum of the electric power inputted into the compensation region and an electric power inputted into the wavelength tuning region is always kept constant.

A wavelength tunable semiconductor laser device according to a third aspect of the present invention for solving the above-described problems is a wavelength tunable semiconductor laser device comprising an active region for oscillating a laser beam, a first wavelength tuning region for shifting a wavelength of the laser beam, a second wavelength tuning region for shifting a wavelength of the laser beam, and a phase control region for adjusting a phase of the laser beam. The wavelength tunable semiconductor laser device is characterized in that: a first thermal compensation region is provided adjacent to the first wavelength tuning region, the first thermal compensation region receiving an input of an electric power and converting most of the inputted electric power to heat, the sum of the electric power inputted into the first thermal compensation region and an electric power inputted into the first wavelength tuning region being always kept constant; a second thermal compensation region is provided adjacent to the second wavelength tuning region, the second thermal compensation region receiving an input of an electric power and converting most of the inputted electric power to heat, the sum of the electric power inputted into the second thermal compensation region and an electric power inputted into the second wavelength tuning region being always kept constant; and a third thermal compensation region is provided adjacent to the phase control region, the third thermal compensation region receiving an input of an electric power and converting most of the inputted electric power to heat, the sum of the electric power inputted into the third thermal compensation region and an electric power inputted into the phase control region being always kept constant.

A wavelength tunable semiconductor laser device according to a fourth aspect of the present invention for solving the above-described problems is the wavelength tunable semiconductor laser device according to any one of the first to third aspect of the present invention. The device is characterized in that: each thermal compensation region comprises an electric resistor; and each thermal compensation region converts most of the inputted electric power to the heat by injecting an electric current into the electric resistor or applying a voltage to the electric resistor.

A wavelength tunable semiconductor laser device according to a fifth aspect of the present invention for solving the above-described problems is the wavelength tunable semiconductor laser device according to any one of the first to third aspect of the present invention. The device is characterized in that: each thermal compensation region comprises anon-active waveguide; and each thermal compensation region converts most of the inputted electric power to the heat by injecting an electric current into the non-active waveguide or applying a voltage to the non-active waveguide.

A wavelength tunable semiconductor laser device according to a sixth aspect of the present invention for solving the above-described problems is the wavelength tunable semiconductor laser device according to the fifth aspect of the present invention. The device is characterized in that the non-active waveguide constituting each thermal compensation region has a mesa structure.

A wavelength tunable semiconductor laser device according to a seventh aspect of the present invention for solving the above-described problem is the wavelength tunable semiconductor laser device according to the sixth aspect of the present invention. The device is characterized in that a semiconductor insulating film is formed on each of two side surfaces of the mesa structure. The semiconductor insulating layer is insulated by doping a semiconductor layer with ruthenium.

A wavelength tunable semiconductor laser device according to an eighth aspect of the present invention for solving the above-described problems is a wavelength tunable semiconductor laser device comprising a plurality of laser regions each including an active region for oscillating a laser beam and a wavelength tuning region for shifting a wavelength of the laser beam; and an optical coupler optically connected to the plurality of laser regions for providing an optical coupling among the plurality of laser regions. The wavelength tunable semiconductor laser device is characterized in that: the plurality of laser regions are arranged in parallel to and adjacent to each other; and the total sum of electric powers inputted into the wavelength tuning regions of the plurality of laser regions is always kept constant.

A wavelength tunable semiconductor laser device according to a ninth aspect of the present invention for solving the above-described problems is the wavelength tunable semiconductor laser device according to any one of the first to eighth aspect of the present invention. The device is characterized in that a waveguide constituting each active region and each wavelength tuning region is the other mesa structure.

A wavelength tunable semiconductor laser device according to a tenth aspect of the present invention for solving the above-described problems is the wavelength tunable semiconductor laser device according to the ninth invention. The device is characterized in that a semiconductor insulating layer is formed on each of two side surfaces of said other mesa structure. The semiconductor insulating layer is insulated by doping a semiconductor layer with ruthenium.

A wavelength tunable semiconductor laser device according to an eleventh aspect of the present invention for solving the above-described problems is the wavelength tunable semiconductor laser device according to any one of the first to tenth aspect of the present invention. The device is characterized in that each wavelength tuning region is partially or entirely comprised of a non-active waveguide in which a distributed reflector-type diffraction grating is formed or a non-active waveguide serving as the phase control region.

A method of controlling a wavelength tunable semiconductor laser device according to a twelfth aspect of the present invention for solving the above-described problems is a control method for a wavelength tunable semiconductor laser device including an active region for oscillating a laser beam, a wavelength tuning region for shifting a wavelength of the laser beam, and a thermal compensation region provided adjacent to the wavelength tuning region for converting most of the inputted electric power to heat. The control method for a wavelength tunable semiconductor laser device comprises the step of, when a laser beam is oscillated from the wavelength tunable semiconductor laser device, controlling an electric current or voltage applied to each of the wavelength tuning region and the thermal compensation region so that the sum of an electric power inputted into the wavelength tuning region and an electric power inputted into the thermal compensation region should is always kept constant.

A method of controlling a wavelength tunable semiconductor laser device according to a thirteenth aspect of the present invention for solving the above-described problems is a control method for a wavelength tunable semiconductor laser device including an active region for oscillating a laser beam, a wavelength tuning region for shifting a wavelength of the laser beam, and a thermal compensation region provided adjacent to the wavelength tuning region for converting most of the inputted electric power to heat. The control method for a wavelength tunable semiconductor laser device is characterized by comprising, when a laser beam is oscillated from the wavelength tunable semiconductor laser device: measuring an electric current-voltage characteristic of each of the wavelength tuning region and the thermal compensation region; finding an electric current-electric power characteristic of each of the wavelength tuning region and the thermal compensation region from the electric current-voltage characteristics; and on the basis of the electric current-voltage characteristics and the electric current-electric power characteristics, determining to control an electric current or voltage applied to each of the wavelength tuning region and the thermal compensation region so that the sum of an electric power inputted into the wavelength tuning region and an electric power inputted into the thermal compensation region is always kept constant.

A method of controlling a wavelength tunable semiconductor laser device according to a fourteenth aspect of the present invention for solving the above-described problems is the control method for a wavelength tunable semiconductor laser device according to the thirteenth aspect of the present invention. The method is characterized in that when the electric current or voltage applied to each of the wavelength tuning region and the thermal compensation region is determined, the electric current or voltage applied to each of the wavelength tuning region and the thermal compensation region is determined on the basis of a simultaneous equation of the electric current-electric power characteristic of the wavelength tuning region and the electric current-electric power characteristic of the thermal compensation region under the condition that the sum of the electric power inputted into the wavelength tuning region and the electric power inputted into the thermal compensation region is always kept constant.

A method of controlling a wavelength tunable semiconductor laser device according to a fifteenth aspect of the present invention for solving the above-described problems is the control method for a wavelength tunable semiconductor laser device according to any one of the twelfth to fourteenth aspect of the present invention. The method is characterized by comprising the steps of: finding beforehand the dependency of spontaneously-emitted light on an electric current or voltage in each of the wavelength tuning region and the thermal compensation region; subtracting an electric power lost in the wavelength tuning region due to the spontaneously-emitted light and an electric power lost in the thermal compensation region due to the spontaneously-emitted light from the sum of the electric power inputted into the wavelength tuning region and the electric power inputted into the thermal compensation region; and controlling the electric current or voltage applied to each of the wavelength tuning region and the thermal compensation region so that an electric power remaining after the subtraction is always kept constant.

An apparatus for controlling a wavelength tunable semiconductor laser device according to a sixteenth aspect of the present invention for solving the above-described problems is a controller for a wavelength tunable semiconductor laser device including an active region for oscillating a laser beam, a wavelength tuning region for shifting a wavelength of the laser beam and a thermal compensation region provided adjacent to the wavelength tuning region for converting most of the inputted electric power to heat. The controller for a wavelength tunable semiconductor laser device is characterized by comprising a controlling unit for controlling an electric current or voltage applied to each of the wavelength tuning region and the thermal compensation region so that the sum of an electric power inputted into the wavelength tuning region and an electric power inputted into the thermal compensation region is always kept constant when the laser beam is oscillated from the wavelength tunable semiconductor laser device.

An apparatus for controlling a wavelength tunable semiconductor laser device according to a seventeenth aspect of the present invention for solving the above-described problems is a controller for a wavelength tunable semiconductor laser device including an active region for oscillating a laser beam, a wavelength tuning region for shifting a wavelength of the laser beam, and a thermal compensation region provided adjacent to the wavelength tuning region for converting most of the inputted electric power to heat. The controller for a wavelength tunable semiconductor laser device is characterized by comprising: an inputting unit for inputting an electric current or a voltage into each of the active region, the wavelength tuning region and the thermal compensation region; a measuring unit for measuring an electric current-voltage characteristic of each of the wavelength tuning region and the thermal compensation region; a storage unit for storing the measured electric current-voltage characteristics; a processing unit for calculating an electric current-electric power characteristic of each of the wavelength tuning region and the thermal compensation region from the stored electric current-voltage characteristics, and for determining an electric current or voltage applied to each of the wavelength tuning region and the thermal compensation region so that the sum of an electric power inputted into the wavelength tuning region and an electric power inputted into the thermal compensation region is always kept constant on the basis of the electric current-voltage characteristics and the electric current-electric power characteristics; and a controlling unit for controlling the determined electric currents or voltages in order to input the determined electric currents or voltages into the wavelength tuning region and the thermal compensation region.

An apparatus for controlling a wavelength tunable semiconductor laser device according to an eighteenth aspect of the present invention for solving the above-described problems is the controller for a wavelength tunable semiconductor laser device according to the seventeenth aspect of the present invention. The controller is characterized in that when the processing unit determines the electric current or voltage applied to each of the wavelength tuning region and the thermal compensation region, the processing unit determines the electric current or voltage applied to each of the wavelength tuning region and the thermal compensation region on the basis of a simultaneous equation of the electric current-electric power characteristic of the wavelength tuning region and the electric current-electric power characteristic of the thermal compensation region under a condition that the sum of the electric power inputted into the wavelength tuning region and the electric power inputted into the thermal compensation region is always kept constant.

An apparatus for controlling a wavelength tunable semiconductor laser device according to an nineteenth aspect of the present invention for solving the above-described problems is the controller for a wavelength tunable semiconductor laser device according to any one of the seventeenth and eighteenth aspect of the present invention. The controller is characterized in that: the storage unit stores a dependency of spontaneously-emitted light on an electric current or voltage in each of the wavelength tuning region and the thermal compensation region; and the processing unit subtracts an electric power lost in the wavelength tuning region due to the spontaneously-emitted light and an electric power lost in the thermal compensation region due to the spontaneously-emitted light from the sum of the electric power inputted into the wavelength tuning region and the electric power inputted into the thermal compensation region, and determines the electric current or voltage applied to each of the wavelength tuning region and the thermal compensation region so that an electric power remaining after the subtraction is always kept constant.

BRIEF DESCRIPTION OF THE DRAWINGS

FIG. 10 is a top view showing a modification of the wavelength tunable semiconductor laser device shown in FIG. 1.

BEST MODE FOR CARRYING OUT THE INVENTION

Figure 1:
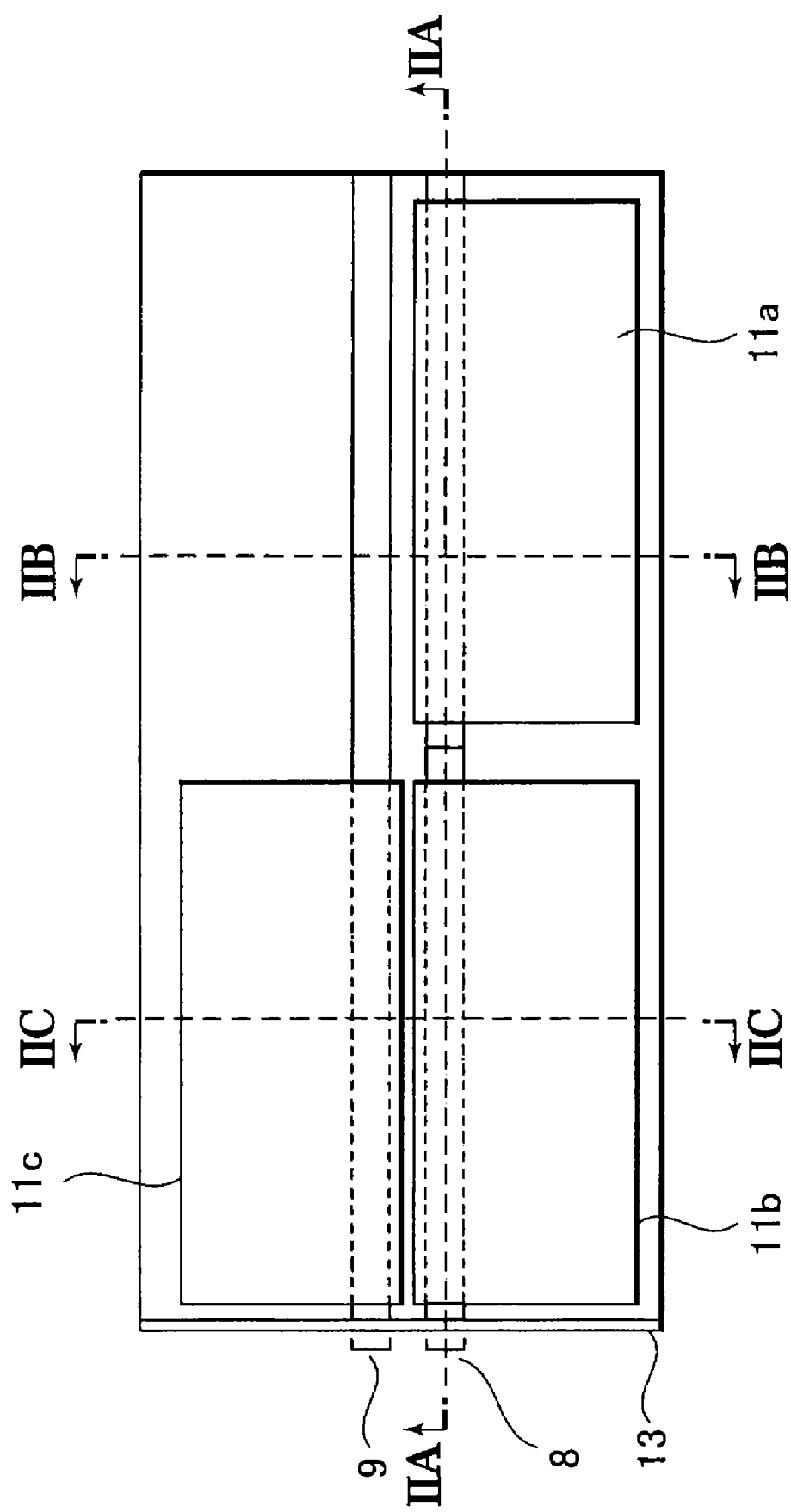
FIG. 1 is a top view showing an example of a wavelength tunable semiconductor laser device according to the present invention.

Referring to the drawings, detailed description will be now provided for the embodiment of the present invention.

To begin with, brief descriptions will be provided for how a wavelength tunable semiconductor laser device using plasma effect, such as a DBR laser, distributes an electric power to its wavelength tuning region when an electric current is injected into the wavelength tuning region, and how the distributed electric power disappears.

Once a forward bias is applied to a PIN structure semiconductor constituting the wavelength tunable semiconductor laser device, the electric current starts to flow when the applied voltage becomes larger than a certain value (called "built-in voltage"). The characteristic of an electric resistance value of the semiconductor is extremely different from the characteristic of a resistance value of an electric resistor used in a regular electronic circuit and a resistance of a filament included in an incandescent electric lamp and the like. The resistance value of the semiconductor is a function of a value of a forward bias current. Accordingly, the resistance value of the semiconductor changes moment by moment in response to the value of the forward bias current.

Figure 4A:
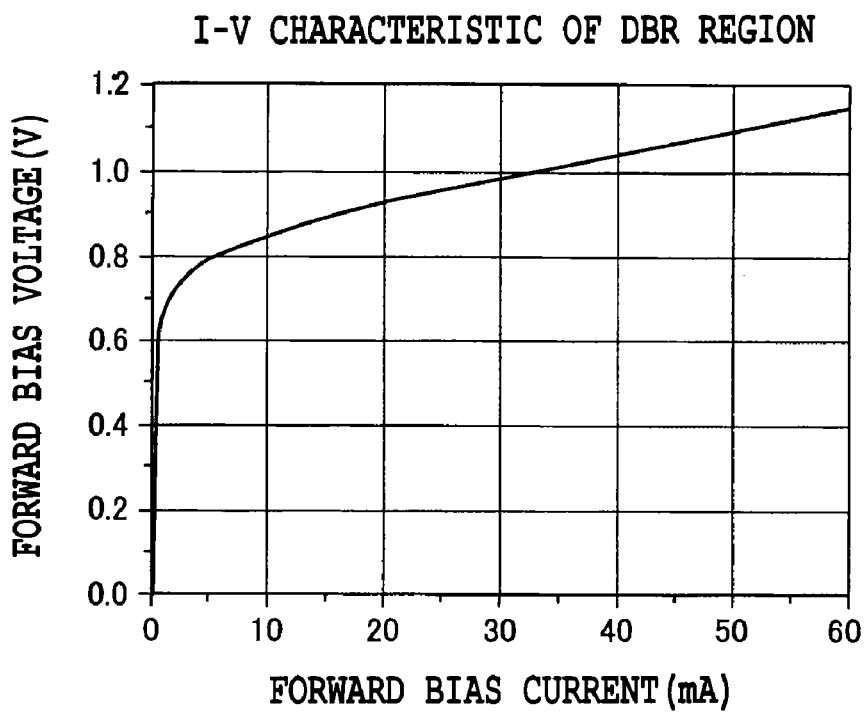
FIG. 4A is a graph showing an I-V characteristic of a DBR region in the wavelength tunable semiconductor laser device according to the present invention.

FIG. 4A, described later, is a graph which represents a relationship plotted between an electric current and a voltage applied to the semiconductor. Table 1 shows values of voltages corresponding to values of electric currents 10 mA, 20 mA and 30 mA shown in FIG. 4A, as well as resistance values calculated for the respective values of the electric currents.

TABLE 1

| Value of Electric Current (mA) | Voltage (V) | Resistance ($\Omega$) |
| --- | --- | --- |
| 10 | 0.851 | 85.087 |
| 20 | 0.925 | 46.256 |
| 30 | 0.987 | 32.813 |

As clear from Table 1, whenever the electric current (or the value of the voltage) changes, the resistance value changes as well. For this reason, an energy which is inputted into the wavelength tunable semiconductor laser device when the electric current is applied to the semiconductor needs to be found as a product P (P=I×V) of a value I (A: ampere) of an electric current and a value V (V: volt) of a voltage. Here, the electric current and voltage are those which are applied to the semiconductor while the wavelength tunable semiconductor laser device is actually being driven.

An electric power which is inputted into the wavelength tunable semiconductor laser device while the wavelength tunable semiconductor laser device is being driven at a certain value of the electric current may be found each time as a product of values of a voltage and an electric current which are actually applied to the semiconductor. Otherwise, the electric power inputted may be found by substituting values of an electric current and a voltage into an approximate expression which is obtained by fitting on the basis of data from a voltage-electric current characteristic measured in advance. The electric power found with this method is actually inputted into the semiconductor laser device. However, part of the energy is emitted to the outside of the semiconductor laser device after converted to light through luminescent recombination (hereinafter referred to as "spontaneous emission"), whereas the rest of the energy is converted to heat.

What is noteworthy in this respect is that, unlike an electric power inputted into an active region and a semiconductor optical amplifier (hereinafter called "SOA"), an electric power inputted into the wavelength tuning region is hardly emitted to the outside of the wavelength tuning region as light energy because the electric power inputted into the wavelength tuning region does not lead to stimulated emission of light. Part of the electric power inputted into the wavelength tuning region is emitted to the outside of the wavelength tuning region through spontaneous emission, though, the amount of energy lost by the spontaneous emission is extremely smaller than (at a maximum of approximately 5% of) the amount of energy which is inputted into the wavelength tuning region. As a result, most of the electric power inputted into the wavelength tuning region is converted to heat. As long as the semiconductor does not change irreversibly while the forward bias is being applied to the semiconductor (as long as no energy is consumed to damage the semiconductor), the energy inputted into the semiconductor by applying an electricity to the semiconductor can be deemed as converted to light energy or thermal energy.

Therefore, most of the electric power inputted into the wavelength tuning region is converted to heat. For this reason, an electric power inputted into the wavelength tuning region and its vicinity may be always kept constant for the purpose of always keeping the temperature of the wavelength tuning region and its vicinity constant. In addition, an electric power remaining after subtracting an electric power lost through spontaneous emission from the inputted electric power is converted to heat. For this reason, the temperature of the device can be made more stable if the electric power to be converted to heat is controlled to be always kept constant.

Now, description will be given for how heat is generated and how the generated heat is emitted. The generated heat is emitted to the outside of the semiconductor laser device through a heat sink located on the back surface of the device and through the air existing around the device. The speed at which the heat is emitted from the device is decided by a parameter called thermal resistance. As a result, once the amount of heat generated in the semiconductor laser device changes, the stationary state of the heat deviates from what the stationary state of the heat used to be and the temperature of the device changes in fact.

The semiconductor laser device is used while housed in what is called module, such as a metal or plastic case in which electrodes are wired. A Peltier element controls the inner temperature of the module to keep the temperature constant. Nevertheless, a thermistor for measuring the temperature is installed at the heat sink or the like located in the vicinity of the semiconductor laser device. As a result, it is impossible to measure the temperature of the semiconductor laser device itself. For this reason, the semiconductor laser device itself is incapable of avoiding a wavelength drifts which occur due to the heat, even in the case of the module whose temperature is controlled by the Peltier device (Non-patent Document 2).

Furthermore, even if a semiconductor laser device with completely the same configuration is assembled into a module, the thermal resistance changes in bonded parts depending on how the bonded parts are bonded with solder. For this reason, the conventional method of feeding back the thermal transient response to the temperature of the device on the basis of a calculation is unrealistic. The present invention is capable of preventing wavelength drifts without calculating any thermal transient response by use of a thermal resistance value, or without feeding back any thermal transient response to the temperature of the device. Accordingly, the method according to the present invention is a very pragmatic method.

According to the present invention, the sum of an electric power inputted into the wavelength tuning region and an electric power inputted into the thermal compensation region is always kept constant and hence the temperature of the wavelength tunable semiconductor laser device is always kept constant. Thereby, the wavelength tunable semiconductor laser device is capable of largely reducing the change in the amount of heat which is collaterally generated in the device when an electric current is injected into the wavelength tuning region. Consequently, the wavelength tunable semiconductor laser device is capable of reducing the wavelength drifts which occur due to the change in the amount of heat generated which have been the problem. Furthermore, the present invention makes the wavelength tunable semiconductor laser device use the device resistance as a calculation item when the electric power inputted into the wavelength tuning region and the electric power inputted into the thermal compensation region are calculated and controlled. For this reason, neither the calculation nor control is influenced by the precision, uniformity, and reproducibility of the process of the device itself. Consequently, the present invention is capable of increasing the yields and reducing the costs for manufacturing the devices.

Detailed description will be now provided for a wavelength tunable semiconductor laser device, a controller for the same, and a control method for the same according to the present invention by showing several examples of the embodiment.

EXAMPLE 1

Wavelength Tunable Semiconductor Laser Device

Figure 2A:
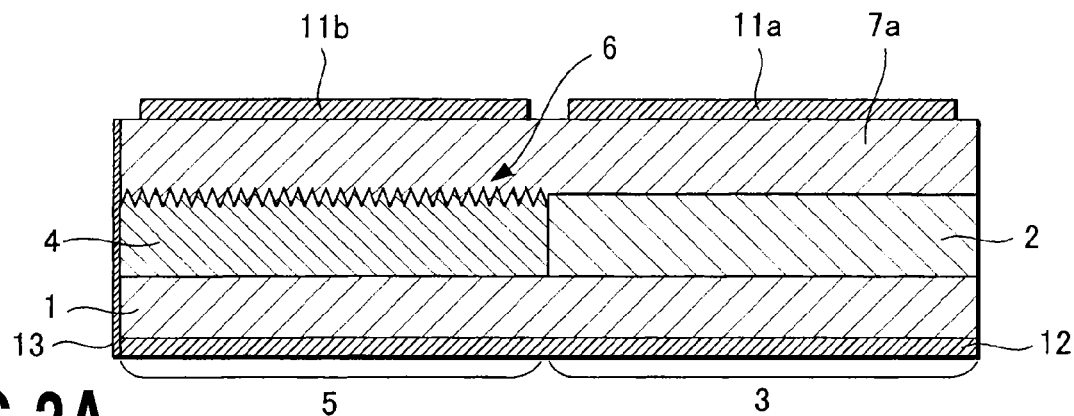
FIG. 2A is a cross-sectional view of the wavelength tunable semiconductor laser device taken along the IIA-IIA line in FIG. 1.
Figure 2B:
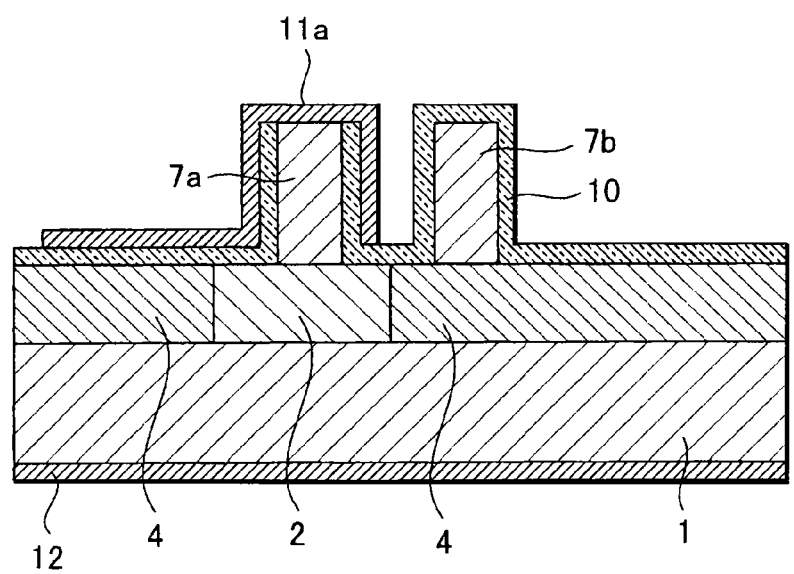
FIG. 2B is a cross-sectional view of the wavelength tunable semiconductor laser device taken along the IIB-IIB line in FIG. 1.
Figure 2C:
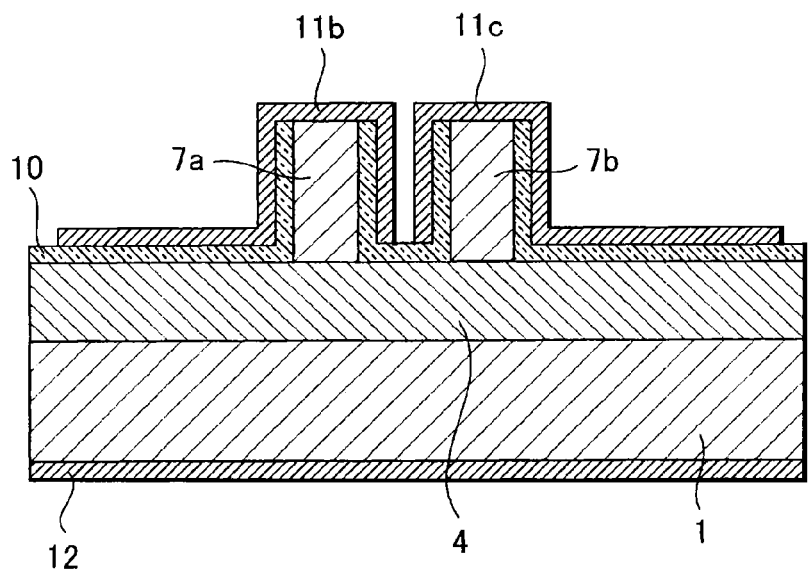
FIG. 2C is a cross-sectional view of the wavelength tunable semiconductor laser device taken along the IIC-IIC line in FIG. 1.

FIGS. 1, 2A, 2B and 2C show an example of an embodiment of the wavelength tunable semiconductor laser device according to the present invention. FIG. 1 shows the top view. FIGS. 2A, 2B, and 2C show a cross-sectional view of FIG. 1 along the IIA-IIA line, a cross-sectional view of FIG. 1 along the IIB-IIB line, and a cross-sectional view of FIG. 1 along the IIC-IIC line, respectively.

As shown in FIGS. 1, 2A, 2B and 2C, the wavelength tunable semiconductor laser device according to this example includes a laser region and a thermal compensation region. The laser region includes an active region 3 and a DBR region 5 connected to the active region 3 in series. The active region 3 includes an active layer 2 formed in the shape of a straight line on a substrate serving as a lower clad 1 and an upper clad 7a formed in a convex shape on the active layer 2. The DBR region 5 includes a non-active layer 4 formed on the lower clad 1 and a diffraction grating 6 on a top surface of a portion of the non-active layer 4, the portion and the active layer 2 being arranged in a straight line, the upper clad 7a formed in a convex shape on the diffraction grating 6. With this configuration, an optical waveguide of the laser region is formed in a mesa structure 8.

In addition, the thermal compensation region includes a non-active layer 4 formed on a lower clad 1 and an upper clad 7b formed in a convex shape on the non-active layer 4 so that the upper clad 7b is adjacent to and parallel to the upper clad 7a of the laser region. With this configuration, an optical waveguide of the thermal compensation region is formed with a mesa structure 9. Furthermore, the mesa structure 9 of the thermal compensation region is arranged in parallel to and adjacent to the mesa structure 8 of the laser region.

Moreover, the wavelength tunable semiconductor laser device according to this example includes an insulating film 10 which is formed on the surface of the active layer 2, the non-active layer 4 and the upper clads 7a, 7b except for the top surfaces of portions of the upper clads 7a, 7b. As electrodes, an active region electrode 11a, a DBR region electrode 11b, a thermal compensation region electrode 11c and a lower electrode 12 are included in the wavelength tunable semiconductor laser device according to this example. The active region electrode 11a is formed on the top surface of the upper clad 7a in a portion constituting the active region 3. The DBR region electrode 11b is formed on the top surface of the upper clad 7a in a portion constituting the DBR region 5. The thermal compensation region electrode 11c is formed on the top surface of the upper clad 7b in a portion constituting the thermal compensation region. The lower electrode 12 is formed on the bottom surface of the lower clad 1. In addition, the wavelength tunable semiconductor laser device according to this example includes an AR film 13 which is formed on a side end surface of the non-active layer 4 constituting the DBR region 5.

In other words, the wavelength tunable semiconductor laser device according to this example includes the mesa structure 9 of the thermal compensation region which is formed adjacent to the mesa structure 8 of the laser region for the purpose of thermal compensation. Furthermore, the wavelength tunable semiconductor laser device applies a voltage to, or injects an electric current into, the mesa structure 9 of the thermal compensation region by use of a control method and a controller which will be described later. By applying the voltage to or injecting the electric current into the thermal compensation region, the wavelength tunable semiconductor laser device converts most of the applied voltage or the injected electric current to heat, suppresses the change in the amount of heat generated in the device, and accordingly always keeps the temperature of the device constant. Thereby, the wavelength tunable semiconductor laser device according to this example reduces the wavelength drifts which have been the problem with the conventional wavelength tunable semiconductor laser device.

A method for fabricating the wavelength tunable semiconductor laser device according to this example will now be explained.

(1) First, the active layer 2 is grown on the lower clad 1 which is an n-type InP substrate. Subsequently, all of the active layer 2 except for the portion designated for the active region 3 is removed by sulfuric acid-based wet selective etching.

(2) Thereafter, the non-active layer 4 is grown by butt joint regrowth. Subsequently, a diffraction grating 6 with an alternating series of concaves and convexes as shown in FIG. 2A is formed by wet etching in the DBR region 5 designated for the distributed reflector within the non-active layer 4.

(3) Afterward, the upper clad layer of p-type InP is regrown. Subsequently, all of the upper clad layer except for the portions designated for the laser region and the thermal compensation region is removed by chlorine-based wet selective etching. As a result, only the upper clad 7a designated for the laser region and the upper clad 7b designated for the thermal compensation region remain out of the upper clad layer, and the upper clads 7a, 7b constitute the mesa structures 8, 9 with 2 μm width, respectively. Consequently, the upper clad 7b and the non-active waveguide region under the upper clad 7b are used as heat generating means in the thermal compensation region.

(4) After that, the insulating film 10 of $SiO_2$ is formed throughout the surface of the device. Subsequently, from the insulating film 10, only the portion corresponding to the top of the mesa structure 8 of the laser region and the portion corresponding to the top of the mesa structure 9 of the thermal compensation region are removed. Thereby, as shown in FIGS. 2B and 2C, the active region electrode 11a, the DBR region electrode 11b, and the thermal compensation region electrode 11c are formed for energizing the mesa structure 8 of the laser region and the mesa structure 9 of the thermal compensation region.

(5) Thereafter, for the packaging purpose, the substrate is polished so that the thickness of the laser device including the substrate is 150 μm. Then, the back electrode 12 is formed. After cleavage, the AR film 13 is formed on the side end surface of the DBR region 5.

The wavelength tunable semiconductor laser device according to this example has a PIN structure in which the substrate (the lower clad 1) is made of the n-type semiconductor, the active layer 2 and the non-active layer 4 are made of a non-doped semiconductor whose bandgap is smaller than those of the clad layers; and the upper clad 7 is made of the p-type semiconductor. The active region 3 and the DBR region 5 are 400 μm in length. As understood from FIGS. 1 and 2C, the thermal compensation region is formed from the thermal compensation non-active waveguide and the thermal compensation electrode 11c. The distance between the thermal compensation region and the mesa stripe of the laser region is set at 20 µm. It is desirable that the lower limit of the arrangement distance is equal to or more than 3 µm so that no optical power moves between the waveguides arranged adjacent to, and in parallel to, each other. Furthermore, it is desirable that the upper limit of the arrangement distance is equal to or less than the thickness of the substrate, for example 150 µm, so that the temperature of the device is always kept constant easily.

The wavelength tunable semiconductor laser device according to this example oscillates a laser beam when an electric current is caused to flow between the active region electrode 11a and the back electrode 12 shown in FIGS. 2A and 2B. The lasing wavelength is a wavelength roughly corresponding to the Bragg wavelength determined by the DBR region 5 shown in FIG. 2. In addition, the wavelength tunable semiconductor laser device is capable of shifting the Bragg wavelength to a shorter wavelength when an electric current is injected into the DBR region 5 through the DBR region electrode 11b shown in FIGS. 1, 2A and 2C. Thus, the lasing wavelength shifts to the shorter wavelength in conjunction with the shift of the Bragg wavelength. When shifting the lasing wavelength to the shorter wavelength, the wavelength tunable semiconductor laser device according to this example controls, as described below, the sum of an electric power inputted into the DBR region 5 and an electric power inputted into the thermal compensation non-active waveguide so that the sum thereof is always kept constant.

<Control Method>

Figure 3:
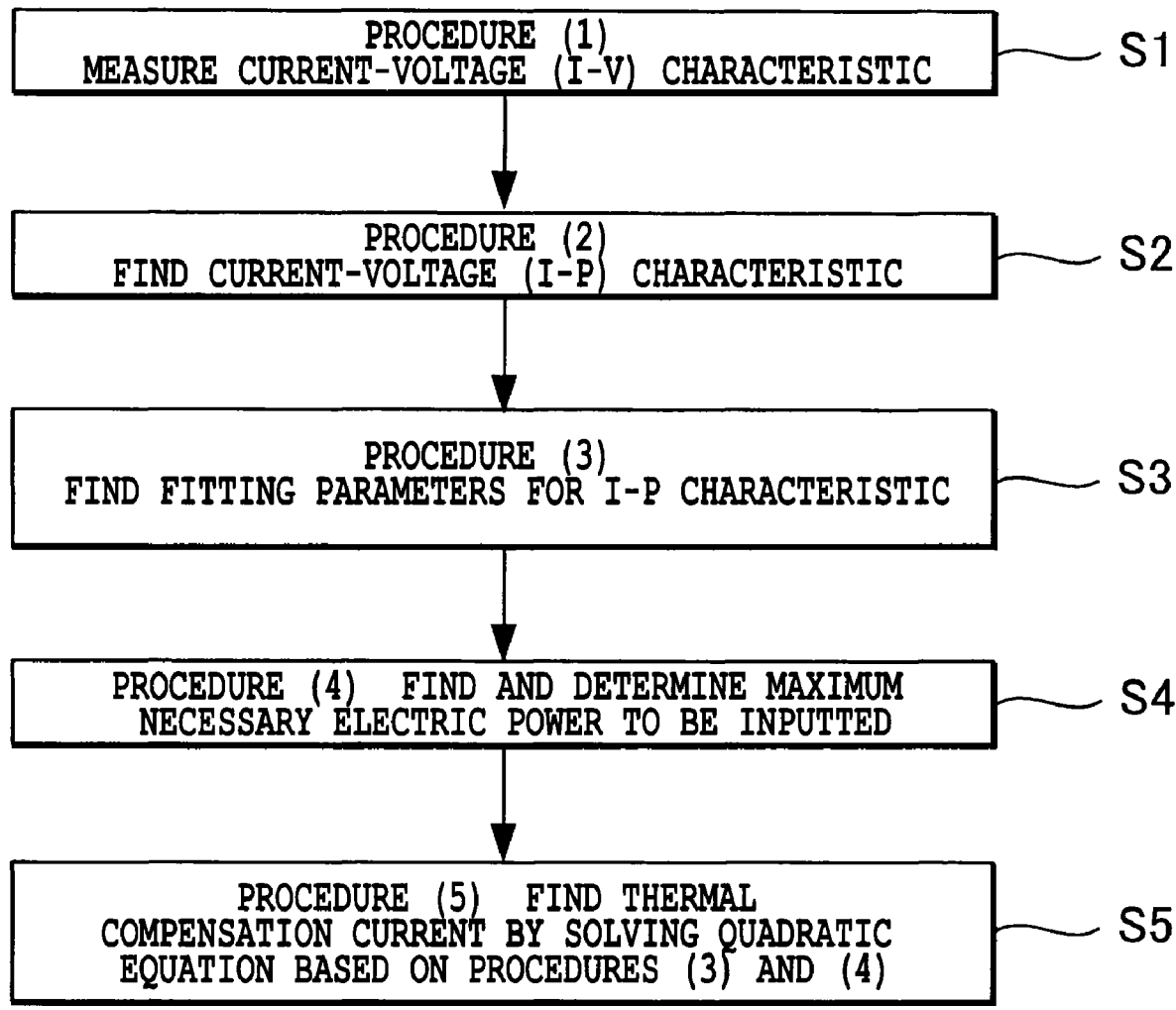
FIG. 3 is a flowchart showing an example of a control method for a wavelength tunable semiconductor laser device according to the present invention.

Next, description will be provided for the control method for the wavelength tunable semiconductor laser device according to this example, specifically for a procedure for determining a thermal compensation current, with reference to the flowchart shown in FIG. 3.

Figure 4B:
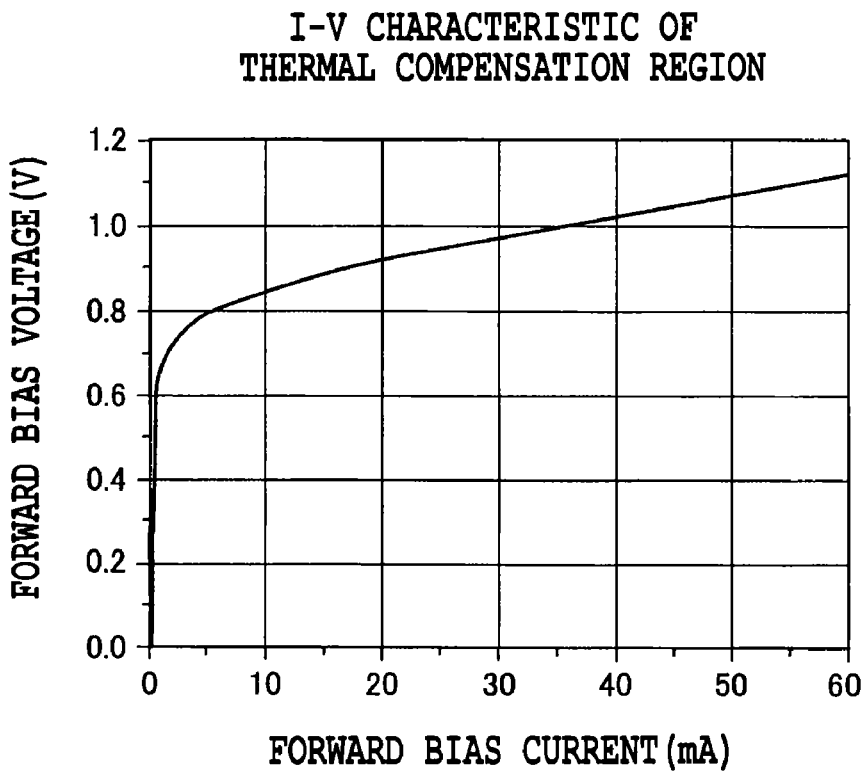
FIG. 4B is a graph showing an I-V characteristic of a thermal compensation region in the wavelength tunable semiconductor laser device according to the present invention.
Figure 5A:
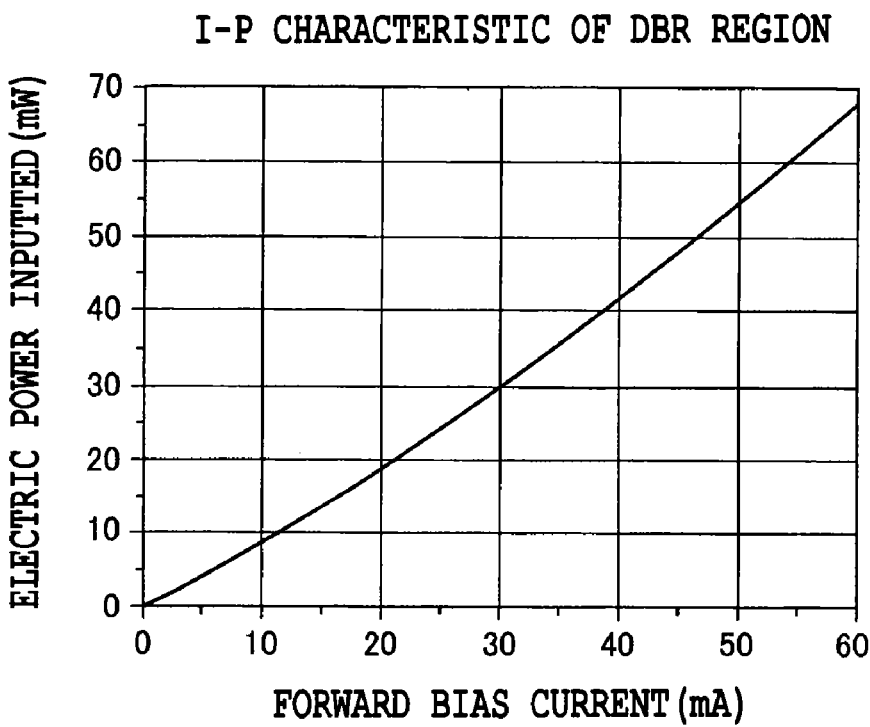
FIG. 5A is a graph showing an I-P characteristic of the DBR region in the wavelength tunable semiconductor laser device according to the present invention.
Figure 5B:
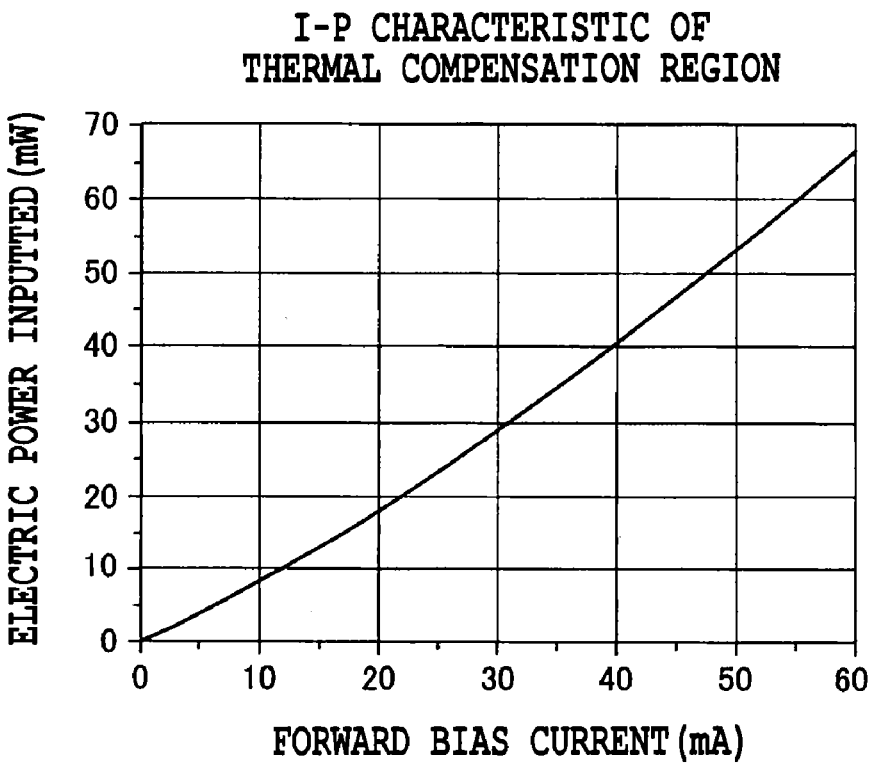
FIG. 5B is a graph showing an I-P characteristic of the thermal compensation region in the wavelength tunable semiconductor laser device according to the present invention.

(1) First, I-V characteristics are measured for the DBR region 5 and for the thermal compensation region as shown in FIGS. 4A and 4B (in step S1).
(2) By calculating a product of an electric current and a voltage based on the I-V characteristics obtained in step S1, I-P characteristics are obtained (in step S2) as shown in FIGS. 5A and 5B.
(3) In this example, Equation 1 and Equation 2 described below are obtained by approximating (the method of least squares (second-degree)) the I-P characteristics given in step S2 by quadratic functions (in step S3). In Equation 1, $P_{DBR}$ denotes the electric power (mW) inputted into the DBR region 5, and $I_{DBR}$ denotes a forward bias current (mA) applied to the DBR region 5. In Equation 2, $P_{TH}$ denotes the electric power (mW) inputted into the thermal compensation region, and $I_{TH}$ denotes a forward bias current (mA) applied to the thermal compensation region.
(4) Thereafter, as shown by Equation 3, the sum $P_{TOTAL}$ of the electric power inputted into the DBR region 5 and the electric power inputted into the thermal compensation region is set at 70 mW, for an example (in step S4). When determining $P_{TOTAL}$, $P_{TOTAL}$ needs to be set equal to or larger than $P_{DBR}$ when a maximum value of $I_{DBR}$ is substituted into Equation 1. Once the DBR region current $I_{DBR}$ is determined, the electric power $P_{DBR}$ inputted into the DBR region is given by Equation 1. By substituting the value of this $P_{DBR}$ into Equation 3, the electric power $P_{TH}$ to be inputted into the thermal compensation region is given.
(5) Finally, the value of $P_{TH}$ is substituted into Equation 2, and the solutions of the quadratic equation with $I_{TH}$ as the variable are found. Out of the found solutions, a solution with a positive value is the thermal compensation region current $I_{TH}$ (in step S5).

$$P_{DBR}=0.0049I_{DBR}^2+0.848I_{DBR}-0.381 \qquad \text{Equation 1}$$

$$P_{TH}=0.0047I_{TH}^2+0.8385I_{TH}-0.3556 \qquad \text{Equation 2}$$

$$P_{TOTAL}=P_{TH}+P_{DBR}=70 \qquad \text{Equation 3}$$

Figure 6:
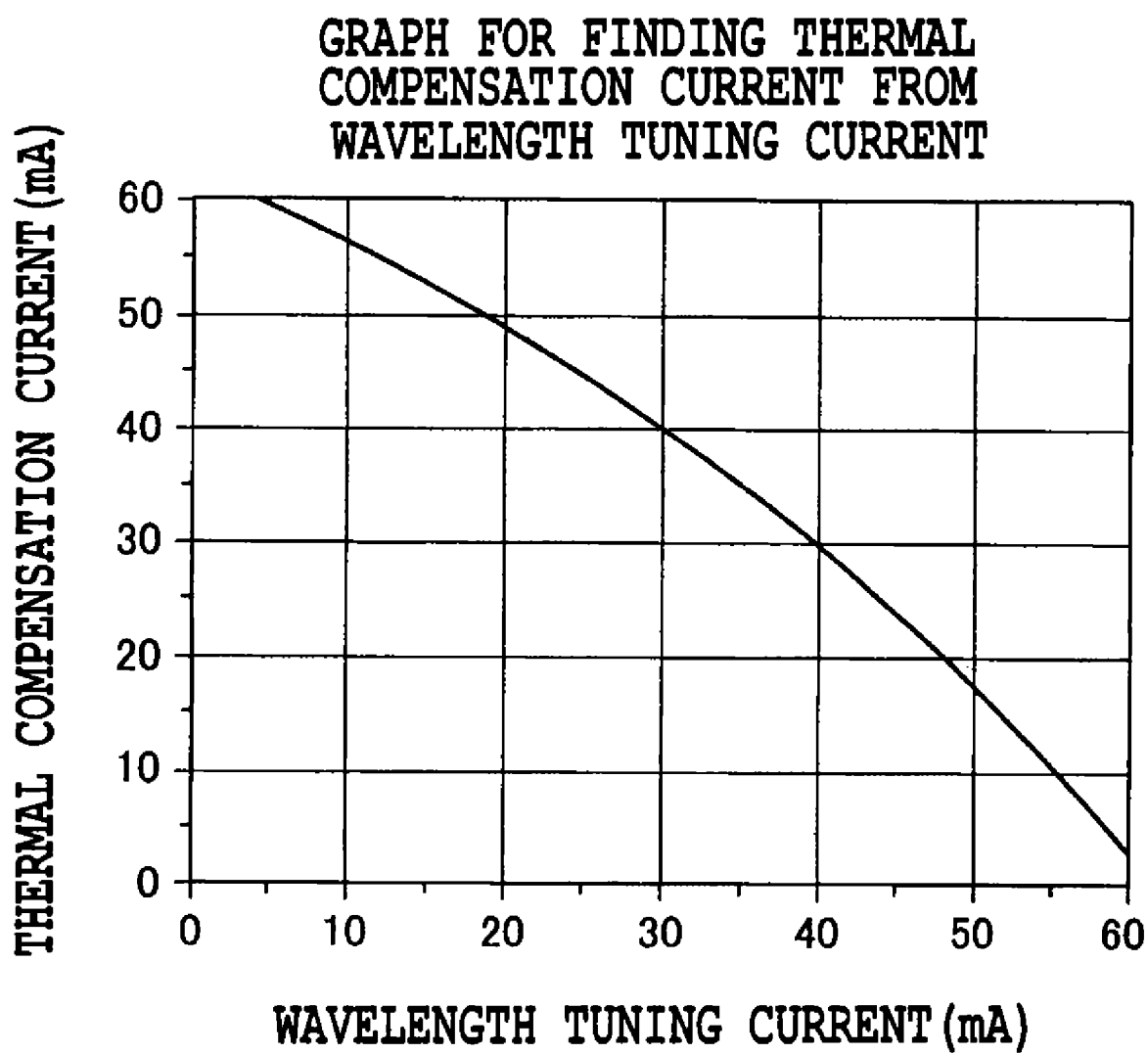
FIG. 6 is a graph for finding a thermal compensation current from a wavelength tuning current in the wavelength tunable semiconductor laser device according to the present invention.

Actually, the thermal compensation region current $I_{TH}$ is easily given by finding beforehand a correlation between $I_{DBR}$ and $P_{TH}$ through a calculation, and subsequently determining the DBR region current $I_{DBR}$ from a graph of FIG. 6 which shows this correlation. The graph shown in FIG. 6 can be approximated by fitting as well. For example, an equation (Equation 4) which approximates the correlation (with an accuracy of 99% or higher) by fitting using a 6th-degree polynomial expression (the method of least squares (6th-degree)) is shown below.

$$I_{TH}=-6\times10^{-10}I_{DBR}^6+1\times10^{-7}I_{DBR}^5-8\times10^{-6}I_{DBR}^4+0.0003I_{DBR}^3-0.01141I_{DBR}^2+0.5222I_{DBR}+62.262 \qquad \text{Equation 4}$$

In the case where this approximation expression is used, the thermal compensation region current $I_{TH}$ is easily given once the DBR region current $I_{DBR}$ is determined. By this, pairs of the DBR region current and the thermal compensation region current are determined as shown in Table 2. Note that the approximation expression is not necessarily limited to the 6th-degree polynomial expression, and any expression can be used as the approximation expression as long as an accurate fitting can be made.

TABLE 2

| Electric Current Applied to DBR Region | Electric Current Applied to Thermal Compensation Region |
|---|---|
| 20 mA | 48.6 mA |
| 53 mA | 13.3 mA |

A pair of the DBR region current 20 mA–the thermal compensation region current 48.6 mA and a pair of the DBR region current 53 mA–the thermal compensation current 13.3 mA are given under the condition that the sum of the electric powers injected into the DBR region and the thermal compensation region is equal to 70 mW.

Figure 7:
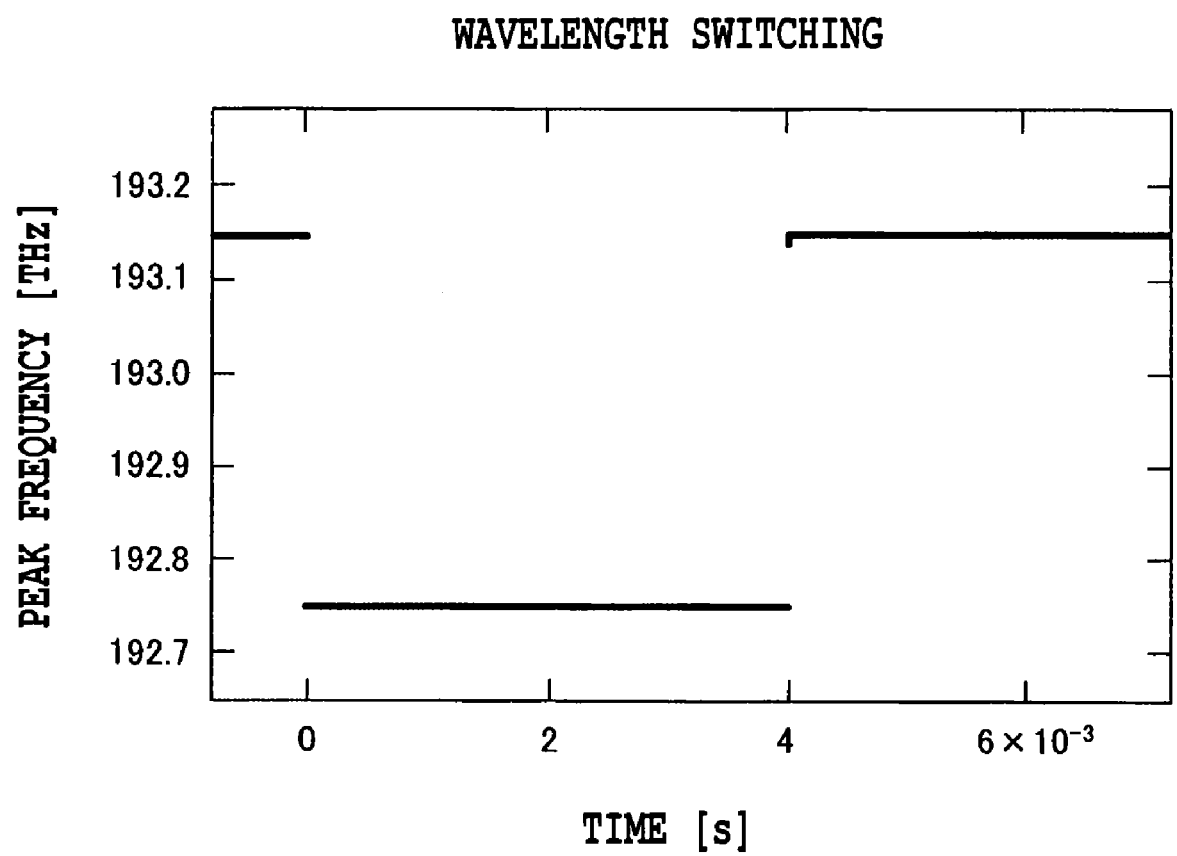
FIG. 7 is a graph showing a wavelength switching operation carried out by the wavelength tunable semiconductor laser device according to the present invention.
Figure 8A:
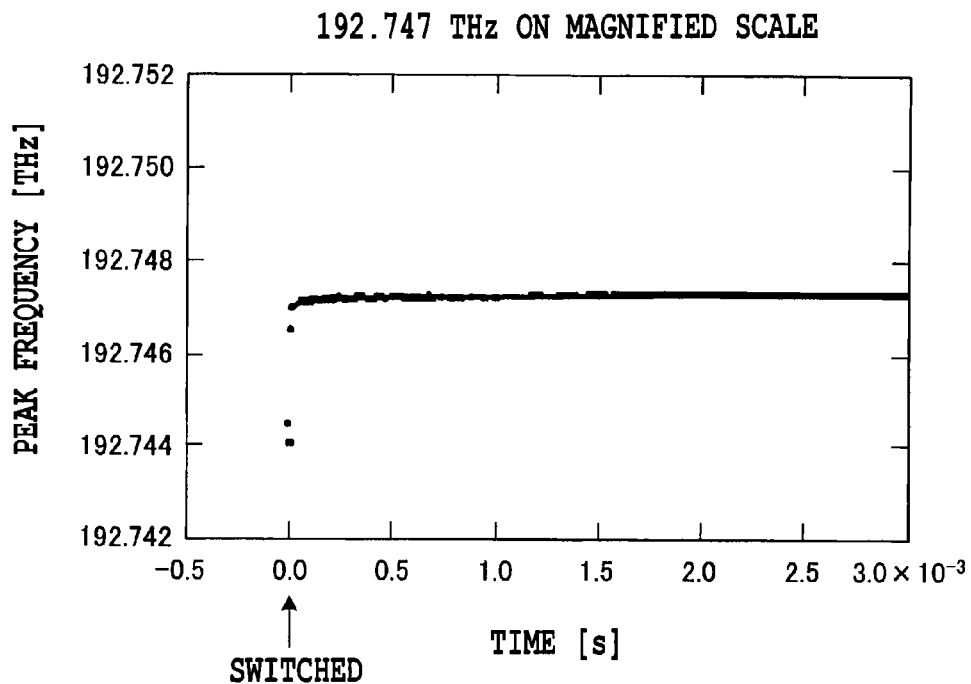
FIG. 8A is a magnified view of the graph shown in FIG. 7 at and around 192.747 THz.
Figure 8B:
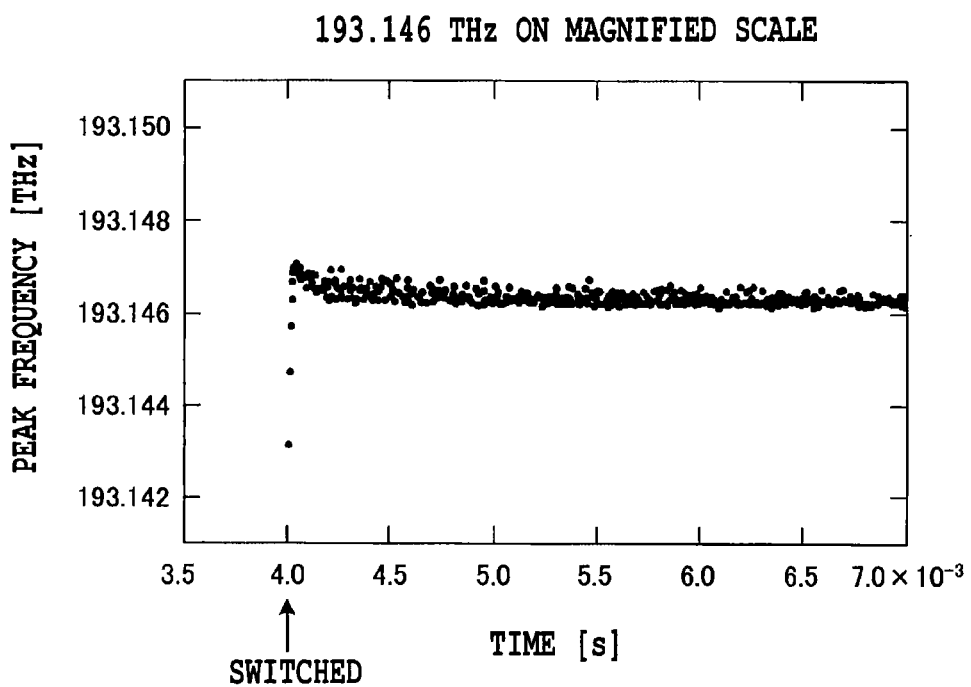
FIG. 8B is a magnified view of the graph shown in FIG. 7 at and around 193.146 THz.
Figure 30A:
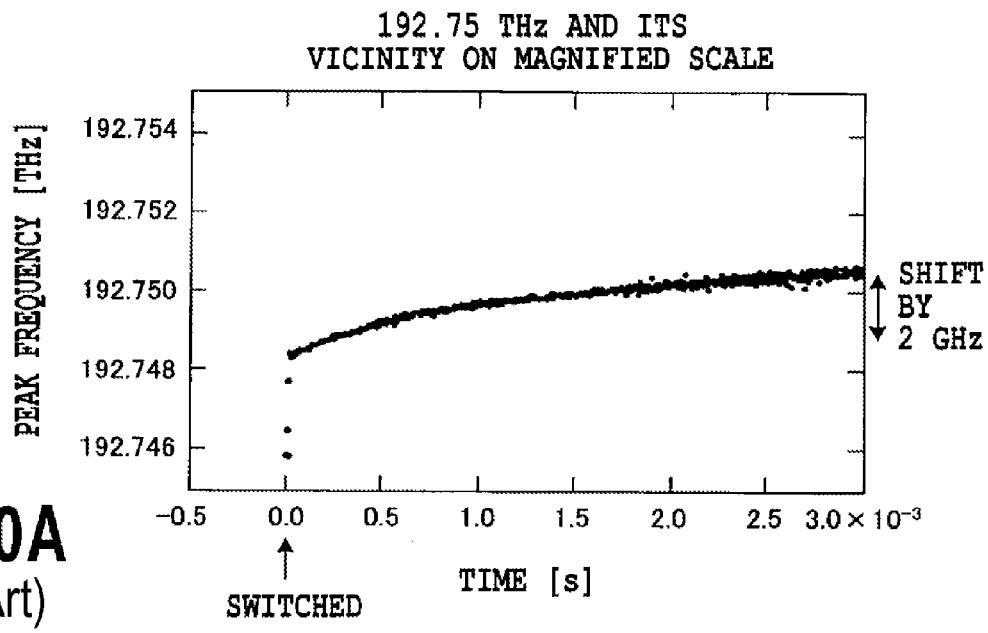
FIG. 30A is a magnified view of the graph shown in FIG. 29 at and around 192.75 THz.
Figure 30B:
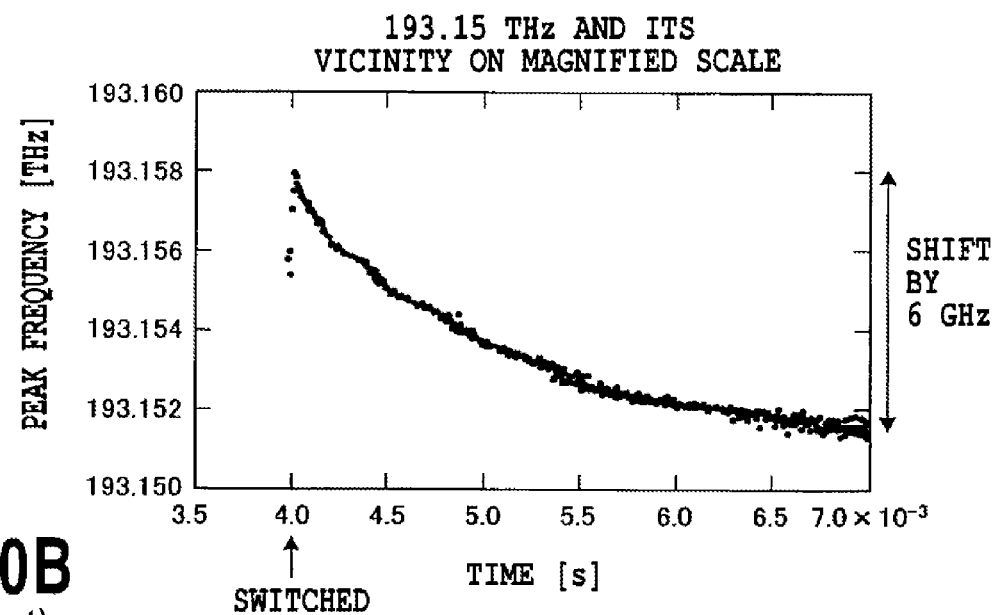
FIG. 30B is a magnified view of the graph shown in FIG. 29 at and around 193.15 THz.

FIG. 7 shows how wavelengths corresponding to 192.747 THz and 193.146 THz behave when the wavelengths are alternately outputted by switching the value of the electric current applied to the DBR region between 20 mA and 53 mA in every 4 milliseconds, and concurrently switching the electric current applied to the thermal compensation region between 48.6 mA and 13.3 mA synchronously. In addition, for the purpose of clearly showing the suppression effect of wavelength drift by heat compensation, FIG. 8A shows a part of FIG. 7 corresponding to the frequency of 192.747 THz and its vicinity by magnifying the vertical axis scale of FIG. 7 to 10 GHz, whereas FIG. 8B shows a part of FIG. 7 corresponding to the frequency of 193.146 THz and its vicinity by magnifying the vertical axis scale of FIG. 7 to 10 GHz. In the case where no thermal compensation is made, the wavelengths are drifted by 2 GHz and 6 GHz as shown in FIGS. 30A and 30B, respectively. On the contrary, the present invention is capable of suppressing the wavelength drifts within 1 GHz as shown in FIGS. 8A and 8B by making the thermal compensation, and hence stable and high speed switching of wavelength is realized. Furthermore, the present invention is capable of largely suppressing the wavelength drift, because the thermal disturbance is prevented each time the wavelength is switched.

<Controller>

Figure 9A:
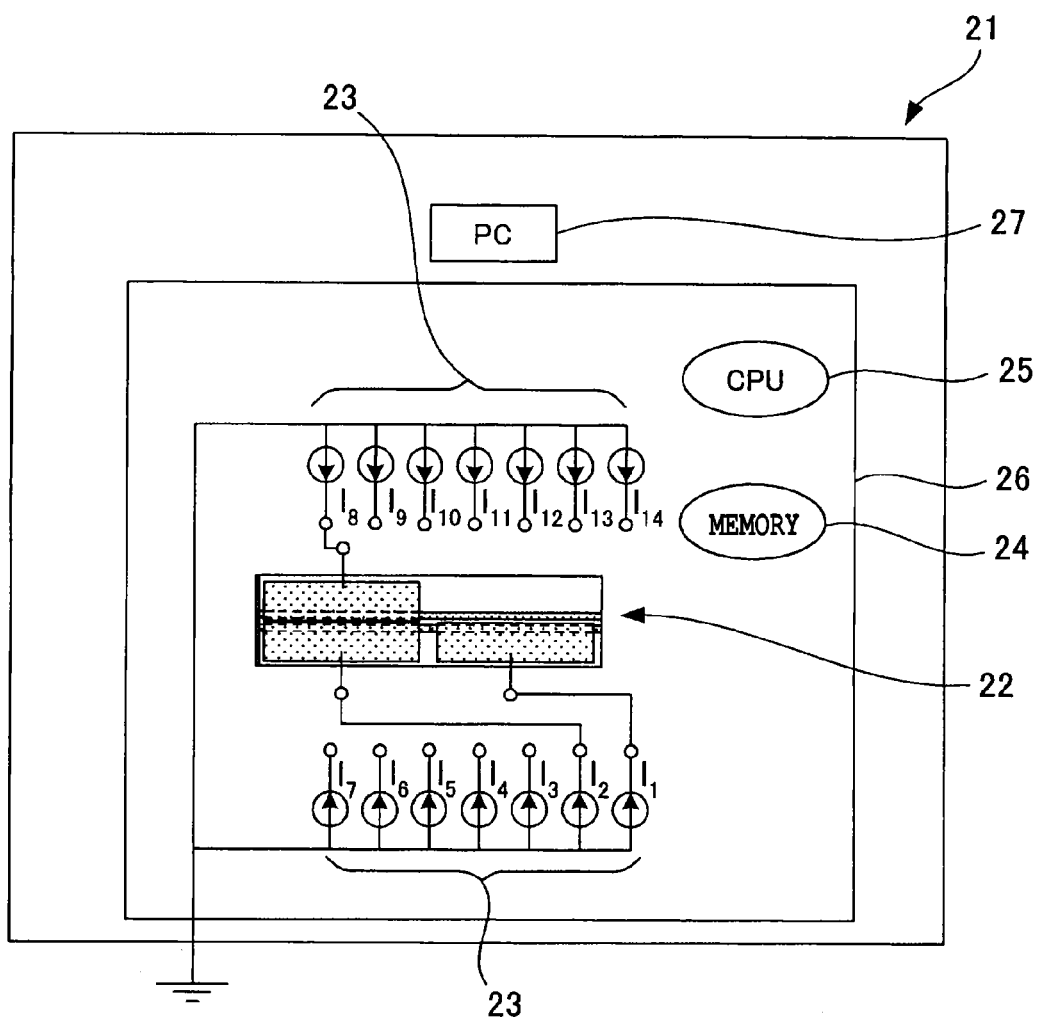
FIG. 9A is a schematic diagram showing an example of a controller for a wavelength tunable semiconductor laser device according to the present invention.
Figure 9B:
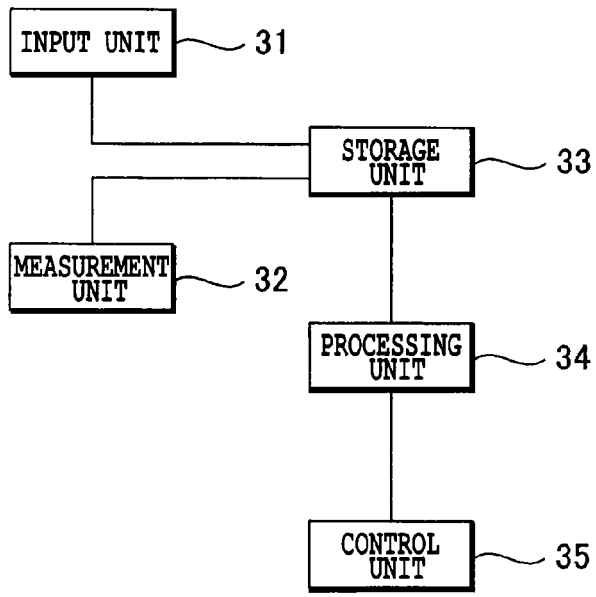
FIG. 9B is a block diagram of the controller for a wavelength tunable semiconductor laser device according to the present invention.

Next, using FIGS. 9A and 9B, description will be provided for a controller which carries out the above-described method by controlling the wavelength tunable semiconductor laser device according to this example.

A controller 21 for controlling the wavelength tunable semiconductor laser device according to this example (hereinafter referred to as a "wavelength tunable laser controller") controls the wavelength tunable semiconductor laser device 22 according to this example and other examples which will be described later. The wavelength tunable laser controller 21 includes a wavelength tunable laser control board 26 and a PC (computer) 27. The wavelength tunable laser control board 26 includes an electric current controlling circuit (or a voltage controlling circuit) 23 connected to the regions (the active region, the DBR region, the thermal compensation region and the like) of the wavelength tunable semiconductor laser device 22, a memory 24 to store data, and a CPU (central processing unit) 25 for setting and controlling these components. The PC 27 rewrites the data and setup conditions for the wavelength tunable laser control board 26.

In the wavelength tunable laser control board 26, the electric current controlling circuit 23 includes a power supply capable of measuring electric currents denoted by I1 to I14 and controls the electric currents to be injected into the respective regions. In a case where the voltage controlling circuit is used instead of the electric current controlling circuit, the voltage controlling circuit includes a power supply capable of measuring voltages and controls voltages to be applied to the respective regions. The memory 24 stores an electric current-voltage measurement data (an I-V measurement data) which is measured by the electric current controlling circuit (or the voltage controlling circuit) 23. The CPU 25 sets up the electric currents (or voltages) on the basis of the I-V measurement data which is stored in the memory 24, and thus controls the electric current controlling circuit (or the voltage controlling circuit) 23. The PC 27 is capable of rewriting the I-V measurement data which is stored in the memory 24 in the wavelength tunable laser control board 26. In addition, by controlling the CPU 25, the PC 27 is capable of fetching the I-V measurement data, and is capable of automatically calculating and outputting the fitting and a thermal compensation current. In FIG. 9A, the measurement/control currents handled by the electric current controlling circuit 23 are denoted by I1 to I14. However, note that the number of measurement/control currents is not limited to the number shown in FIG. 9A. The number of measurement/control currents may be changed to an appropriate number depending on a wavelength tunable semiconductor laser device to which the measurement/control currents are applied.

The block diagram representing the wavelength tunable laser controlling board 26 has a configuration as shown in FIG. 9B. Specifically, the wavelength tunable laser controlling board 26 includes an input unit 31 for inputting the electric currents (or voltages) into the respective regions of the wavelength tunable semiconductor laser device 22, a measurement unit 32 for measuring the electric current-voltage characteristics of the DBR region and the thermal compensation region, a storage unit 33 (=the memory 24) to store data of the inputted electric currents (voltages) and the measured electric current-voltage characteristics, that is, I-V measurement data, a processing unit 34 (=the CPU 25) for reading the I-V measurement data from the storage unit 33, calculating the electric current-electric power characteristics (or the voltage-electric power characteristics) of the DBR region and the thermal compensation region, and determining the electric current injected into the DBR region (or the voltage applied to the DBR region) and the electric current injected into the thermal compensation region (or the voltage applied to the thermal compensation region) on the basis of the I-V measurement data so that the sum of the electric power of the DBR region and the electric power of the thermal compensation region is always kept constant, and a control unit 35 for controlling to input the determined electric currents (or voltages) into the DBR region and the thermal compensation region.

In this example, the wavelength tunable semiconductor laser device shown in FIGS. 1 and 2 is mounted on the wavelength tunable laser controller 21. At the electric current controlling circuit 23 on the wavelength tunable laser control board 26, $I_1$ is connected to the active region electrode 11a, $I_2$ is connected to the DBR region electrode 11b, and $I_8$ is connected to the thermal compensation region electrode 11c. Then, the wavelength tunable laser controller 21 is capable of automatically carrying out the I-V measurement by use of the above-described control method, finding the I-P curves from a result of the measurement, and controlling the electric power inputted into the DBR region and the electric power inputted into the thermal compensation region so that that the sum of the electric powers is always kept constant. In other words, the wavelength tunable laser controller 21 is capable of automatically calculating and outputting the thermal compensation current once the wavelength tuning current is determined.

(Modification of the Wavelength Tunable Semiconductor Device According to This Example)

In this example, the structure of the thermal compensation region is the same as the structure of the laser region. However, even if the structure of the thermal compensation region is different in shape from the structure of the laser region, the thermal compensation region is still capable of exhibiting the same effect. That is because, as described above, the control method according to this example includes the resistance value of the thermal compensation region as one of the control elements.

For instance, FIG. 10 shows a top view of a wavelength tunable semiconductor device as a modification of this example. The wavelength tunable semiconductor device shown in FIG. 10 has almost the same structure as the wavelength tunable semiconductor device shown in FIG. 1. However, a thermal compensation region electrode 11d in a direction in which the waveguide extends is different in length. In this manner, the length of the thermal compensation region electrode 11d in the direction in which the waveguide extends may be different from the length of the corresponding DBR region electrode 11b in the direction in which the waveguide extends. For instance, the thermal compensation region electrode 11d may be shorter than the thermal compensation region electrode 11d and hence adjacent to a part of the DBR region electrode 11b.

Figure 11:
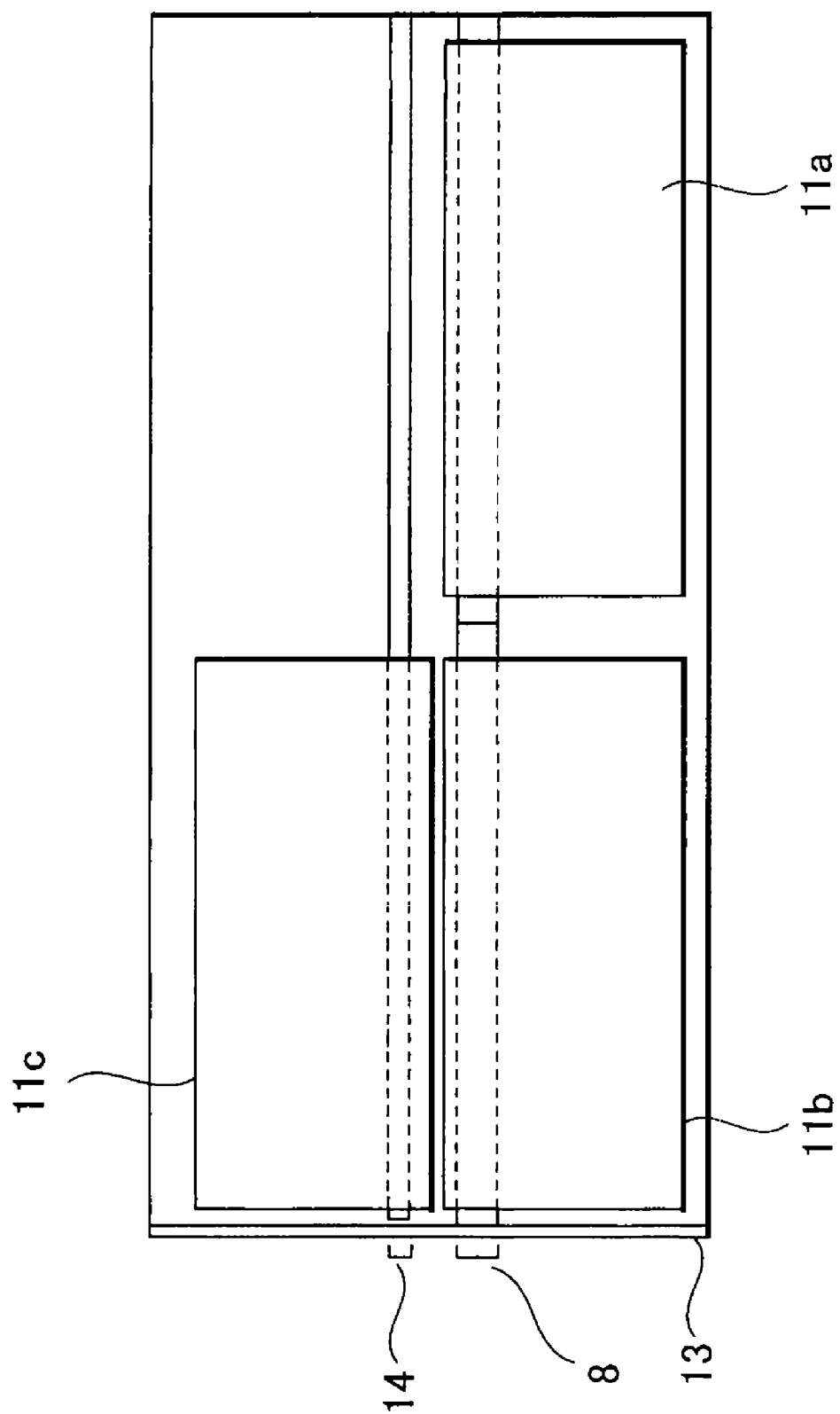
FIG. 11 is a top view showing another modification of the wavelength tunable semiconductor laser device shown in FIG. 1.
Figure 12A:
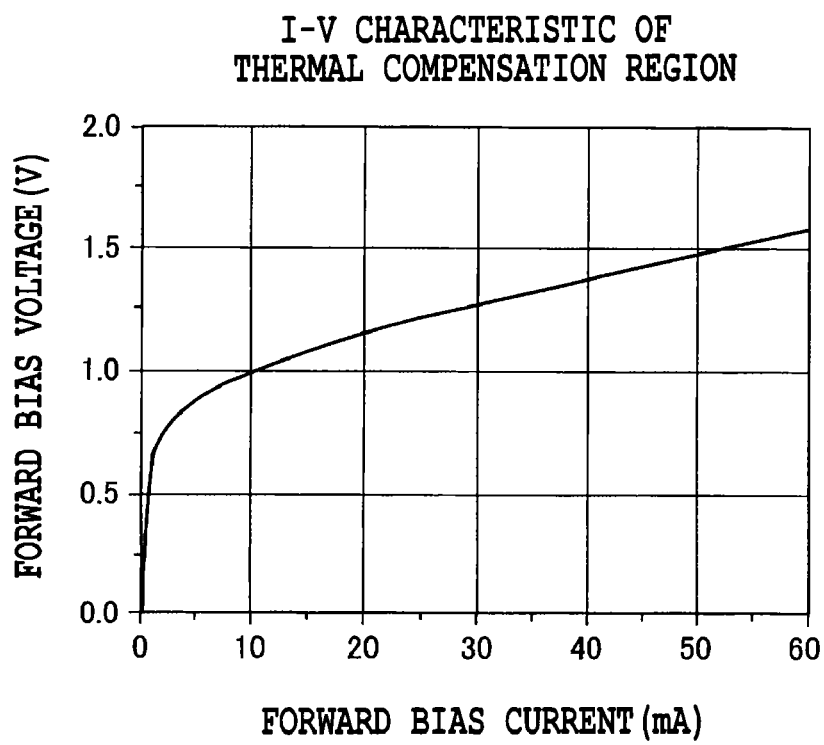
FIG. 12A is a graph showing an I-V characteristic of a thermal compensation region in the wavelength tunable semiconductor laser device shown in FIG. 11.
Figure 12B:
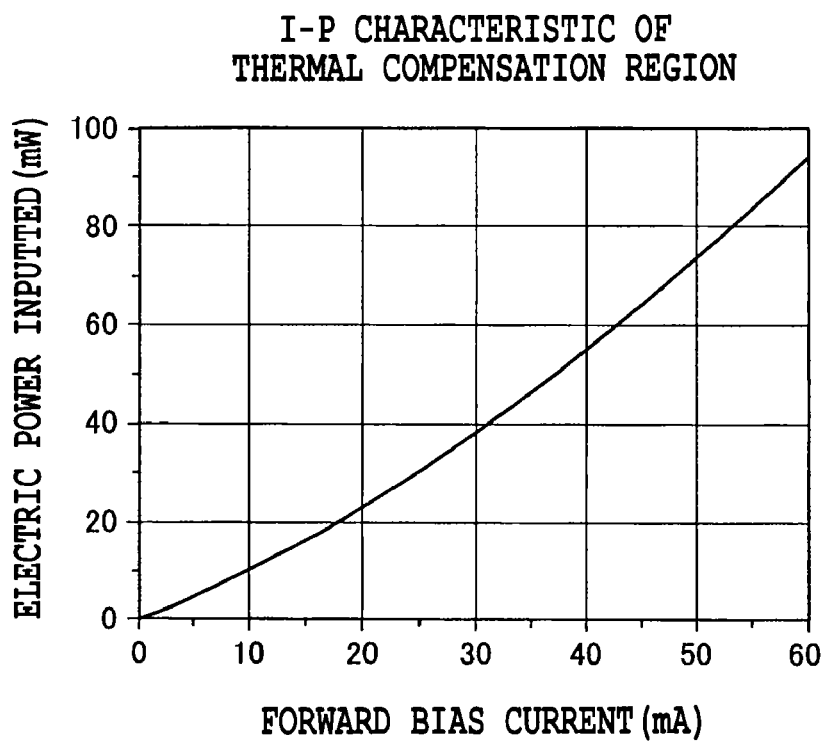
FIG. 12B is a graph showing an I-P characteristic of the thermal compensation region in the wavelength tunable semiconductor laser device shown in FIG. 11.

FIG. 11 shows a top view of a wavelength tunable semiconductor device as another modification of this example. The wavelength tunable semiconductor device shown in FIG. 11 has almost the same structure as the wavelength tunable semiconductor device shown in FIG. 1. However, the mesa structure 14 of the thermal compensation region is different in width. In the case of the wavelength tunable semiconductor device shown in FIG. 1, the mesa structures 8, 9 of the laser region and the thermal compensation region are 2 µm in width. In the case of the wavelength tunable semiconductor device shown in FIG. 11, however, the mesa structure 14 of the thermal compensation region is 1 μm in width, which is narrower than the mesa structures 8, 9. An I-V characteristic of the thermal compensation region in the wavelength tunable semiconductor device having such a structure is shown in FIG. 12A, and an I-P characteristic of the thermal compensation region obtained from the I-V characteristic is shown in FIG. 12B. The wavelength tunable semiconductor device shown in FIG. 11 is capable of reducing the wavelength drift on the basis of the characteristic diagrams shown in FIGS. 12A and 12B by applying the foregoing method to the wavelength tunable semiconductor device. In addition, the wavelength tunable semiconductor device shown in FIG. 11 enlarges the resistance value of its thermal compensation region as a result of narrowing the width of the mesa structure 14 and thus reducing the area of the mesa structure 14. Consequently, the wavelength tunable semiconductor device shown in FIG. 11 is capable of reducing the value of the electric current needed for the heat generation.

What is conceivable as yet another modification of this example is a wavelength tunable semiconductor laser device having a configuration in which the length of the mesa structure 9 in the direction along the waveguide is shorter than the length of the mesa structure 8 in the direction along the waveguide in the laser region, for instance, a configuration in which the mesa structure 9 is formed only where the thermal compensation region electrode 11c exists.

EXAMPLE 2

The example 2 shows another control method for the wavelength tunable semiconductor laser device. Specifically, the control method according to this example is the control method shown in Example 1 wherein more accurate thermal compensation is done by estimating an inputted electric power as a sum of an electric power contributing to the heat generation and an electric power lost as spontaneously-emitted light when an electric current is injected.

In Equation 1 for the control method shown in Example 1, $P_{DBR}$ can be expressed by Equation 5 as follows.

$$P_{DBR} = P_{REGISTANT} + P_{SPON} \quad \text{Equation 5}$$

$P_{REGISTANT}$ denotes an electric power converted to an exothermic energy, and $P_{SPON}$ denotes an electric power lost as light from the semiconductor to its outside through spontaneous emission. For $P_{SPON}$, the electric current-light emission output characteristic of the DBR region can be examined beforehand. The light spontaneously emitted from the DBR region increases progressively once the electric current injected into the DBR region exceeds 5 mA. For this reason, $P_{SPON}$ is approximated by Equation 6 when $I_{DBR} \leq 5$ mA, and by Equation 7 when $I_{DBR} \geq 5$ mA.

$$P_{SPON} = 0 \quad \text{Equation 6}$$

$$P_{SPON} = I_{DBR}/55 - 1/11 \quad \text{Equation 7}$$

Equation 7 is a fitting expression effective for the light emission characteristic of the wavelength tunable semiconductor laser device according to the present invention. However, it goes without saying that any fitting expression may be used instead of Equation 7 regardless of the form and degree of the expression, the approximation method employed for the expression, and the like, as long as the expression can accurately express the light emission characteristic of a wavelength tunable semiconductor laser device in question.

When $I_{DBR} \geq 5$ mA, or when an electric power is lost as a result of light emission from the DBR region, Equation 8 is given by substituting Equation 5 and Equation 7 into Equation 1 and then transforming the equation to have the term $P_{REGISTANT}$ on the left-hand side.

$$P_{REGISTANT} = 0.0049 I_{DBR}^2 + 0.848 I_{DBR} - 0.381 - (I_{DBR}/55 - 1/11) \quad \text{Equation 8}$$

When an electric current is injected into the thermal compensation region as well, spontaneous emission light is emitted from the thermal compensation region as from the DBR region. For this reason, when the thermal compensation region current $I_{TH}$ is 5 mA or larger, Equation 9 is given similarly to Equation 8 shown above.

$$P_{REGISTANT\_TH} = 0.0047 I_{TH}^2 + 0.8385 I_{TH} - 0.3556 - (I_{TH}/55 - 1/11) \quad \text{Equation 9}$$

$P_{REGISTANT\_TH}$ denotes an electric power converted to heat generated in the thermal compensation region.

In this example too, the wavelength tunable semiconductor laser device is mounted on the wavelength tunable laser controller 21 shown in FIG. 9. At the electric current controlling circuit 23, $I_1$ is connected to the active region electrode, $I_2$ is connected to the DBR region electrode, and $I_8$ is connected to the thermal compensation region electrode. In addition, the control method is carried out as follows. When $I_{DBR} \geq 5$ mA and $I_{TH} \geq 5$ mA as described above, Equation 1 and Equation 2 are replaced with Equation 7 and Equation 8, respectively, and Equation 3 is replaced with Equation 10 to find the thermal compensation currents. Then the wavelengths are switched back and forth with conditions of the wavelength tuning current 20 mA–the thermal compensation current 49.4 mA and the wavelength tuning current 53 mA–the thermal compensation current 14.4 mA. The two current pairs both satisfy the condition of $P_{TOTAL} = 70$ mW in Equation 10.

$$P_{TOTAL} = P_{REGISTANT} + P_{REGISTANT\_TH} \quad \text{Equation 10}$$

Consequently, the wavelengths could be switched back and forth at high speed with the wavelength drifts being confined within 1 GHz. This example did not show significant improvement in the wavelength drifts compared with Example 1. That is because the spontaneously-emitted light $P_{SPON}$ is small. Whether $P_{SPON}$ is large or small is largely influenced by the structure and crystallinity of the non-active layer constituting the DBR region. This example is very effective in a case where the value of the spontaneously-emitted light is high.

EXAMPLE 3

Figure 13:
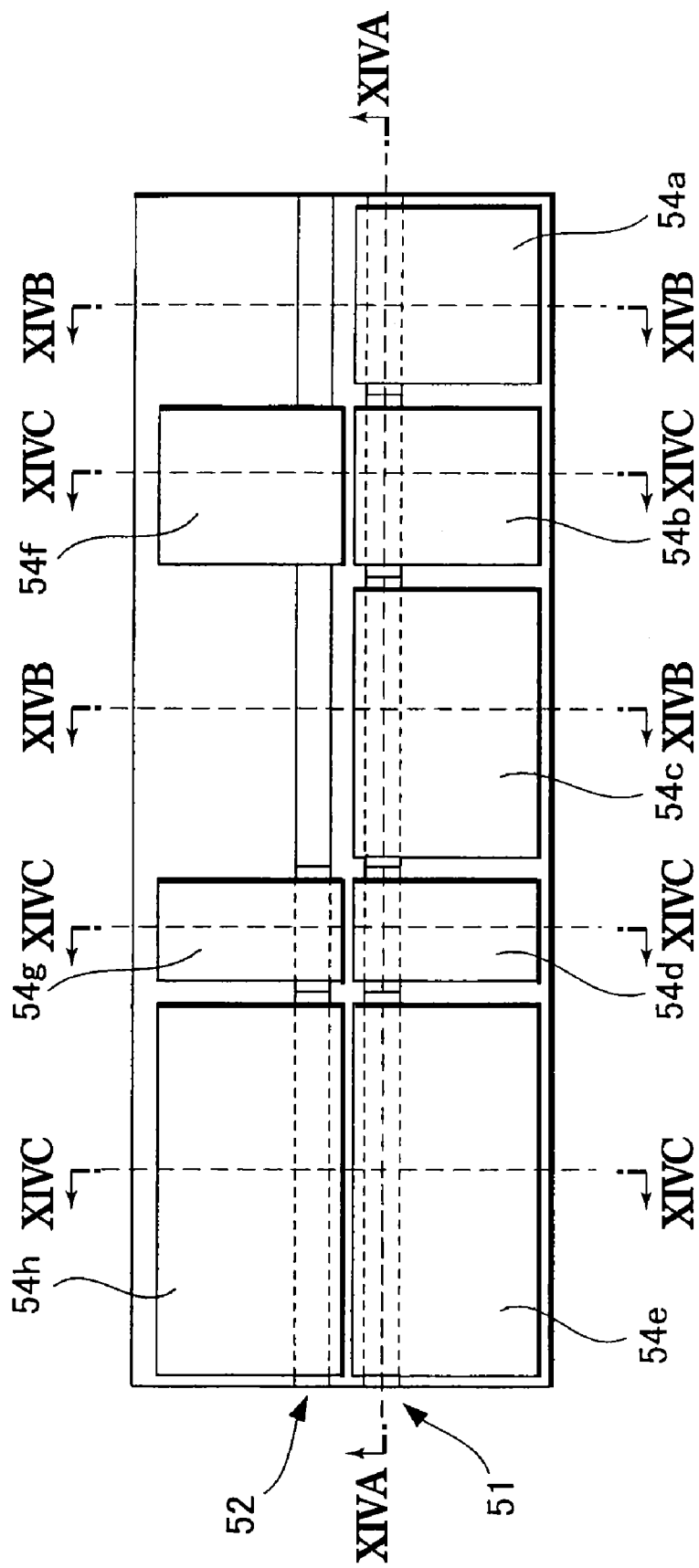
FIG. 13 is a top view showing another example of the wavelength tunable semiconductor laser device according to the present invention.
Figure 14A:
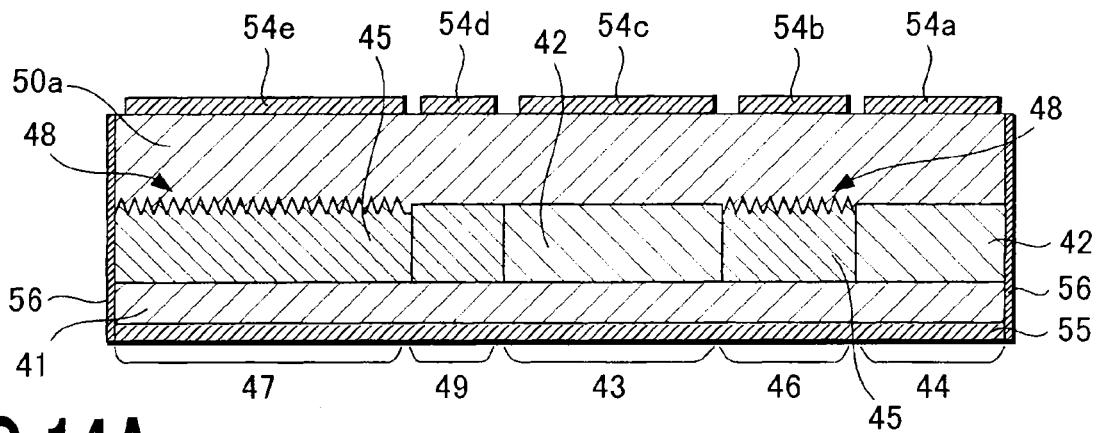
FIG. 14A is a cross-sectional view of the wavelength tunable semiconductor laser device taken along the XIVA-XIVA line in FIG. 13.
Figure 14B:
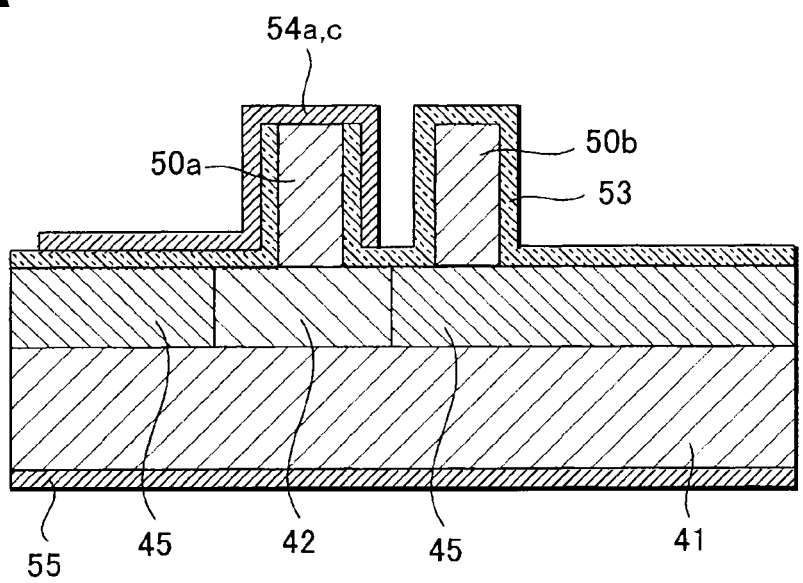
FIG. 14B is a cross-sectional view of the wavelength tunable semiconductor laser device taken along the XIVB-XIVB line in FIG. 13.
Figure 14C:
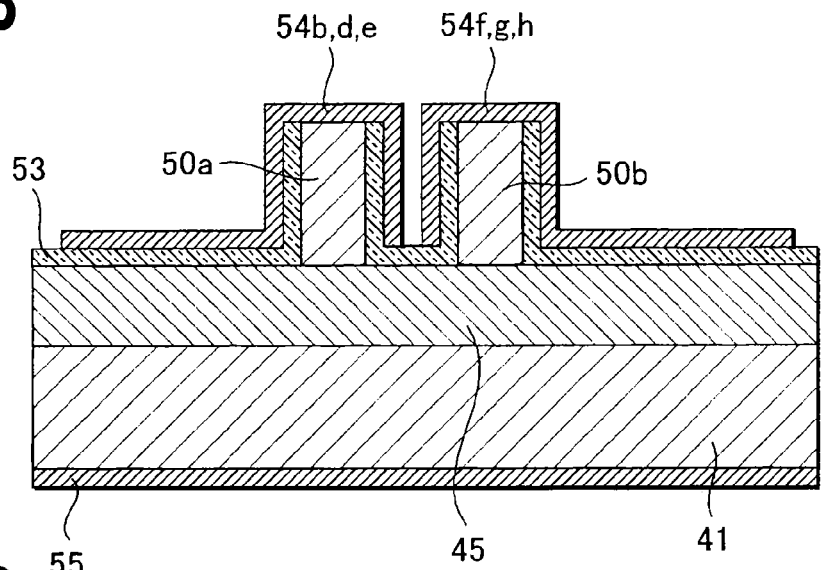
FIG. 14C is a cross-sectional view of the wavelength tunable semiconductor laser device taken along the XIVC-XIVC line in FIG. 13.

FIG. 13, FIG. 14A, FIG. 14B and FIG. 14C show another example of the embodiment of the wavelength tunable semiconductor laser device according to the present invention. FIG. 13 shows a top view, and FIGS. 14A, 14B and 14C show a cross-sectional view of FIG. 13 along the XIVA-XIVA line, a cross-sectional view of FIG. 13 along the XIVB-XIVB line and a cross-sectional view of FIG. 13 along XIVC-XIVC line, respectively.

As shown in FIG. 13, FIG. 14A, FIG. 14B and FIG. 14C, the wavelength tunable semiconductor laser device according to this example also includes a laser region and a thermal compensation region. The laser region includes a SOA region 44, a front DBR region 46, an active region 43, a phase control region 49 and a rear DBR region 47. The SOA region 44, the front DBR region 46, the active region 43, the phase control region 49 and the rear DBR region 47 are connected one after another in series in this order from the right of FIGS. 13 and 14A. Each of the active region 43 and the SOA region 44 includes an active layer 42 formed in a straight line on a substrate serving as a lower clad 1, and an upper clad 50a formed in a convex shape on the active layer 42. Each of the front DBR region 46 and the rear DBR region 47 includes a non-active layer 45 formed on the lower clad 1, a diffraction grating 48 formed on the top surface of a portion of the non-active layer 45, the portion and the active layer 42 being arranged in a straight line, and the upper clad 50a formed in a convex shape on the diffraction grating 48. The phase control region 49 includes the non-active layer 45 formed on the lower clad 1, and the upper clad 50a formed in a convex shape on a portion of the non-active layer 45, the portion and the active layer 42 being arranged in a straight line. With this configuration, an optical waveguide of the laser region is formed in a mesa structure 51.

The thermal compensation region includes the non-active layer 45 formed on the lower clad 41, and an upper clad 50b formed in a convex shape on the non-active layer 45 so that the upper clad 50b is parallel to and adjacent to the upper clad 50a of the laser region. With this configuration, an optical waveguide of the thermal compensation region is formed in a mesa structure 52, and the mesa structure 52 of the thermal compensation region is arranged in parallel to and adjacent to the mesa structure 51 of the laser region.

In addition, the wavelength tunable semiconductor laser device according to this example includes an insulating film 53 which is formed on the surfaces of the active layer 42, the non-active layer 45, the upper clads 50a, 50b except for portions of the surfaces of the upper clad 50a, 50b. Furthermore, as electrodes, an SOA region electrode 54a, a front DBR region electrode 54b, an active region electrode 54c, a phase control region electrode 54d, a rear DBR region electrode 54e, thermal compensation region electrodes 54f-h, and a lower electrode 55 are included in the wavelength tunable semiconductor laser device according to this example. The SOA region electrode 54a is formed on the top surface of a portion of the upper clad 50a, the portion constituting the SOA region 44. The front DBR region electrode 54b is formed on the top surface of a portion of the upper clad 50a, the portion constituting the front DBR region 46. The active region electrode 54c is formed on the top surface of a portion of the upper clad 50a, the portion constituting the active region 43. The phase control region electrode 54d is formed on the top surface of a portion of the upper clad 50a, the portion constituting the phase control region 49. The rear DBR region electrode 54e is formed on the top surface of a portion of the upper clad 50a, the portion constituting the rear DBR region 47. The thermal compensation region electrode 54f is formed on the top surface of a portion of the upper clad 50b, the portion constituting the thermal compensation region for the front DBR region. The thermal compensation region electrode 54g is formed on the top surface of a portion of the upper clad 50b, the portion constituting the thermal compensation region for the phase control region. The thermal compensation region electrode 54h is formed on the top surface of a portion of the upper clad 50b, the portion constituting the thermal compensation region for the rear DBR region. The lower electrode 55 is formed on the bottom surface of the lower clad 41. Moreover, the wavelength tunable semiconductor laser device according to this example includes AR films 56 on the side end surface of the active layer 42 constituting the SOA region 44 and the side end surface of the non-active layer 45 constituting the rear DBR region 47.

As shown in FIG. 13, the wavelength tunable semiconductor laser device according to this example is of a multi-electrode type. Each of the front DBR region 46 and the rear DBR region 47 is a SSG-DBR laser having seven different reflection peaks. In the laser region, as shown in FIG. 14A, the SOA region 44, the front DBR region 46, the active region 43, the phase control region 49, the rear DBR region 47 are arranged in this order from the right. The SOA region 44, the front DBR region 46, the active region 43, the phase control region 49, the rear DBR region 47 are 400 µm, 300 µm, 350 µm, 80 µm and 600 µm in length, respectively. The wavelength tunable semiconductor laser device according to this example has three wavelength tunable regions including the front DBR region 46, the phase control region 49 and the rear DBR region 47. Electric currents injected into these regions are respectively controlled as a front DBR current, a phase adjusting current, and a rear DBR region current.

As shown in FIG. 13, the mesa stripe of the mesa structure 52 for the thermal compensation is formed in parallel to and adjacent to the mesa stripe of the mesa structure 51 for the laser region with an interval of 20 µm. A thermal compensation region is formed for each of the three wavelength tuning regions (the front DBR region 46, the phase control region 49 and the rear DBR region 47). In other words, the wavelength tunable semiconductor laser device according to this example includes the mesa structure 52 for the thermal compensation adjacent to the mesa structure 51 of the laser region as well, and electric current injection or voltage application into the mesa structure 52 for the thermal compensation is performed by use of the foregoing control method and controller. The wavelength tunable semiconductor laser device according to this example is designed to apply voltages to or inject electric currents into the respective thermal compensation regions to convert the voltages or electric currents to heat, so that the change in the amount of heat generated in the device is suppressed to always keep the temperature of the device constant. Accordingly, the wavelength tunable semiconductor laser device according to this example reduces the wavelength drifts which have been the problem with the conventional wavelength tunable semiconductor laser device.

Here, description will be provided for the fabrication method of the wavelength tunable semiconductor laser device according to this example.

(1) First, the active layer 42 is grown on the lower clad 41 which is an n-type InP substrate. Subsequently, all the portion of the active layer 42 except for portions respectively designated for the active region 43 and the SOA region 44 is removed by sulfuric acid-based wet selective etching.

(2) Thereafter, the non-active layer 45 is grown by butt joint regrowth. Subsequently, the diffraction grating 48 with an alternating series of concaves and convexes as shown in FIG. 14A is formed in portions of the non-active layer 45 by wet etching, the portions respectively designated for the front DBR region 46 and the rear DBR region 47. Although not illustrated, each diffraction grating 48 includes a plurality of phase shifts as in the conventional SSG-DBR laser (Non-patent Document 4). In addition, an alternate series of concaves and convexes is not formed in the non-active layer 45 in a region designated for the phase control region 49. Instead, the non-active layer 45 is formed in a flat shape.

(3) Afterward, the upper clad 50 of p-type InP is regrown. Subsequently, the mesa structure 51 and the mesa structure 52 with a width of 2 µm which respectively constitute the laser region and the thermal compensation region are formed by hydrochloric acid-based wet selective etching as in the case of Example 1.

(4) After that, the insulating film 53 of $SiO_2$ is formed throughout the surface of the device. Subsequently, from the insulating film 53, only a portion corresponding to the top of the mesa structure 51 of the laser region and a portion corresponding to the top of the mesa structure 52 of the thermal compensation region are removed. Thereby, as shown in FIGS. 14B and 14C, the SOA region electrode 54a, the front DBR region electrode 54b, the active region electrode 54c, the phase control region electrode 54d and the rear DBR region electrode 54e, the thermal compensation region electrode 54f for the front DBR, the thermal compensation region electrode 54g for the phase control region and the thermal compensation region electrode 54h for the rear DBR region are formed for energizing the mesa structure 51 of the laser region and the mesa structure 52 of the thermal compensation region.

(5) Thereafter, the substrate is polished so that the resulting thickness is 150 μm, and then the back electrode 55 is formed. After cleavage, the AR film 56 is formed on the side end surface of each of the SOA region 44 and the rear DBR region 47.

The wavelength tunable semiconductor laser device according to this example also takes a PIN structure in which the substrate (the lower clad 41) is made of the n-type semiconductor, the active layer 42 and the non-active layer 45 are made of a non-doped semiconductor whose bandgap is smaller than those of the clad layers, and the upper clad 50a is made of the p-type semiconductor.

Like the wavelength tunable semiconductor laser device according to Example 1, the wavelength tunable semiconductor laser device according to this example oscillates a laser beam by injecting an electric current into the active region 43, and amplifies or damps the output light by injecting an electric current into the SOA region 44. Thereby, the wavelength tunable semiconductor laser device according to this example is capable of adjusting the output power. In addition, the wavelength tunable semiconductor laser device according to this example has a tuning function that can shift the Bragg wavelength by injecting a forward bias current into each of the multiple DBR regions 46, 47, and a fine adjusting function that can fine tune the lasing wavelength within a maximum range of 0.5 nm by injecting an electric current into the phase control region 49 for adjusting the phase (Non-Patent Document 4).

In this example, too, the wavelength tunable semiconductor laser controller 21 shown in FIG. 9 is mounted with the wavelength tunable semiconductor laser device according to this example. In the electric current controlling circuit 23, $I_1$, $I_2$, $I_3$, $I_4$, $I_5$, $I_{13}$, $I_{11}$ and $I_{10}$ are allocated and thus connected to the SOA region electrode 54a, the front DBR region electrode 54b, the active region electrode 54c, the phase control region electrode 54d, the rear DBR region electrode 54e, the thermal compensation region electrode 54f corresponding to the front DBR region electrode, the thermal compensation region electrode 54g corresponding to the phase control region, and the thermal compensation region electrode 54h corresponding to the rear DBR region, respectively.

Figure 15A:
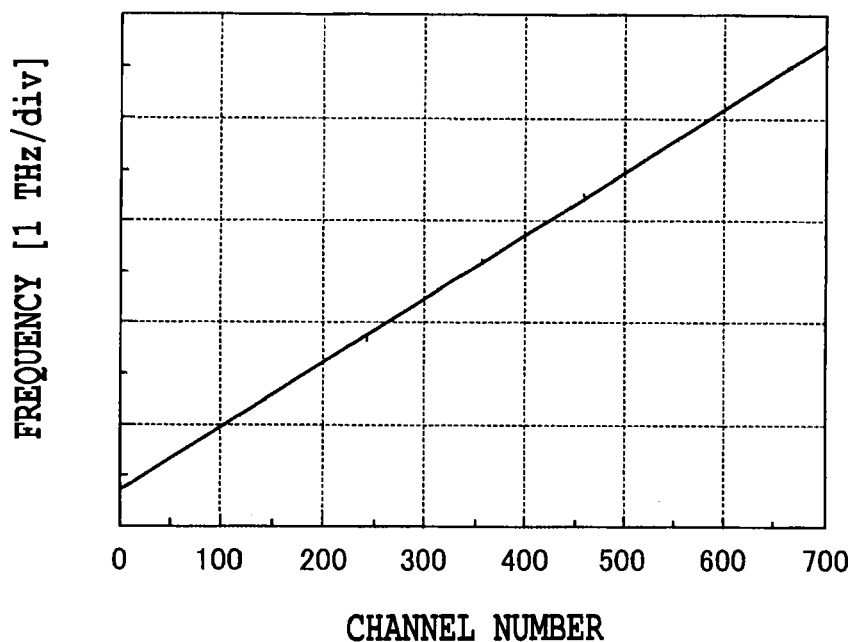
FIG. 15A is a graph showing a result of a wavelength sweeping operation carried out by the wavelength tunable semiconductor laser device according to the present invention.
Figure 15B:
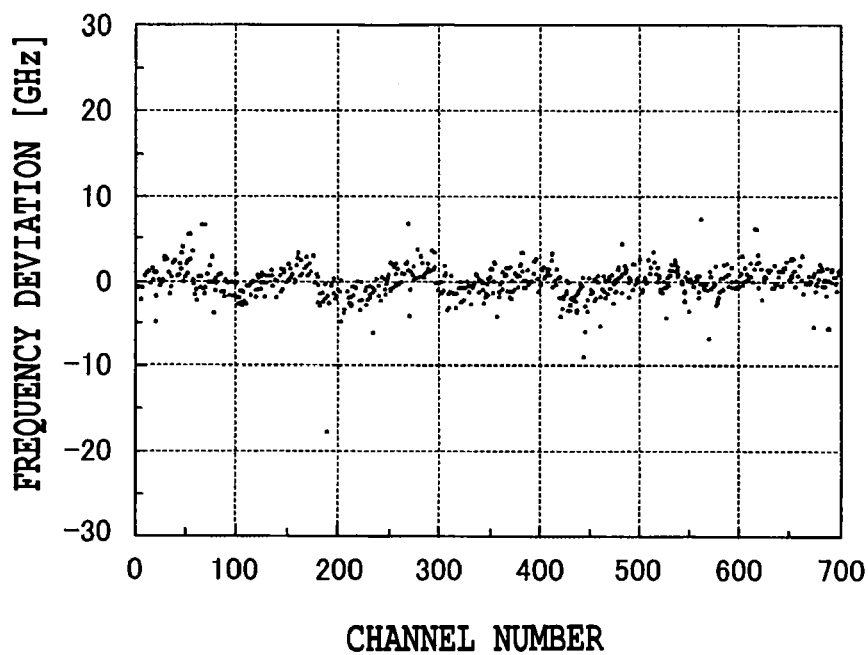
FIG. 15B is a graph showing a frequency deviation from a set-up frequency for each channel number.

Because the wavelength tunable semiconductor laser device according to this example includes three wavelength tuning regions, a method of controlling the thermal compensation regions corresponding to the respective wavelength tuning regions was tested in terms of the effect of preventing the wavelength drifts which occur due to heat by applying the control method shown as a part of Example 1 (see FIGS. 3 to 6 as well as Tables 1 and 2) to each of the wavelength tuning regions. In addition, 700 frequencies (wavelengths) in 6.25 GHz interval were set in a range of 191.2265 THz (approximately equal to 1567.5 nm) to 195.6015 THz (approximately equal to 1532.5 nm) for the light to be outputted while the wavelength tunable semiconductor laser device according to this example was being statically driven. FIG. 15A shows a result of a wavelength sweeping operation which was repeatedly carried out at high speed with each frequency being held for 500 ns by using electric current values set while the wavelength tunable semiconductor laser device was being statically driven. As clear from FIG. 15A, a satisfactory sweep result with no mode hopping was obtained. Moreover, FIG. 15B shows a result of an examination on how far the frequency set for each channel deviated from its original frequency while the wavelength tunable semiconductor laser device was being statically driven. As can be seen from FIG. 15B, the amount of each shift was within a range of approximately −5 GHz to approximately +5 GHz.

Figure 16:
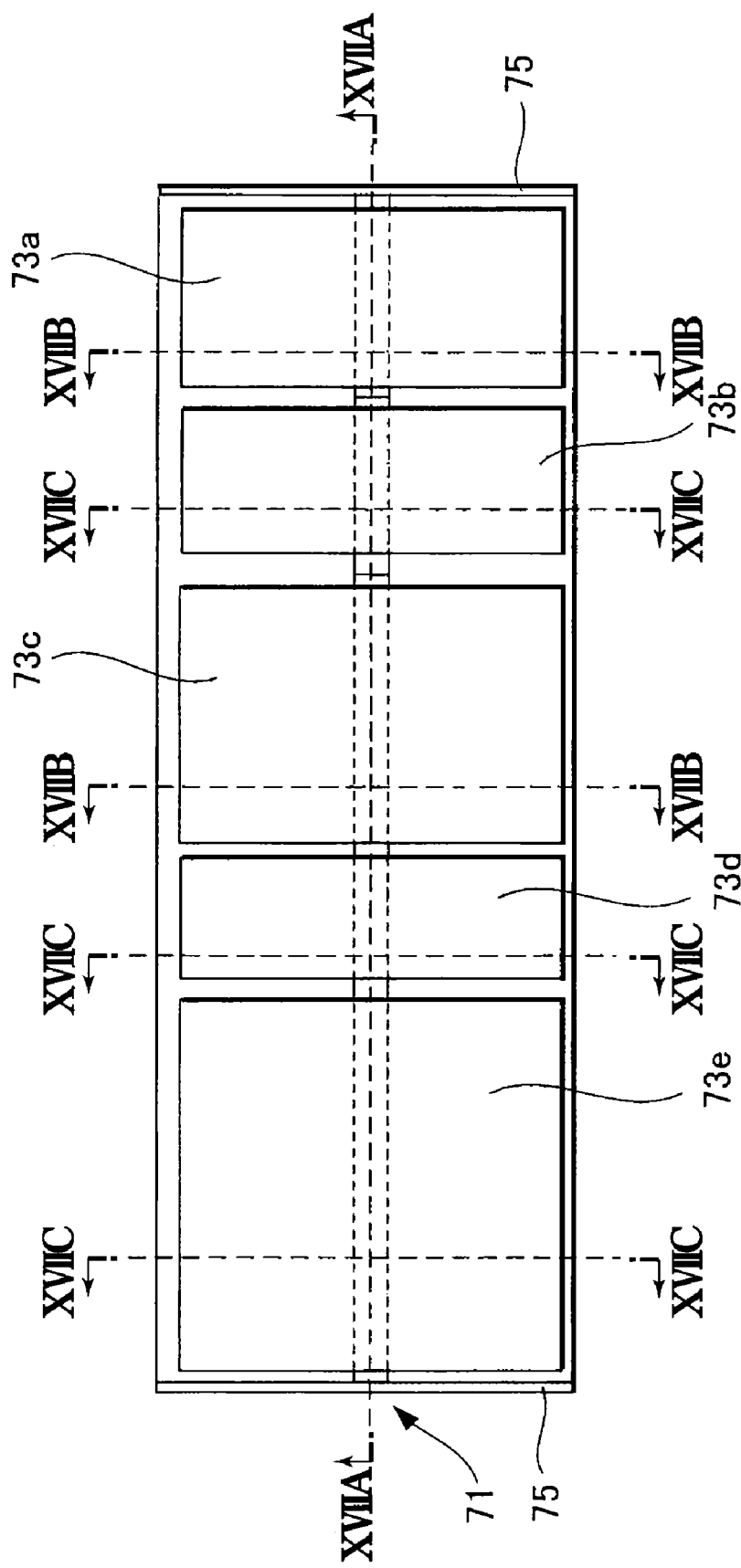
FIG. 16 is a top view showing a conventional wavelength tunable semiconductor laser device.
Figure 17A:
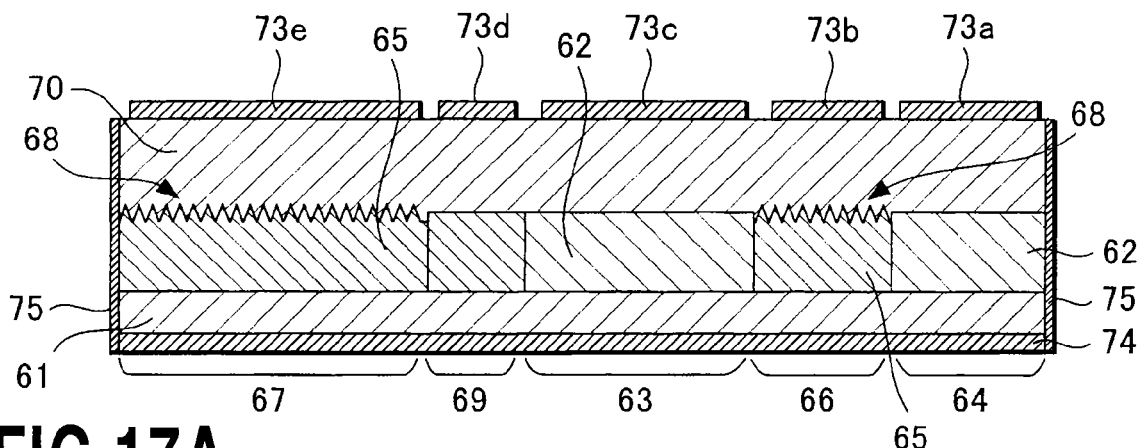
FIG. 17A is a cross-sectional view of the conventional wavelength tunable semiconductor laser device of FIG. 16 taken along the XVIIA-XVIIA line.
Figure 17B:
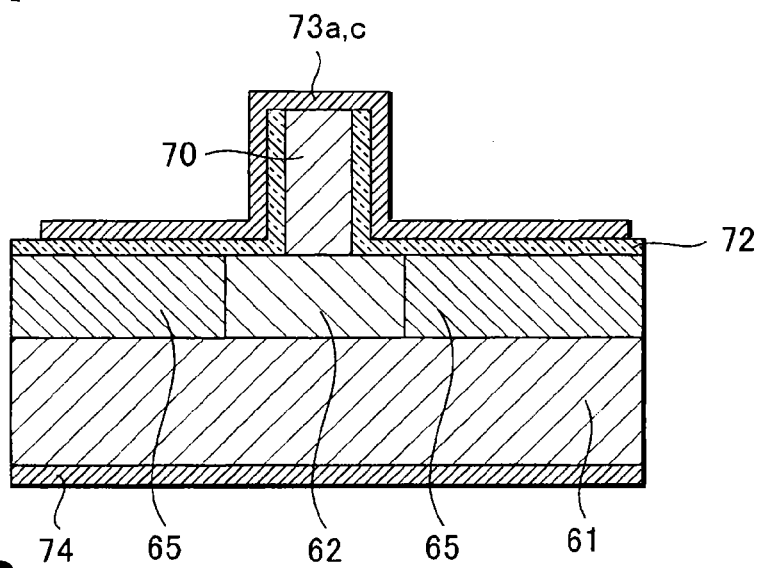
FIG. 17B is a cross-sectional view of the conventional wavelength tunable semiconductor laser device of FIG. 16 taken along the XVIIB-XVIIB line.
Figure 17C:
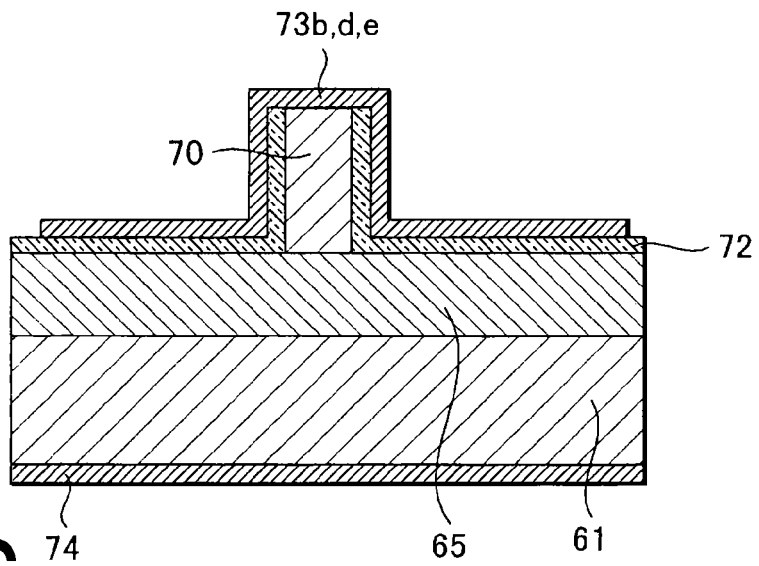
FIG. 17C is a cross-sectional view of the conventional wavelength tunable semiconductor laser device of FIG. 16 taken along the XVIIC-XVIIC line.

A wavelength tunable semiconductor laser device (SSG-DBR laser) according to this example without the thermal compensation regions, that is, the conventional SSG-DBR laser was fabricated for a comparison purpose. FIG. 16 shows a top view of the conventional SSG-DBR laser, and FIGS. 17A, 17B and 17C show a cross-sectional view of FIG. 16 along the XVIIA-XVIIA line, a cross-sectional view of FIG. 16 along the XVIIB-XVIIB line and a cross-sectional view of FIG. 16 along the XVIIC-XVIIC line, respectively. Many parts in the configuration of the conventional SSG-DBR laser are the same as the counterpart components in the configuration of the wavelength tunable semiconductor laser device according to this example except for the thermal compensation regions. For this reason, detailed descriptions for the conventional SSG-DBR laser will not be given.

Figure 18A:
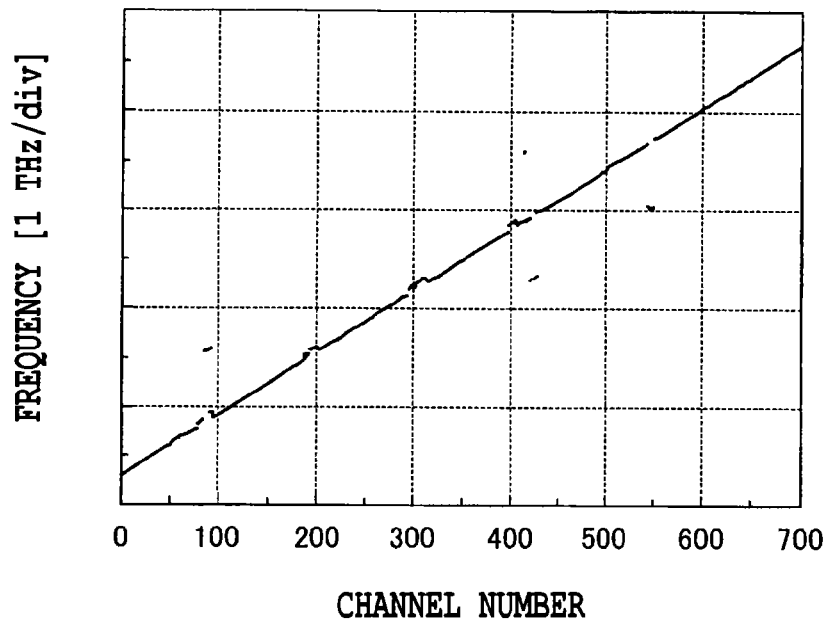
FIG. 18A is a graph showing a result of a wavelength sweeping operation carried out by the conventional wavelength tunable semiconductor laser device shown in FIG. 17.
Figure 18B:
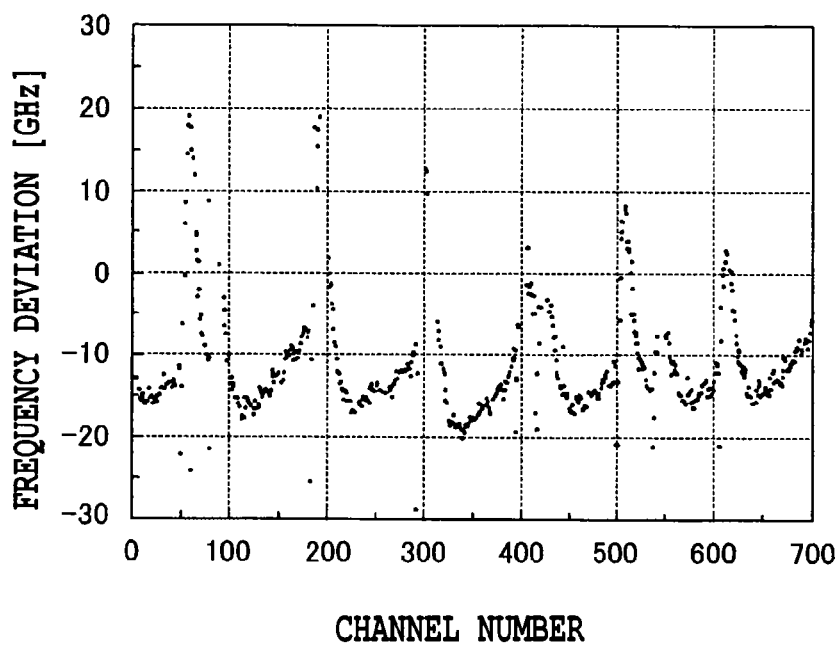
FIG. 18B is a graph showing how far a frequency deviates from a set-up frequency for each channel number.

A wavelength sweeping operation was repeatedly carried out at high speed by use of the conventional SSG-DBR laser shown in FIGS. 16 and 17. Here, a frequency grid was set while the conventional SSG-DBR laser was being statically driven so that the frequency range and the frequency interval were the same as those mentioned above (191.2265 THz to 195.6015 THz, 6.25 GHz interval, 700 ch). In addition, each frequency was similarly held for 500 ns. FIG. 18A shows a result of the wavelength sweeping operation which was carried out by the conventional SSG-DBR laser. Unlike FIG. 15A, it can be seen from FIG. 18A that a large mode hopping was caused. In addition, FIG. 18B shows how far the wavelength set for each channel deviated from its original wavelength. It can be seen from FIG. 18B that the amount of each deviation was in the range of approximately −20 GHz to approximately +20 GHz. The difference between the deviations shown in FIG. 18B and the deviations shown in FIG. 15B is significant when FIG. 18B and FIG. 15B are compared with each other.

The wavelength tunable semiconductor laser device according to this example uses the SSG-DBR in each of the front DBR region 46 and the rear DBR region 47. However, it goes without saying that, even if a distributed reflector in which an alternate series of concaves and convexes is evenly formed is used in each of the front DBR region 46 and the rear DBR region 47, the wavelength tunable semiconductor laser device according to this example is capable of offering a similar effect as long as the above-described thermal compensation regions are used. In addition, wavelength tunable semiconductor laser device including one according to other example may be configured so that a part or whole of each DBR region is made of a non-active waveguide in which a distributed reflector diffraction grating is formed or of a non-active waveguide serving as the phase control region.

EXAMPLE 4

Figure 19:
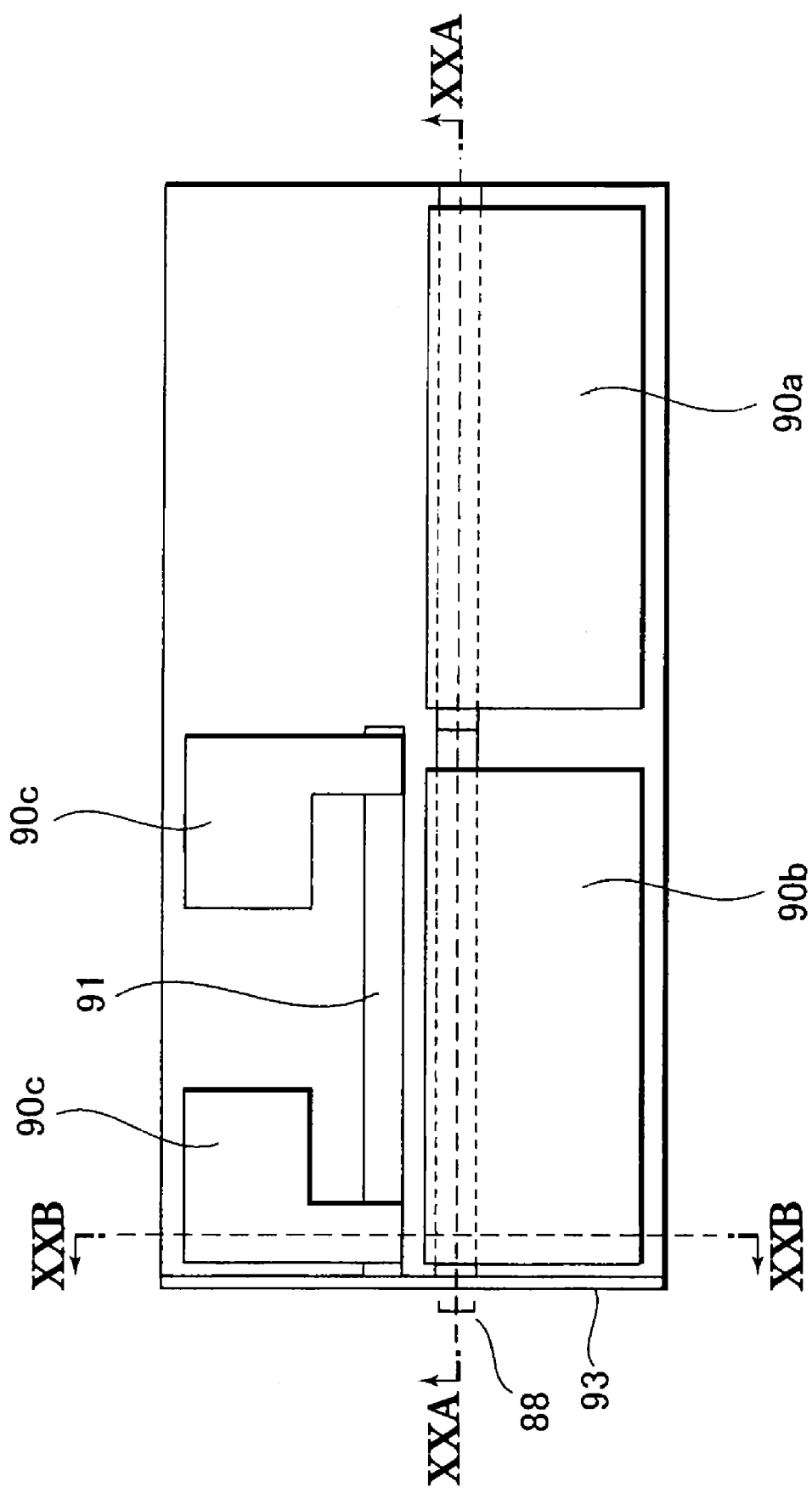
FIG. 19 is a top view showing yet another example of the wavelength tunable semiconductor laser device according to the present invention.
Figure 20A:
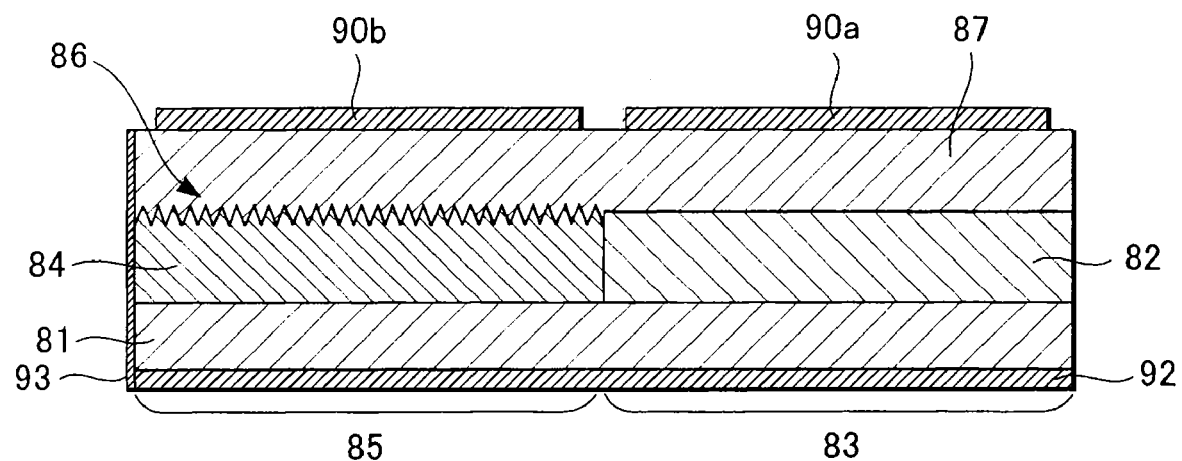
FIG. 20A is a cross-sectional view of the wavelength tunable semiconductor laser device of FIG. 19 taken along the XXA-XXA line.
Figure 20B:
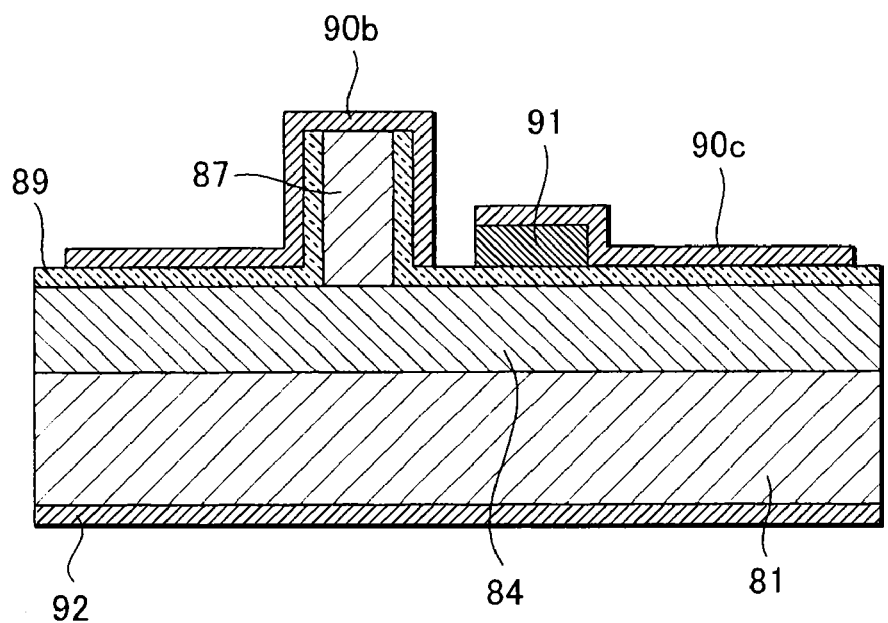
FIG. 20B is a cross-sectional view of the wavelength tunable semiconductor laser device of FIG. 19 taken along the XXB-XXB line.

FIGS. 19, 20A and 20B shows another example of the wavelength tunable semiconductor laser device according to this embodiment. FIG. 19 shows a top view of the wavelength tunable semiconductor laser device according to this example, and FIGS. 20A and 20B show a cross-sectional view of FIG. 19 along the XXA-XXA line and a cross-sectional view of FIG. 19 along the XXB-XXB line, respectively.

As shown in FIGS. 19, 20A and 20B, the wavelength tunable semiconductor laser device according to this example includes a laser region and a thermal compensation region as well. However, the configuration of the thermal compensation region is different from that according to each of the other examples. Like the laser region in the wavelength tunable semiconductor laser device shown as Example 1, the laser region includes an active region 83 and a DBR region 85 connected to the active layer 83 in series. The active region 83 includes an active layer 82 formed in straight line on a substrate constituting a lower clad 81, and an upper clad 87 formed in a convex shape on the active layer 82. The DBR region 85 includes a non-active layer 84 formed on the lower clad 81, a diffraction grating 86 formed on the top surface of a portion of the non-active layer 84, the portion and the active layer 82 being formed in a straight line, and an upper clad 87 formed in a convex shaped on the diffraction grating 86. With this configuration, an optical waveguide of the laser region is constructed in a mesa structure 88.

In addition, the wavelength tunable semiconductor laser device according to this example includes an insulating film 89 which is formed on the surfaces respectively of the active layer 82, the non-active layer 84 and the upper clad 87 except for the top surface of the upper clad 87. Furthermore, as a thermal compensation region, an electric resistor 91 which is formed on the insulating film 89 so that the electric resistor 91 is parallel to and adjacent to the upper clad 87. By this, the thermal compensation region is formed in parallel to and adjacent to the mesa structure 88 of the laser region. Moreover, as electrodes, an active region electrode 90a, a DBR region electrode 90b, thermal compensation region electrodes 90c, and a lower electrode 92 are included in the wavelength tunable semiconductor laser device. The active region electrode 90a is formed on the top surface of a portion of the upper clad 87, the portion constituting the active layer 83. The DBR region electrode 90b is formed on the top surface of a portion of the upper clad 87, the portion constituting the DBR region 85. Thermal compensation region electrode 90c is formed and connected to a portion of the electric resistor 91, the portion constituting the thermal compensation region. The lower electrode 92 is formed on the bottom surface of the lower clad 81. Additionally, the wavelength tunable semiconductor laser device according to this example includes an AR film 93 which is formed on a side end surface of the non-active layer 84 constituting the DBR region 85.

Specifically, unlike the wavelength tunable semiconductor laser device according to the other examples, as shown in FIG. 19, the wavelength tunable semiconductor laser device according to this example includes the electric resistor 91, as the thermal compensation region, which is formed in parallel to and adjacent to the mesa structure 88 of the DBR region, instead of the mesa structure of the thermal compensation region which is formed in parallel to and adjacent to the mesa structure of the laser region. Thus, the wavelength tunable semiconductor laser device according to this example is designed to apply an electric current to or inject a voltage into the electric resistor 91 for the thermal compensation by use of the above-described control method and controller. Thereby, the wavelength tunable semiconductor laser device according to this example converts most of the applied voltage or the injected electric current to heat, and thus suppresses change in the amount of heat generated in the device. Accordingly, the wavelength tunable semiconductor laser device according to this example always keeps the temperature of the device constant, and thus reduces the wavelength drifts which have been the problem with the conventional type of wavelength tunable semiconductor laser device.

The electric resistor 91 is formed of platinum (Pt: electric conductivity is $9.4 \times 10^6$ S/m) with a thickness of 500 nm, a width of 2.5 µm and a length of 400 µm. As a result, the resistance value of the electric resistor 91 is 30Ω. Any metal may be used for the electric resistor 91, as long as the electric conductivity of the metal is approximately equal to or less than $10^7$ S/m, and concurrently as long as the metal is capable of stably adhering to the insulating film 89. For instance, chromium (Cr: electric conductivity is $7.5 \times 10^6$ S/m) or the like may be used for the electric resistor 91.

As shown in FIG. 20A, the structure of the laser region in the wavelength tunable semiconductor laser device according to this example is the two-section DBR laser structure as in the wavelength tunable semiconductor laser device according to Example 1. In addition, like the wavelength tunable semiconductor laser device according to Example 1, the wavelength tunable semiconductor laser device according to this example is controlled by the wavelength tunable laser controller 21 shown in FIG. 9, in which the wavelength tunable semiconductor laser device according to this example is installed. Here, out of the two thermal compensation region electrodes 90c in the wavelength tunable semiconductor laser device according to this example, one located on the left side of FIG. 19 is earthed to the ground, and the other located on the right side of FIG. 19 is connected to $I_8$ of the electric current controlling circuit 23. In addition, the active layer region electrode 90a and the DBR region electrode 90b are used by connecting the active layer region electrode 90a and the DBR region electrode 90b to $I_1$ and $I_2$ thereof, respectively.

For this control, Equation 2 used for the control method according to Example 1 is replaced with Equation 11 which will be shown below to switch the wavelengths in accordance with the flowchart shown in FIG. 3. Note that units of $P_{TH}$ and $I_{TH}$ in Equation 11 are mW and mA, respectively. For the purpose of adjusting the units, the right hand side of Equation 11 is multiplied by a coefficient of 1/1000. For instance, when $I_{TH}$=10 mA, if a value 10 is substituted into $I_{TH}$ in Equation 11, $P_{TH}$=3(mW) is given.

$$P_{TH}=30 \times I_{TH}^2/1000 \qquad \text{Equation 11}$$

By use of the control method and the controller shown as Example 1, the wavelength tunable semiconductor laser device according to this example is capable of suppressing change in the amount of heat generated in the device, and accordingly capable of always keeping the temperature of the device constant. Consequently, the wavelength tunable semiconductor laser device according to this example is capable of suppressing the wavelength drifts within 1 GHz, and thus capable of offering the same result as the wavelength tunable semiconductor laser device according to Example 1.

EXAMPLE 5

Figure 21:
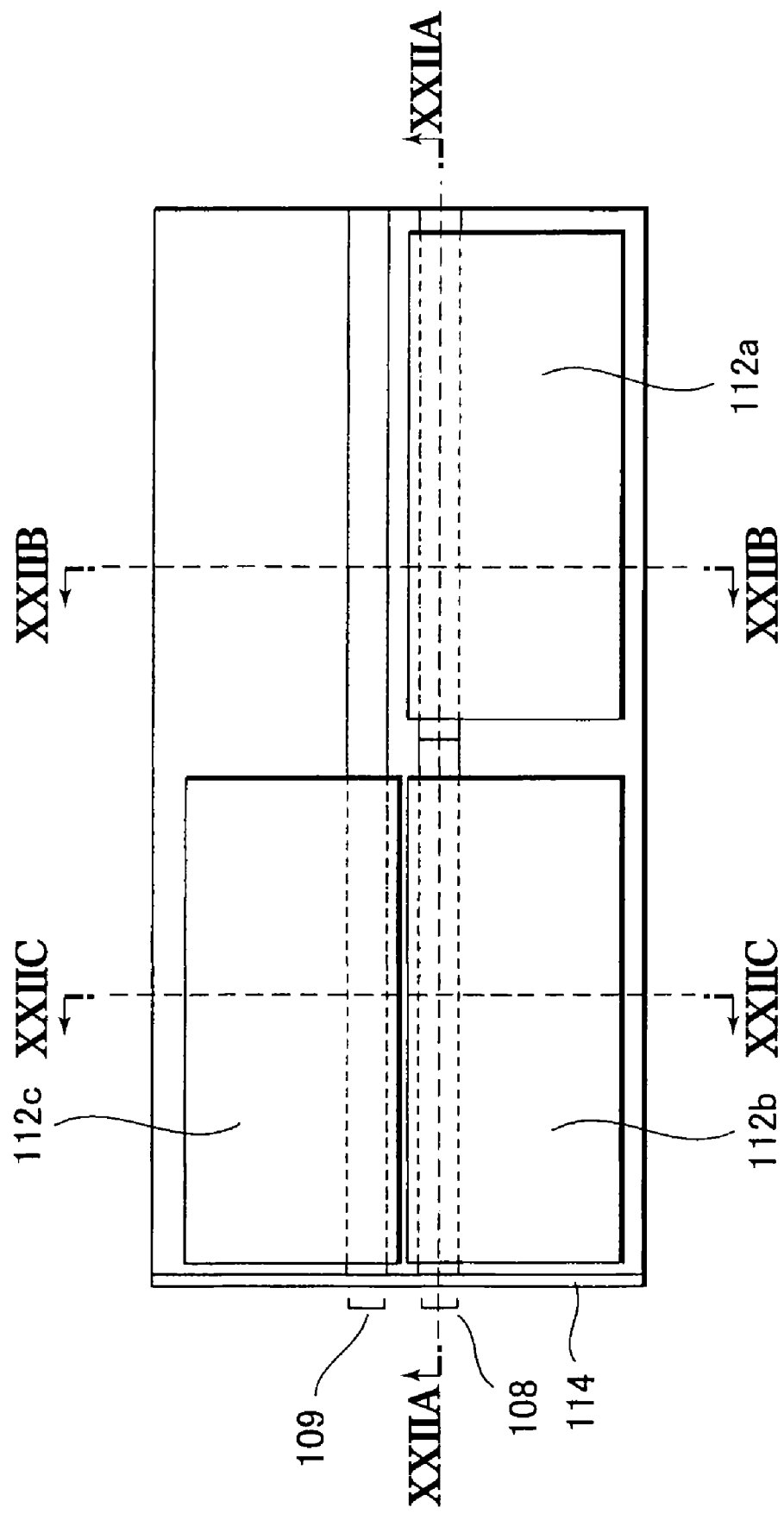
FIG. 21 is a top view showing yet another example of the wavelength tunable semiconductor laser device according to the present invention.
Figure 22A:
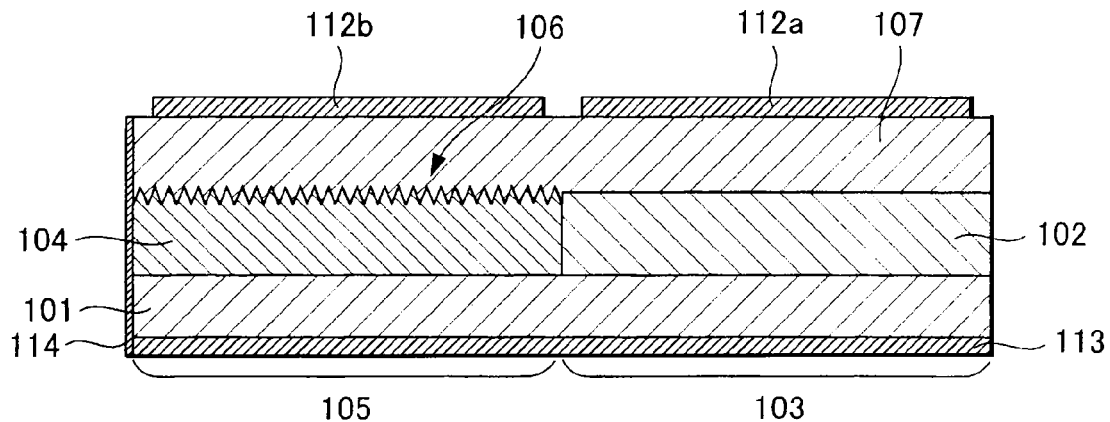
FIG. 22A is a cross-sectional view of the conventional wavelength tunable semiconductor laser device of FIG. 21 taken along the XXIIA-XXIIA line.
Figure 22B:
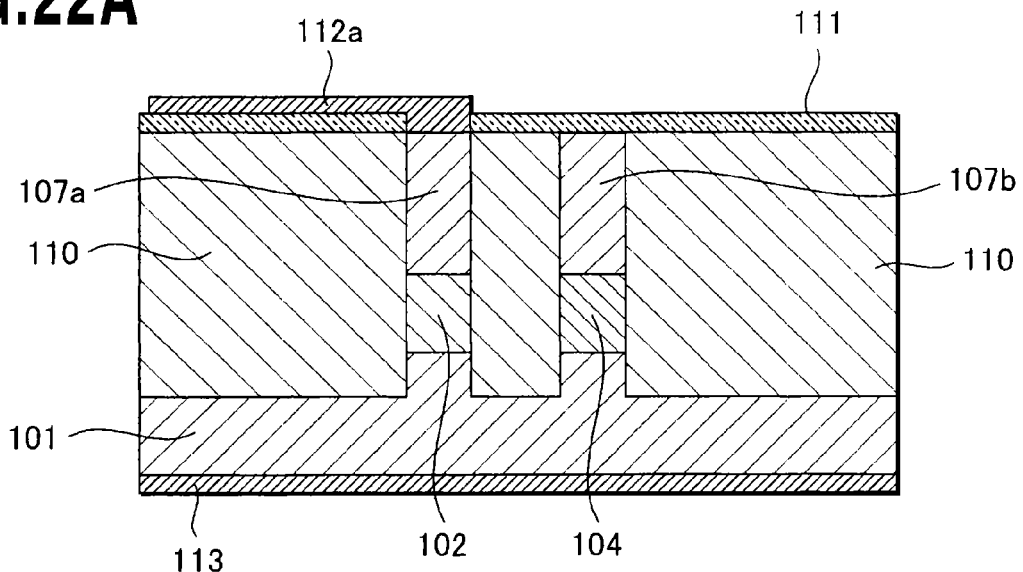
FIG. 22B is a cross-sectional view of the wavelength tunable semiconductor laser device of FIG. 21 taken along the XXIIB-XXIIB line.
Figure 22C:
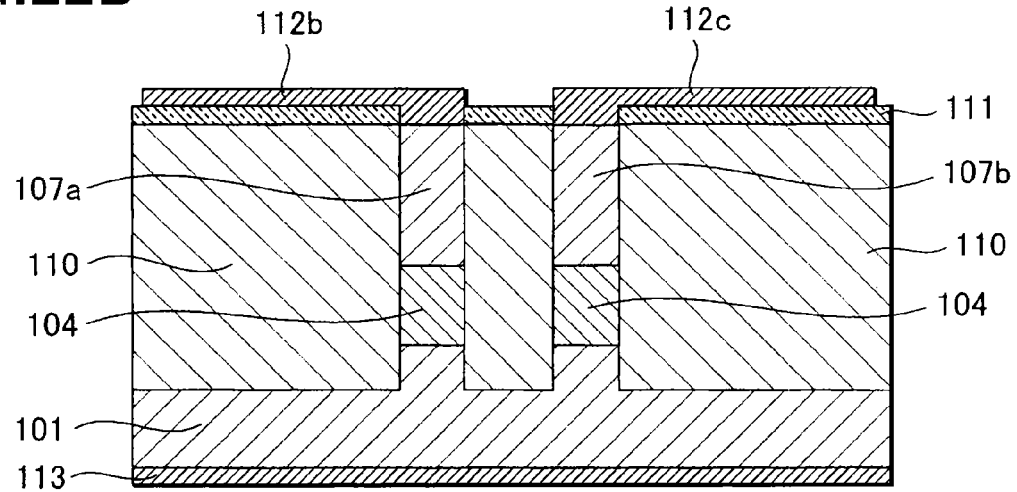
FIG. 22C is a cross-sectional view of the wavelength tunable semiconductor laser device of FIG. 21 taken along the XXIIC-XXIIC line.

FIGS. 21, 22A, 22B and 22C shows another example of the embodiment of the wavelength tunable semiconductor laser device according to the present invention. FIG. 21 shows the top view, and FIGS. 22A, 22B and 22C show a cross-sectional view of FIG. 21 along the XXIIA-XXIIA line, a cross-sectional view of FIG. 21 along the XXIIB-XXIIB line, and a cross-sectional view of FIG. 21 along the XXIIC-XXIIC line, respectively.

As shown in FIGS. 21, 22A, 22B and 22C, the wavelength tunable semiconductor laser device according to this example includes a laser region and a thermal compensation region as well. The laser region includes an active region 103 and a DBR region 105 connected to the active region 103 in series. The active region 103 includes an active layer 102 formed in straight line on a substrate constituting a lower clad 101, an upper clad 107a formed in a convex shape on the active layer 102, and a lateral clad 110 formed around parts of the lower clad 101, the active layer 102 and the upper clad 107a so that the parts of the lower clad 101, the active layer 102 and the upper clad 107a are buried in the lateral clad 110. The DBR region 105 includes a non-active layer 104 formed on the lower clad 101 so that the non-active layer 104 and the active layer are arranged in a straight line, a diffraction grating 106 formed on the top surface of the non-active layer 104, the upper clad 107a formed in a convex shape on the diffraction grating 106, and the lateral clad 110 formed around the parts of the lower clad 101, the non-active layer 104 and the upper clad 107a so that the parts of the lower clad 101, the non-active layer 104 and the upper clad 107a are buried in the lateral clad 110. With this configuration, an optical waveguide of the laser region is constructed in a mesa structure 108.

In addition, the thermal compensation region includes the non-active layer 104 formed in straight line on the lower clad 101 in such a way as to be in parallel to and adjacent to the active layer 102 and the non-active layer 104 of the laser region, the upper clad 107b formed in a convex shape on the non-active layer 104, the lateral clad 110 formed around parts of the lower clad 101, the non-active layer 104 and an upper clad 107b so that parts of the lower clad 101, the non-active layer 104 and an upper clad 107b are buried in the lateral clad 110. With this configuration, an optical waveguide of the thermal compensation region is constructed in a mesa structure 109. Furthermore, the mesa structure 109 is arranged in parallel to and adjacent to the mesa structure 108 of the laser region.

Moreover, the wavelength tunable semiconductor laser device according to this example includes an insulating film 110 which is formed on the surfaces respectively of the lateral clad 110 and the upper clad 107a except for part of the top surface of the upper clad 107a and part of the top surface of the upper clad 107b. As electrodes, an active layer region electrode 112a, a DBR region electrode 112b, a thermal compensation region electrode 112c and a lower electrode 113 are included in the wavelength tunable semiconductor laser device according to this example. The active layer region electrode 112a is formed on the top surface of a portion of the upper clad 107a, the portion constituting the active layer region 103. The DBR region electrode 112b is formed on the top surface of a portion of the upper clad 107a, the portion constituting the DBR region 105. The thermal compensation region electrode 112c is formed on the top surface of a portion of the upper clad 107b, the portion constituting the thermal compensation region. The lower electrode 113 is formed on the bottom surface of the lower clad 101. In addition, the wavelength tunable semiconductor laser device according to this example includes an AR film I14 formed on a side end surface of the non-active layer 104 constituting the DBR region 105.

Specifically, like the wavelength tunable semiconductor laser device according to Example 1, the wavelength tunable semiconductor laser device according to this example includes the mesa structure 109 for thermal compensation, which is formed adjacent to the mesa structure 108 of the laser region. Furthermore, the wavelength tunable semiconductor laser device according to this example is configured so that the mesa structures 108, 109 are high mesa structures, and that the mesa structures 108, 109 are buried in the lateral clad 110. Thus, the wavelength tunable semiconductor laser device according to this example is designed to apply a voltage to, or inject an electric current into, the mesa structure 109 for thermal compensation by use of the above-described control method and controller. Thereby, the wavelength tunable semiconductor laser device according to this example converts most of the applied voltage or the injected electric current to heat, and thus suppresses change in the amount of heat generated in the device. Accordingly, the wavelength tunable semiconductor laser device according to this example always keeps the temperature of the device constant, and thus reduces the wavelength drifts which have been the problem with the conventional type of wavelength tunable semiconductor laser device.

Here, description will be provided for the fabrication method of the wavelength tunable semiconductor laser device according to this example.

(1) First, the active layer 102 is grown on the lower clad 101 which is an n-type InP substrate. Subsequently, all the portion of the active layer 102 except for a portion designated for the active region 103 is removed by sulfuric acid-based wet selective etching.

(2) Thereafter, the non-active layer 104 is grown by butt joint regrowth. Subsequently, the diffraction grating 106 with an alternating series of concaves and convexes as shown in FIG. 22A is formed in a portion of the non-active layer 104, by wet etching. Here, the portion of the non-active layer 104 constitutes the DBR region 105 designated for the distributed reflector.

(3) Afterward, the upper clad layer of p-type InP is regrown with a thickness of 1.5 μm. Subsequently, each of the laser region waveguide and the non-active waveguide for the thermal compensation is processed into the high mesa structure with a height of 3 μm by semiconductor dry etching.

(4) After that, InP insulated by doping ruthenium (Ru) is regrown with a height of 3 μm at the sides of the respective waveguides. Thereby, the waveguides are buried in a shape as shown in FIGS. 22B and 22C.

(5) Thereafter, the insulating film 111 of $SiO_2$ is formed throughout the surface of the device. Subsequently, from the insulating film 111, only a portion corresponding to the top of the mesa structure 108 of the laser region and a portion corresponding to the top of the mesa structure 109 of the thermal compensation region are removed. Thereby, as shown in FIGS. 22B and 22C, the active layer region electrode 112a, the DBR region electrode 112b and the thermal compensation region electrode 112c are formed for energizing the mesa structure 108 of the laser region and the mesa structure 109 of the thermal compensation region.

(6) Thereafter, for the packaging purpose, the substrate is polished so that the resulting thickness is 150 μm. Then, the back electrode 113 is formed. After cleavage, as shown in FIGS. 21 and 22, the AR film I14 is formed on the side end surface of the DBR region 105.

The wavelength tunable semiconductor laser device according to this example has a PIN structure in which the substrate (the lower clad 1) is made of the n-type semiconductor, the active layer 102 and the non-active layer 104 are made of a non-doped semiconductor whose bandgap is smaller than those of the clad layers, and the upper clads 107 is made of the p-type semiconductor. In addition, the wavelength tunable semiconductor laser device according to this example has a shape in which the sides of the waveguides are embedded by the lateral clad 110 doped with ruthenium.

Furthermore, the active region 103 and the DBR region 105 are each constructed with a length of 400 μm.

Moreover, the amounts of wavelength drifts were observed with the following setup. The wavelength tunable semiconductor laser device according to this example was mounted on the wavelength tunable laser controller 21 shown in FIG. 9. $I_1$, $I_2$ and $I_8$ of the electric current controlling circuit 23 were respectively connected to the active region electrode 112a, the DBR region electrode 112b and the thermal compensation region electrode 112c. The wavelengths were switched in accordance with the flowchart shown in FIG. 3 by use of the same method as Example 1. As a result, the wavelength drifts were suppressed within 1 GHz to achieve the desirable characteristic which was free from the wavelength drifts due to the heat. This example employs the 2-section DBR laser structure, however, it goes without saying that the wavelength tunable semiconductor laser device according to this example can be realized by use of the multiple-electrode type of DBR laser as shown in FIG. 13.

EXAMPLE 6

Figure 23:
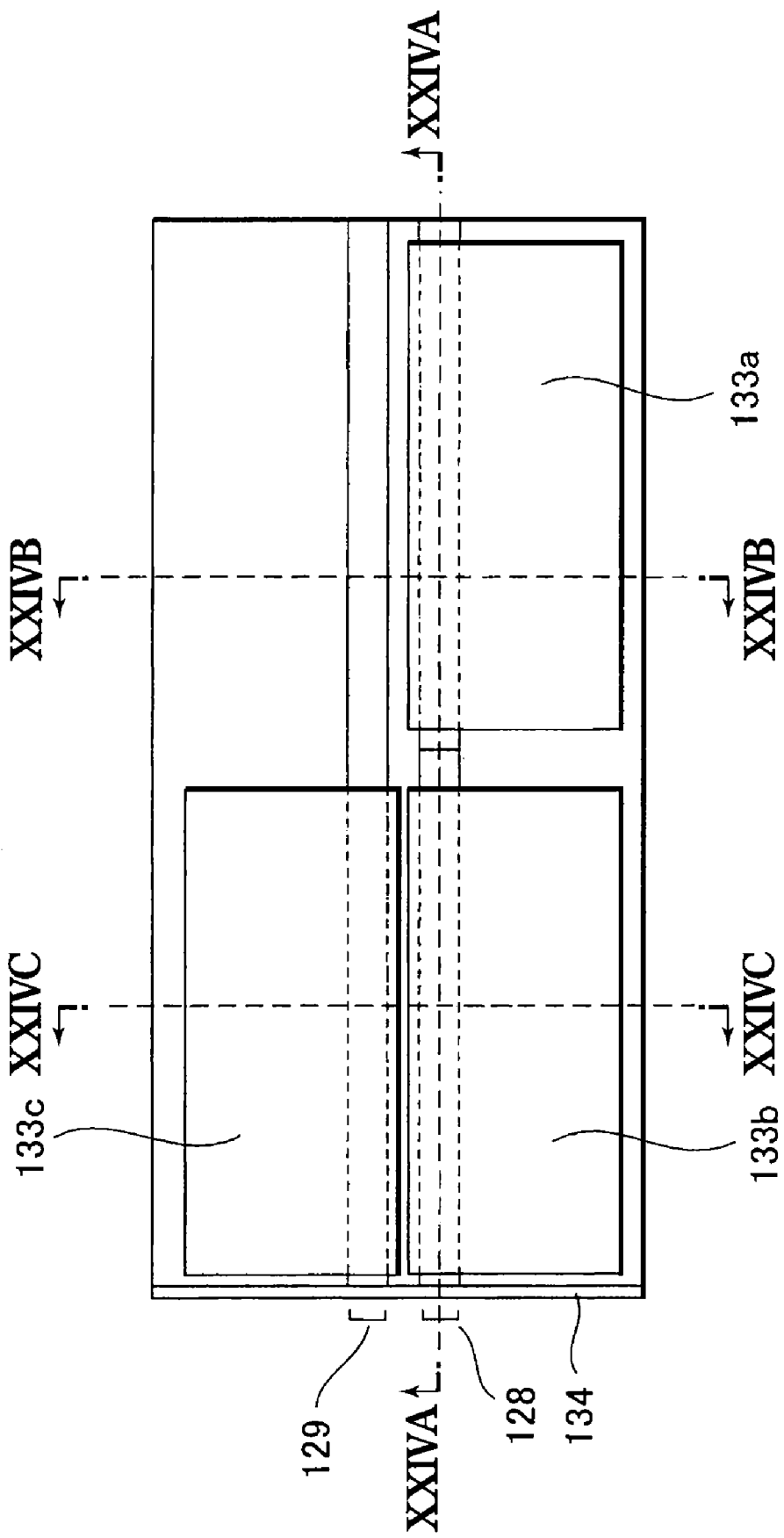
FIG. 23 is a top view showing yet another example of the wavelength tunable semiconductor laser device according to the present invention.
Figure 24A:
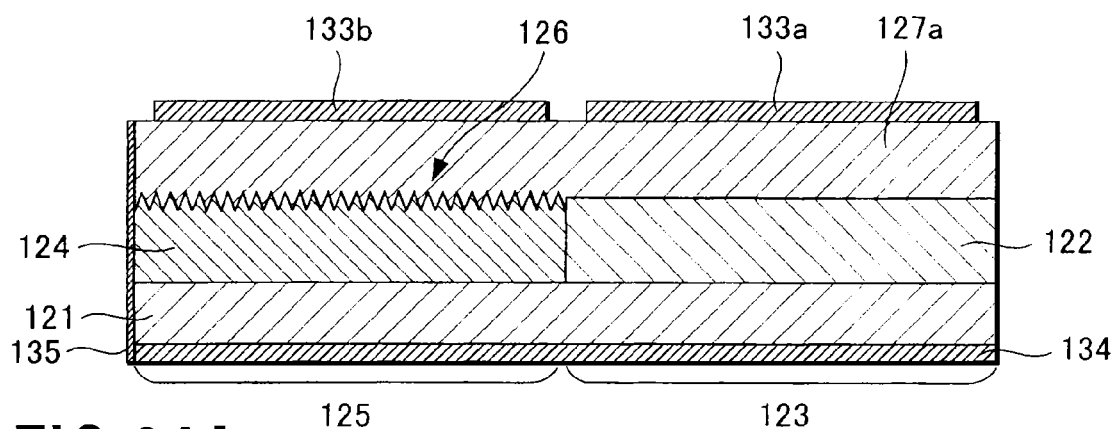
FIG. 24A is a cross-sectional view of the conventional wavelength tunable semiconductor laser device of FIG. 23 taken along the XXIVA-XXIVA line.
Figure 24B:
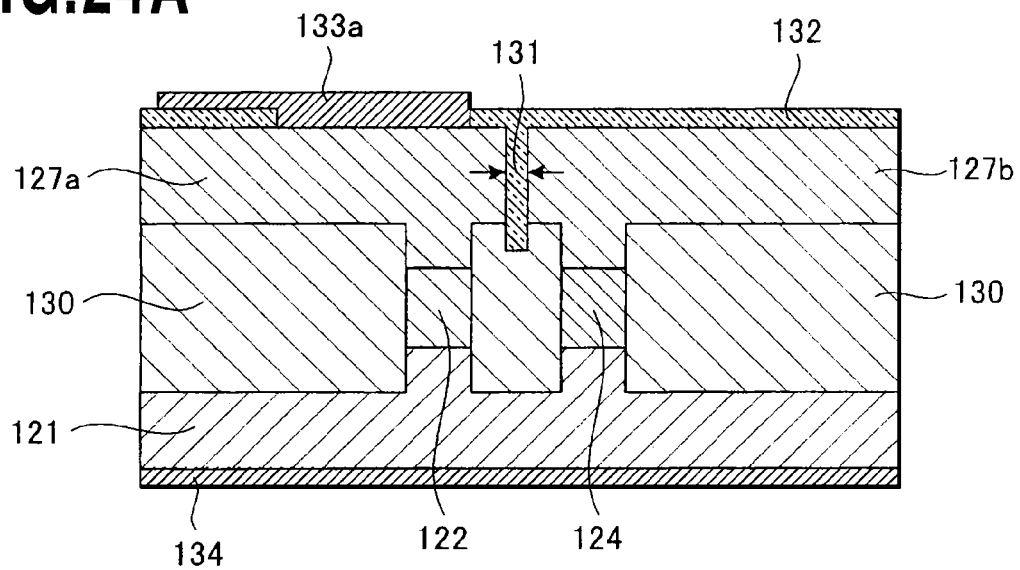
FIG. 24B is a cross-sectional view of the wavelength tunable semiconductor laser device of FIG. 23 taken along the XXIVB-XXIVB line.
Figure 24C:
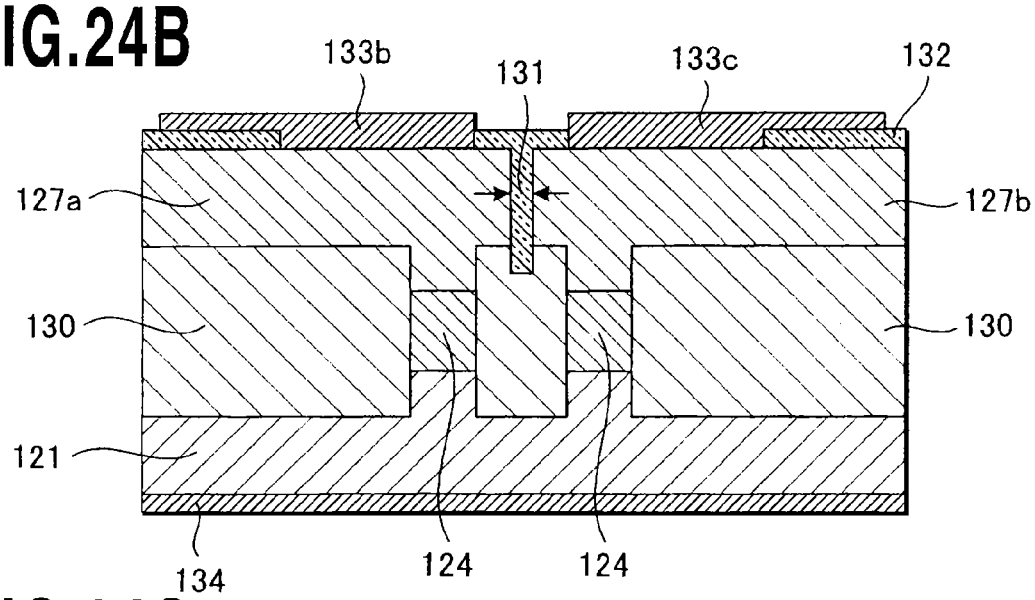
FIG. 24C is a cross-sectional view of the wavelength tunable semiconductor laser device of FIG. 23 taken along the XXIVC-XXIVC line.

FIGS. 23, 24A, 24B and 24C show another example of the embodiment of the wavelength tunable semiconductor laser device according to the present invention. FIG. 23 shows the top view, and FIGS. 24A, 24B and 24C show a cross-sectional view of FIG. 23 along the XXIVA-XXIVA line, a cross-sectional view of FIG. 23 along the XXIVB-XXIVB line, and a cross-sectional view of FIG. 23 along the XXIVC-XXIVC line.

As shown in FIGS. 23, 24A, 24B and 24C, the wavelength tunable semiconductor laser device according to this example includes a laser region and a thermal compensation region as well. The laser region includes an active region 123 and a DBR region 125 connected to the active region 123 in series. The active region 123 includes an active layer 122 formed in straight line on a substrate constituting a lower clad 121, a lateral clad 130 in which part of the lower clad 121 and the active layer 122 are buried, and which is formed around the parts of the lower clad 121 and the active layer 122 in such a way as to be higher than the top surface of the active layer 122, and an upper clad 127a formed on top of the active layer 122 and the lateral clad 130. The DBR region 125 includes a non-active layer 124 formed on the lower clad 121 so that the non-active layer 124 and the active layer 122 are arranged in a straight line, a diffraction grating 126 formed on the top surface of the non-active layer 124, the lateral clad 130 in which part of the lower clad 121 and the non-active layer 124 are buried, and which is formed around the part of the lower clad 121 and the non-active layer 124 in such a way as to be higher than the top surface of the non-active layer 124, and the upper clad 127a formed on the active layer 124 and the lateral clad 130. With this configuration, an optical waveguide of the laser region is constructed in a mesa structure 128.

The thermal compensation region includes the non-active layer 124 formed in straight line on the lower clad 121 in such a way as to be in parallel to and adjacent to the active layer 122 and the non-active layer 124 of the laser region, and the lateral clad 130 in which part of the lower clad 121 and the non-active layer 124 are buried, and which is formed around the part of the lower clad 121 and the non-active layer 124 in such a way as to be higher than the top surface of the non-active layer 124, and an upper clad 127b formed on the non-active layer 124 and the lateral clad 130. With this configuration, an optical waveguide of the thermal compensation region is constructed in a mesa structure 129. The mesa structure 129 of the thermal compensation region is arranged in parallel to and adjacent to the mesa structure 128 of the laser region. Note that the upper clad 127a and the upper clad 127b are electrically insulated from each other by a separation groove 131 and an insulating film 132. The separation groove 131 is formed on an upper portion of the lateral clad 130 arranged between the laser region and the thermal compensation region. The insulating film 132 will be described later.

In addition, the wavelength tunable semiconductor laser device according to this example includes the insulating film 132 which is formed on the upper clad 127a and the upper clad 127b except for part of the upper clad 127a and part of the upper clad 127b. As electrodes, an active region electrode 133a, a DBR region electrode 133b, a thermal compensation region electrode 133c and a lower electrode 134 are included in the wavelength tunable semiconductor laser device according to this example. The active region electrode 133a is formed on the top surface of a portion of the upper clad 127a, the portion constituting the active region 123. The DBR region electrode 133b is formed on the top surface of a portion of the upper clad 127a, the portion constituting the DBR region 125. The thermal compensation region electrode 133c is formed on the top surface of a portion of the upper clad 127b, the portion constituting the compensation region. The lower electrode 134 is formed on the bottom surface of the lower clad 121. Furthermore, the wavelength tunable semiconductor laser device according to this example includes an AR film 135 which is formed on a side end surface of the non-active layer 124 constituting the DBR region 125.

Specifically, like the wavelength tunable semiconductor laser device according to Example 1, the wavelength tunable semiconductor laser device according to this example includes the mesa structure 129 for thermal compensation which is formed adjacent to the mesa structure 128 of the laser region. However, the wavelength tunable semiconductor laser device according to this example has a configuration in which the mesa structure 128, 129 are low mesa structures, the vicinities of the mesa structures 128, 129 are embedded in the lateral clad 130, and the top portions of the mesa structures 128, 129 are embedded in the upper clads 127a, 127b. Then, the wavelength tunable semiconductor laser device according to this example is designed to apply a voltage to or inject an electric current into the mesa structure 129 for thermal compensation by use of the above-described control method and controller. Thereby, the wavelength tunable semiconductor laser device according to this example converts most of the applied voltage or the injected electric current to heat, and thus suppresses change in the amount of heat generated in the device. Accordingly, the wavelength tunable semiconductor laser device according to this example always keeps the temperature of the device constant, and thus reduces the wavelength drifts which have been the problem with the conventional type of wavelength tunable semiconductor laser device.

Here, description will be provided for fabrication method of the wavelength tunable semiconductor laser device according to this example.

(1) First, the active layer 122 is grown on the lower clad 121 which is an n-type InP substrate. Subsequently, all the portion of the active layer 122 except for a portion designated for the active region 123 is removed by sulfuric acid-based wet selective etching.

(2) Thereafter, the non-active layer 124 is grown by butt joint regrowth. Subsequently, the diffraction grating 106 with an alternate series of concaves and convexes as shown in FIG. 24A is formed in a portion of the non-active layer 124, by wet etching. Here, the portion of the non-active layer 124 constitutes the DBR region 125 designated for the distributed reflector.

(3) Afterward, the upper clad layer of p-type InP is regrown with a thickness of 0.1 μm. Subsequently, each of the laser region waveguide and the non-active waveguide for the thermal compensation is processed into the low mesa structure with a height of 1.5 μm by semiconductor dry etching.
(4) Then, InP insulated by doping ruthenium (Ru) is regrown with a height of 3 μm at the sides of the respective waveguides. Subsequently, the upper clad layer having a thickness of 2 μm is grown with p-type InP. Thereby, the waveguides are buried in the upper clad layer.
(5) Thereafter, as shown in FIGS. 24B and 24C, the separation groove 131 for an electric-current separation is formed by dry etching. This separation groove 131 is for preventing an electric current leak between the DBR region 125 and the thermal compensation region. The upper clad layer is etched until the separation groove 131 reaches the ruthenium-doped insulating layer (the lateral clad 130) formed between the core layer of the DBR region 125 and the core layer of the thermal compensation region.
(6) Afterward, the insulating film 132 of $SiO_2$ is formed throughout the surface of the device. Subsequently, only a 20 μm-wide portion corresponding to the top and its vicinity of the mesa structure 128 of the laser region and a 20 μm-wide portion corresponding to the top and its vicinity of the mesa structure 129 of the thermal compensation region are removed from the insulating film 132. Then, as shown in FIGS. 24B and 24C, the active layer region electrode 133a, the DBR region electrode 133b and the thermal compensation region electrode 133c are formed for energizing the mesa structure 128 of the laser region and the mesa structure 129 of the thermal compensation region.
(7) Thereafter, for the packaging purpose, the substrate is polished so that the resulting thickness is 150 μm. Then, the back electrode 134 is formed. After cleavage, as shown in FIGS. 23 and 24A, the AR film 135 is formed on the side end surface of the DBR region 125.

The wavelength tunable semiconductor laser device according to this example is also has a PIN structure in which the substrate (the lower clad 1) is made of the n-type semiconductor, the active layer 122 and the non-active layer 124 are made of a non-doped semiconductor whose bandgap is smaller than those of the clad layers, and the upper clads 127a, 127b are made of the p-type semiconductor. In addition, the wavelength tunable semiconductor laser device according to this example has the shape in which the sides of the waveguides are embedded by the lateral clad 130 which is semi-insulating as a result of doping ruthenium. Furthermore, the active region 123 and the DBR region 125 are each constructed with a length of 400 μm.

Moreover, the amounts of wavelength drifts were observed with the following setup. The wavelength tunable semiconductor laser device according to this example was mounted on the wavelength tunable laser controller 21 shown in FIG. 9. $I_1$, $I_2$ and $I_8$ of the electric current controlling circuit 23 were respectively connected to the active region electrode 133a, the DBR region electrode 133b and the thermal compensation region electrode 133c. The wavelengths were switched in accordance with the flowchart shown in FIG. 3 by use of the same method as Example 1. As a result, the wavelength drifts were suppressed within 1 GHz to achieve the desirable characteristic which was free from the wavelength drifts due to the heat. This example employs the 2-section DBR laser structure as well. However, it goes without saying that the wavelength tunable semiconductor laser device according to this example can be realized by use of the multiple-electrode type of DBR laser as shown in FIG. 13.

EXAMPLE 7

Figure 25:
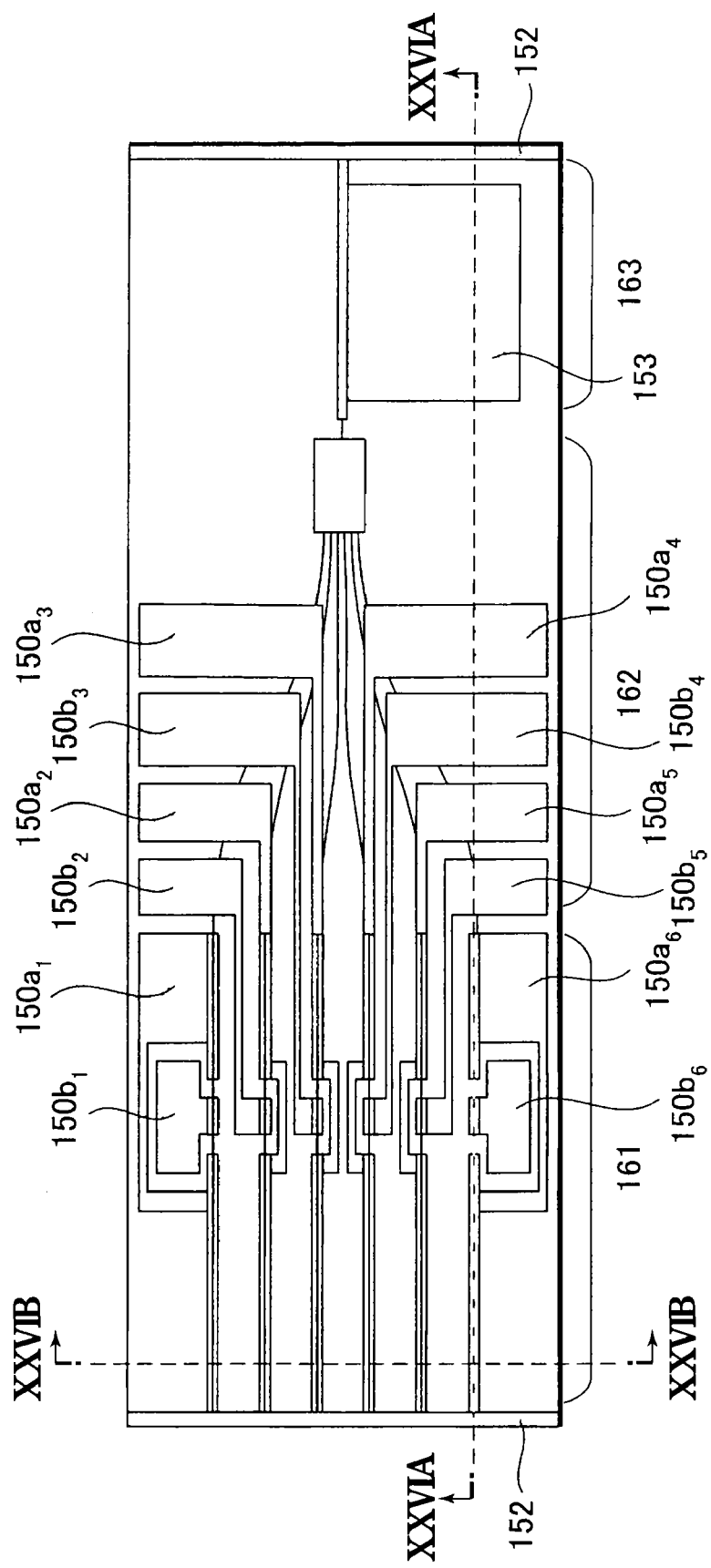
FIG. 25 is a top view showing yet another example of the wavelength tunable semiconductor laser device according to the present invention.
Figure 26A:
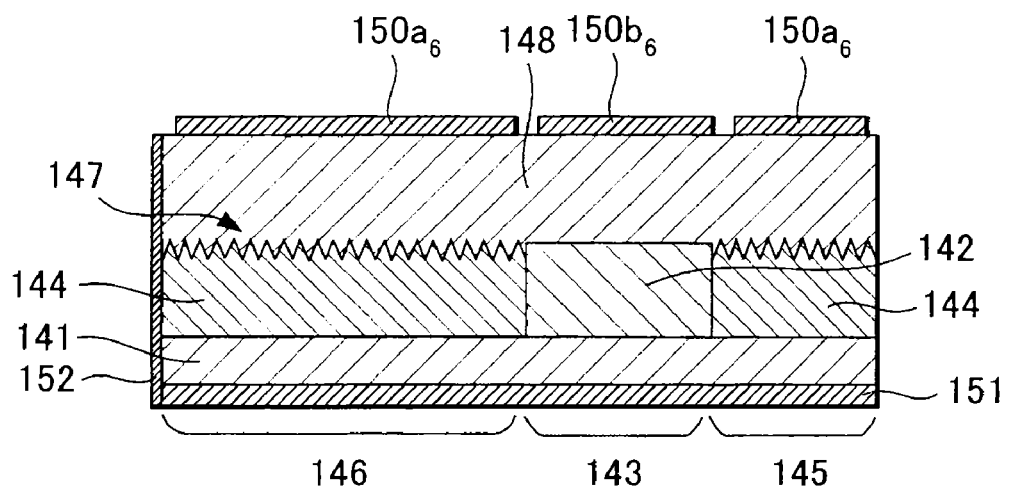
FIG. 26A is a cross-sectional view of the wavelength tunable semiconductor laser device of FIG. 25 taken along the XXVIA-XXVIA line.
Figure 26B:
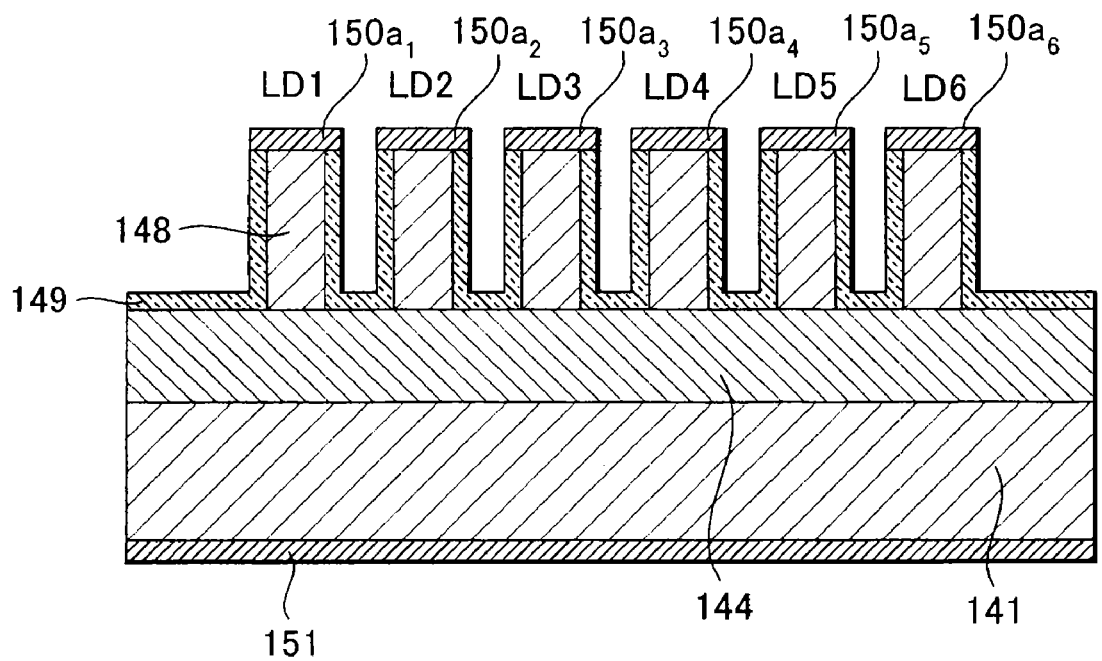
FIG. 26B is a cross-sectional view of the wavelength tunable semiconductor laser device of FIG. 25 taken along the XXVIB-XXVIB line.
Figure 27:
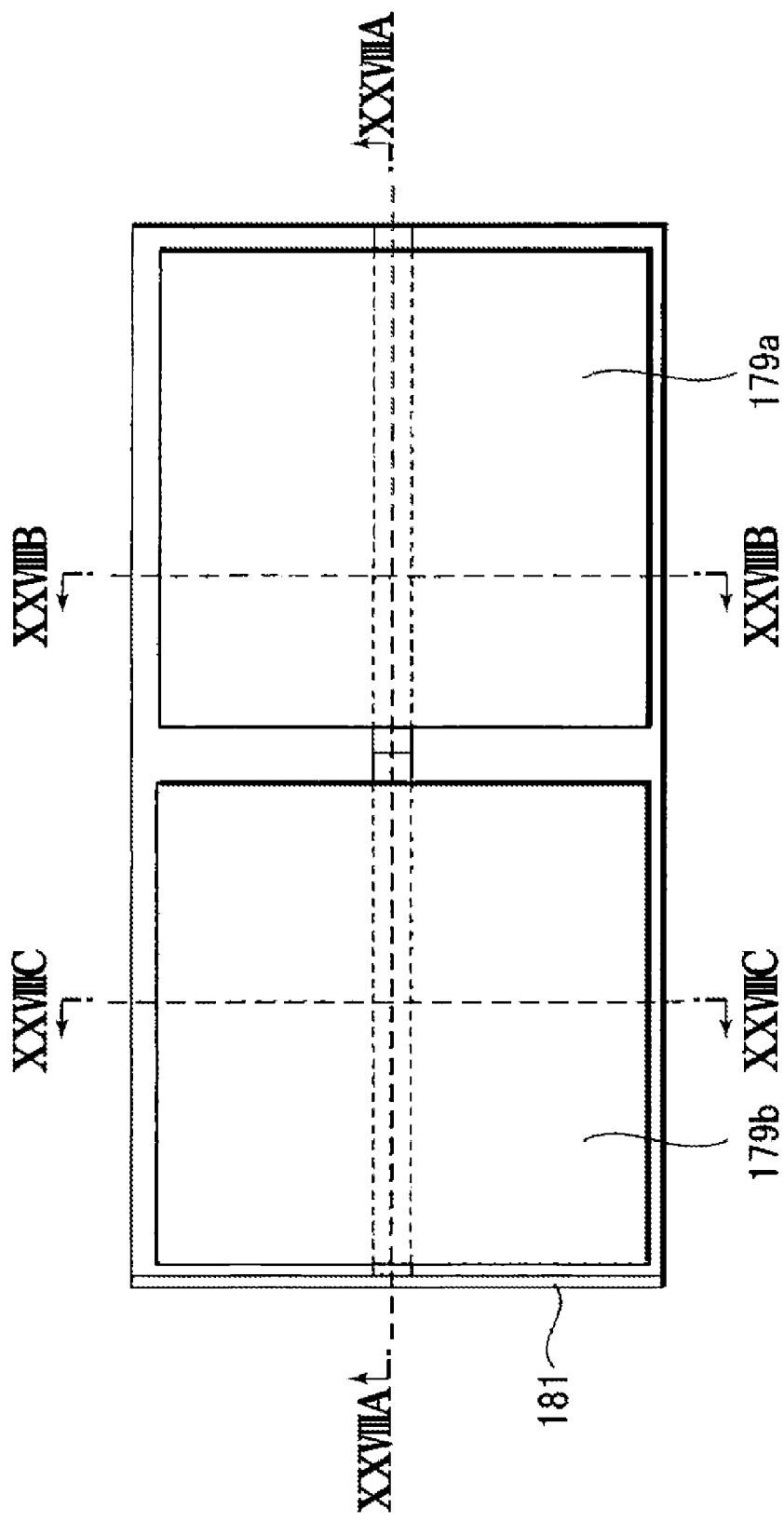
FIG. 27 is a top view showing a conventional type of wavelength tunable semiconductor laser device.
Figure 28A:
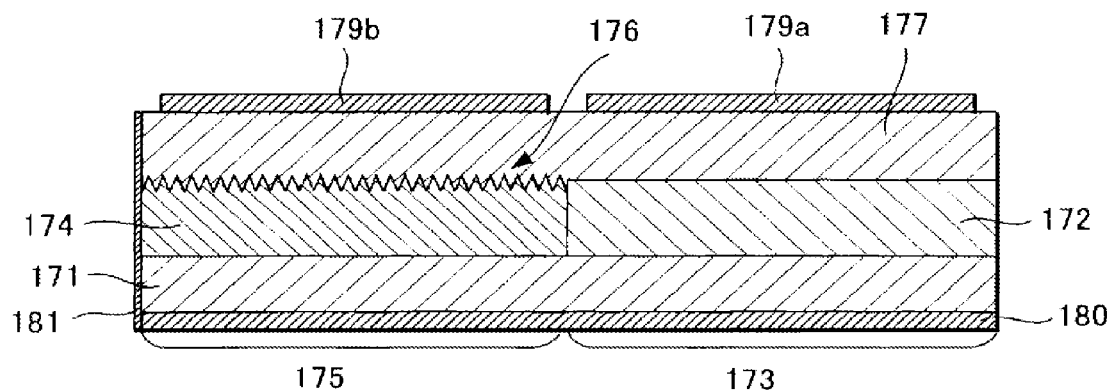
FIG. 28A is a cross-sectional view of the conventional wavelength tunable semiconductor laser device of FIG. 27 taken along the XXVIIIA-XXVIIIA line.
Figure 28B:
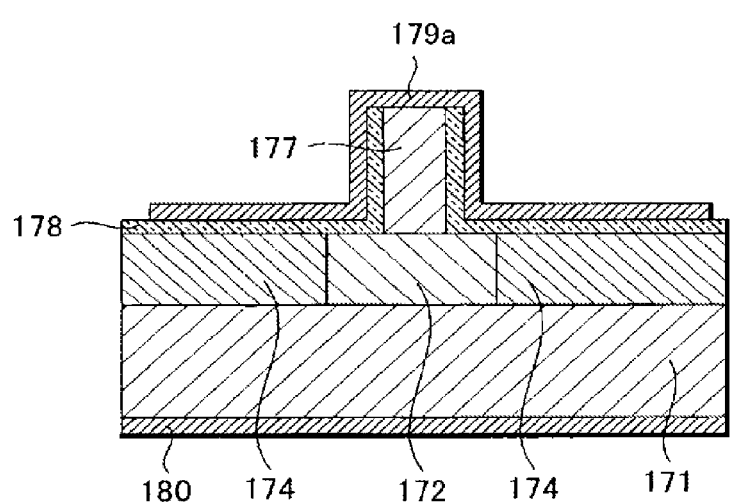
FIG. 28B is a cross-sectional view of the conventional wavelength tunable semiconductor laser device taken along the XVIIIB-XVIIIB line.
Figure 28C:
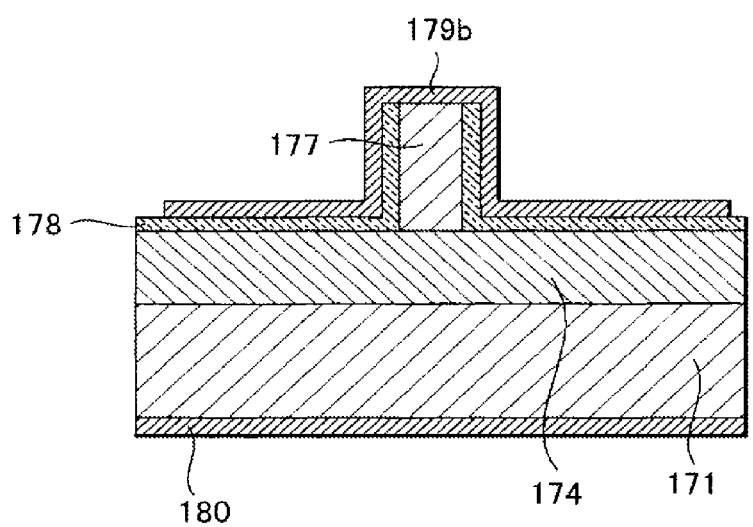
FIG. 28C is a cross-sectional view of the conventional wavelength tunable semiconductor laser device taken along the XVIIIC-XVIIIC line.
Figure 29:
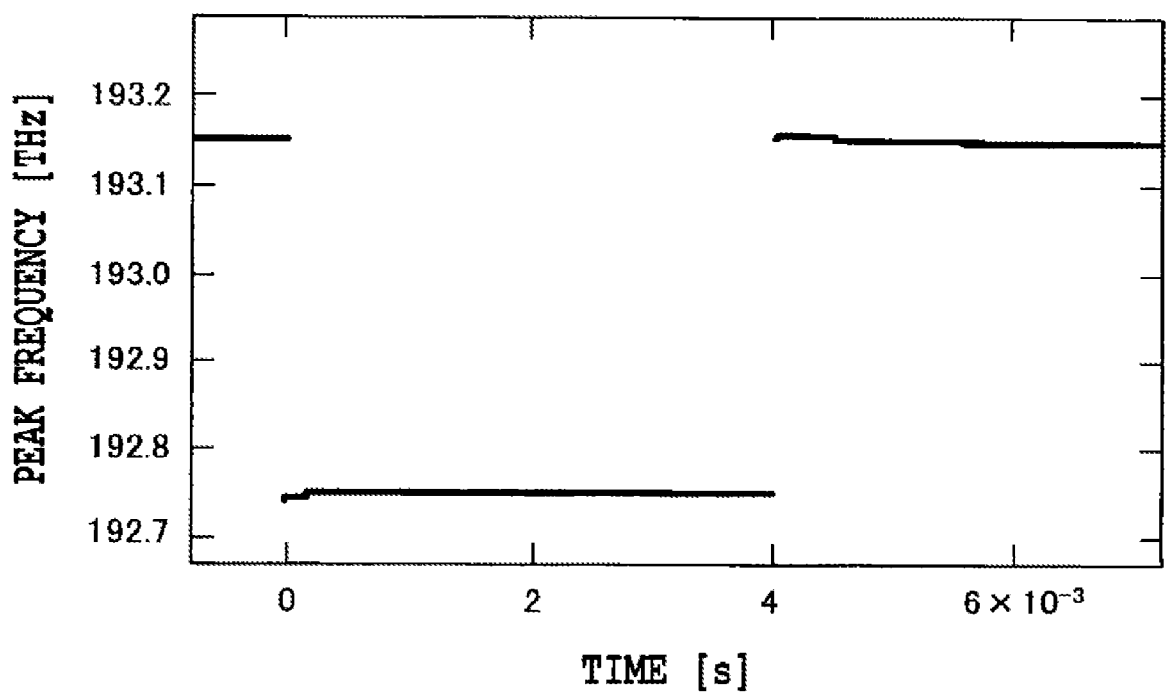
FIG. 29 is a graph showing a wavelength switching operation carried out by the conventional wavelength tunable semiconductor laser device shown in FIG. 27.

FIGS. 25, 26A and 26B show another example of the embodiment of the wavelength tunable semiconductor laser device according to the present invention. FIG. 25 shows the top view, and FIGS. 26A and 26B show a cross-sectional view of FIG. 25 along the XXVIA-XXVIA line and a cross-sectional view of FIG. 25 along the XXVIB-XXVIB line.

As shown in FIG. 25, the wavelength tunable semiconductor laser device according to this example includes a 6-channel DBR laser array 161, an optical coupler 162 and an SOA region 163 in this order from the left of FIG. 25. The 6-channel DBR laser array 161 includes 6 DBR lasers with different lasing wavelengths. The optical coupler 162 is for coupling light outputted from these 6 DBR lasers into a single beam of light. The SOA region 163 is for adjusting the strength of an outputted light at the end stage.

First, description will be provided for the basic structure of the DBR lasers which are integrated into the 6-channel DBR laser array 161.

As shown in FIG. 26A, each DBR laser is configured by a front DBR region 145, an active region 143 and a rear DBR region 146 in this order from the right of FIG. 26A. These regions are connected one after another in series. The active region 143 includes an active layer 192 formed in straight line on a substrate constituting a lower clad 141, and an upper clad 148 formed in a convex shape on the active layer 142. Each of the front DBR region 145 and the rear DBR region 146 includes a non-active layer 144 formed on the lower clad 141, a diffraction grating 147 formed on the top surface of a portion of the non-active layer 144, the portion and the active layer 142 being arranged in a straight line, and the upper clad 148 formed in a convex shape on the diffraction grating 147. The diffraction gratings 147 formed in the front DBR region 145 and the rear DBR region 146 are the same. With this configuration, the optical waveguide of each DBR laser is constructed in a mesa structure.

Each DBR laser includes an insulating film 149 which is formed on the surfaces of the active layer 142, the non-active layer 144 and the upper clad 148 except for the top surface of the upper clad 148. As electrodes, a DBR region electrode 150a, an active region electrode 150b and a lower electrode 151 are included in each DBR laser. The DBR region electrode 150a is formed on the top surface of a portion of the upper clad 148, the portion constituting the front DBR region 145 and the rear DBR region 146. The active region electrode 150b is formed on the top surface of a portion of the upper clad 148, the portion constituting the active region 143. The lower electrode 151 is formed on the bottom surface of the lower clad 141. Note that each DBR laser has a structure in which, once an electric current is injected into the DBR region electrode 150a, an electric current with the same current density flows in each of the front DBR region 145 and the rear DBR region 146 because, as shown in FIG. 25, the front DBR region 145 and the rear DBR region 146 are electrically connected by the same electrode (the DBR region electrodes 150a) formed on the surface of the device.

In addition, each DBR laser includes an AR film 152 which is formed on a side end surface of the non-active layer 144 constituting the rear DBR region 146.

While each laser is driven, the laser is capable of oscillating a laser beam when an electric current is injected into the active region 143, and is capable of shifting the lasing wavelength when an electric current is injected into each of the front DBR region 145 and the rear DBR region 146. The wavelength tunable width of each of the 6 DBR lasers thus integrated is 6 nm, and the lasing wavelengths of the respective 6 DBR lasers are different from one another by 6 nm each. Consequently, the wavelength tunable semiconductor laser device according to this example is capable of outputting a desired wavelength within a range of 36 nm in total (6 DBR lasers×6 nm for each DBR laser=36 nm) by, first, selecting a DBR laser with a desired waveband out of the 6 DBR lasers to drive the DBR laser by injecting an electric current into its active region 193, and then changing the electric current injected into each of the front DBR region 145 and the rear DBR region 146 of the selected DBR laser.

As shown in FIG. 26B, the integrated 6 DBR lasers are arranged in parallel to and adjacent to one another. The wavelength tunable semiconductor laser device according to this example is fabricated so that the distance between each neighboring two of the integrated 6 DBR lasers is 20 μm. The fabrication method is the same as the one in Example 1, however, the period which an alternate series of concaves and convexes are formed in the diffraction grating 147 is different from one DBR laser to another. Furthermore, the wavelength tunable semiconductor laser device according to this example does not comprise any thermal compensation region used exclusively for thermal compensation, and the front DBR region 145 and the rear DBR region 146 of other DBR regions which are not driven are used as thermal compensation regions.

Here, description will be provided for an example of how to drive the wavelength tunable semiconductor laser device according to this example.

The wavelength tunable semiconductor laser device according to this example is mounted on the wavelength tunable laser controller 21 shown in FIG. 9. In the electric current controlling circuit 23, $I_1$ is connected to an SOA region electrode 153, $I_2$ is connected to an LD4 wavelength tuning region electrode 150$a_4$, $I_3$ is connected to an LD4 active region electrode 150$b_4$, $I_4$ is connected to an LD5 wavelength tuning region electrode 150$a_5$, $I_5$ is connected to an LD5 active region electrode 150$b_5$, $I_6$ is connected to an LD6 wavelength tuning region electrode 150$a_6$, $I_7$ is connected to an LD6 active region electrode 150$b_6$, $I_{14}$ is connected to an LD3 wavelength tuning region electrode 150$a_3$, $I_{13}$ is connected to an LD3 active region electrode 150$b_3$, $I_{12}$ is connected to an LD2 wavelength tuning region electrode 150$a_2$, $I_{11}$ is connected to an LD2 active region electrode 150$b_2$, $I_{10}$ is connected to an LD1 wavelength tuning region electrode 150$a_1$, and $I_9$ is connected to an LD1 active region electrode 150$b_1$. In addition, the DBR laser LD1 covers a wavelength of 1530 nm to 1536 nm, the DBR laser LD2 covers a wavelength of 1536 nm to 1542 nm, the DBR laser LD3 covers a wavelength of 1542 nm to 1548 nm, the DBR laser LD4 covers a wavelength of 1548 nm to 1554 nm, the DBR laser LD5 covers a wavelength of 1556 nm to 1560 nm, and the DBR laser LD6 covers a wavelength of 1560 nm to 1566 nm. Consequently, the wavelength tunable semiconductor laser device according to this example is capable of outputting a desired wavelength within the 36 nm in total.

I-V characteristics were measured for the DBR regions (the front DBR region 145 and the rear DBR region 146) of the DBR lasers LD1 to LD6, respectively. On the basis of the I-V measurements, I-P characteristic fitting curves were obtained as expressed in Equations 12 to 17.

$$P_{DBR1}=0.0048 I_{DBR1}^2+0.845 I_{DBR1}-0.383 \quad \text{Equation 12}$$

$$P_{DBR2}=0.0049 I_{DBR2}^2+0.838 I_{DBR2}-0.357 \quad \text{Equation 13}$$

$$P_{DBR3}=0.005 I_{DBR3}^2+0.83 I_{DBR3}-0.3556 \quad \text{Equation 14}$$

$$P_{DBR4}=0.0049 I_{DBR4}^2+0.843 I_{DBR4}-0.365 \quad \text{Equation 15}$$

$$P_{DBR5}=0.0048 I_{DBR5}^2+0.839 I_{DBR5}-0.376 \quad \text{Equation 16}$$

$$P_{DBR6}=0.0047 I_{DBR6}^2+0.842 I_{DBR6}-0.368 \quad \text{Equation 17}$$

$$P_{TOTAL}=P_{DBR1}+P_{DBR2}+P_{DBR3}+P_{DBR4}+P_{DBR5}+P_{DBR6}=70 \quad \text{Equation 18}$$

The total sum $P_{TOTAL}$ of electric powers inputted into the DBR regions of the DBR lasers LD1 to LD6 is set at, for instance, 70 mW as shown in Equation 18. When a laser beam with a wavelength of 1546 nm is outputted, light is emitted by injecting an electric current into the active region 143 of the DBR laser LD3 and injecting an electric current $I_{DBR3}=5.6$ mA into the DBR region of the DBR laser LD3. When a laser beam with a wavelength of 1556 nm is outputted, light is emitted by injecting an electric current into the active region 143 of the DBR laser LD5 and injecting an electric current $I_{DBR5}=22.3$ mA into the DBR region of the DBR laser LD5. The wavelength tunable semiconductor laser device carries out the thermal compensation by injecting no electric current into the active regions 143 of the LDs which emit no light, while injecting electric currents into the DBR regions of the LDs which emit no light.

Let us find, for instance, a condition for driving the DBR region of the DBR laser LD3 with $I_{DBR3}=5.6$ mA in order for a laser beam with a wavelength of 1546 nm to be outputted. Substituting $I_{DBR3}=5.6$ mA into Equation 14, $P_{DBR3}=4.45$ mW is given. Electric powers inputted into the DBR regions of the DBR lasers LD1, LD2, LD4, LD5, LD6 which emit no light are set equal to one another by equally distributing the remaining electric power. In this case, an electric power inputted into the DBR region of each DBR laser LD is 13.11 mW. This value is substituted into Equation 12, Equation 13, Equation 15, Equation 16 and Equation 17 to solve the quadric equations. Out of the two solutions, a positive one is selected for each quadric equation. Thus, $I_{DBR1}=14.7$ mA, $I_{DBR2}=14.8$ mA, $I_{DBR4}=14.7$ mA, $I_{DBR5}=14.8$ mA and $I_{DBR6}=14.8$ mA are given.

Further, let us find a condition for driving the DBR region of the DBR laser LD5 with $I_{DBR5}=22.3$ mA in order for a laser beam with a wavelength of 1556 nm to be outputted. Similarly, as electric currents injected into the DBR regions of the other LDs, $I_{DBR1}=11.3$ mA, $I_{DBR2}=11.4$ mA, $I_{DBR3}=11.4$ mA, $I_{DBR4}=11.4$ mA and $I_{DBR6}=11.4$ mA are given.

The wavelength was switched from the lasing wavelength 1546 nm (LD3: $I_{DBR3}=5.6$ mA) to the lasing wavelength 1556 nm (LD5: $I_{DBR5}=22.3$ mA) by use of the above-described driving conditions. Concurrently, the total sum of the electric powers inputted into the DBR regions of the 6-channel DBR laser array 161 was always kept constant (for instance, at 70 mW). As a result, for thermal compensation, the wavelength tunable semiconductor laser device according to this example injected the electric currents into (or applied the voltages to) the DBR regions of the DBR lasers other than LDs which emitted light. Thereby, the wavelength tunable semiconductor laser device according to this example converted most of the injected electric currents (or the applied voltages) to heat to suppress the change in the amount of heat generated in the device. Accordingly, the wavelength tunable semiconductor laser device according to this example was capable of always keeping the temperature of the device constant, and was thus capable of reducing the wavelength drifts. In this case, too, the wavelength tunable semiconductor laser device was capable of offering a desirable result in which the amounts of wavelength drifts were within 1 GHz when the wavelengths were switched.

INDUSTRIAL APPLICABILITY

The present invention is suitable for being applied to the wavelength tunable semiconductor laser device using a plasma effect, such as the DBR laser.

The invention claimed is:

1. A wavelength tunable semiconductor laser device, comprising:
   an active region for oscillating a laser beam; and
   a wavelength tuning region for shifting a wavelength of the laser beam, wherein a thermal compensation region is provided adjacent to the wavelength tuning region, the thermal compensation region receiving an input of an electric power and converting most of the inputted electric power to heat, the sum of the electric power inputted into the thermal compensation region and an electric power inputted into the wavelength tuning region being always kept constant,
   wherein the thermal compensation region is comprised of a non-active waveguide having a first single mesa structure,
   wherein most of the inputted electric power is converted to heat by injecting an electric current into the non-active waveguide or applying a voltage to the non-active waveguide,
   wherein the active region and the wavelength tuning region are comprised of a waveguide having a second single mesa structure other than the first single mesa structure, and
   wherein the distance between the first single mesa structure and the second single mesa structure is greater than or equal to 3 μm and less than or equal to the thickness of a substrate of the wavelength tunable semiconductor laser device.

2. The wavelength tunable semiconductor laser device according to claim 1, further comprising a semiconductor insulating film insulated by doping ruthenium formed on two side surfaces of the first single mesa structure.

3. The wavelength tunable semiconductor laser device according to claim 1, further comprising a semiconductor insulating layer insulated by doping ruthenium formed on two side surfaces of the second single mesa structure.

4. The wavelength tunable semiconductor laser device according to claim 1, wherein each wavelength tuning region is partially or entirely configured by a non-active waveguide in which a distributed reflector-type diffraction grating is formed or by a non-active waveguide serving as the phase control region.

5. A wavelength tunable semiconductor laser device, comprising:
   an active region for oscillating a laser beam; and
   a plurality of wavelength tuning regions each for shifting a wavelength of the laser beam, wherein a thermal compensation region corresponding to each of the plurality of wavelength tuning regions is provided adjacent to the wavelength tuning region, the thermal compensation region receiving an input of an electric power and converting most of the inputted electric power to heat, the sum of the electric power inputted into the compensation region and an electric power inputted into the wavelength tuning region being always kept constant,
   wherein the thermal compensation regions are comprised of a non-active waveguide having a first single mesa structure,
   wherein most of the inputted electric power is converted to heat by injecting an electric current into the non-active waveguide or applying a voltage to the non-active waveguide,
   wherein the active re ion and the plurality of wavelength tuning regions are comprised of a waveguide having a second single mesa structure other than the first single mesa structure, and
   wherein the distance between the first single mesa structure and the second single mesa structure is greater than or equal to 3 μm and less than or equal to the thickness of a substrate of the wavelength tunable semiconductor laser device.

6. The wavelength tunable semiconductor laser device according to claim 5, further comprising a semiconductor insulating film insulated by doping ruthenium formed on two side surfaces of the first single mesa structure.

7. The wavelength tunable semiconductor laser device according to claim 5, further comprising a semiconductor insulating layer insulated by doping ruthenium formed on two side surfaces of the second single mesa structure.

8. The wavelength tunable semiconductor laser device according to claim 5, wherein each wavelength tuning region is partially or entirely configured by a non-active waveguide in which a distributed reflector-type diffraction grating is formed or by a non-active waveguide serving as the phase control region.

9. A wavelength tunable semiconductor laser device, comprising:
   an active region for oscillating a laser beam;
   a first wavelength tuning region for shifting a wavelength of the laser beam;
   a second wavelength tuning region for shifting a wavelength of the laser beam; and
   a phase control region for adjusting a phase of the laser beam, wherein a first thermal compensation region is provided adjacent to the first wavelength tuning region, the first thermal compensation region receiving an input of an electric power and converting most of the inputted electric power to heat, the sum of the electric power inputted into the first thermal compensation region and an electric power inputted into the first wavelength tuning region being always kept constant, wherein a second thermal compensation region is provided adjacent to the second wavelength tuning region, the second thermal compensation region receiving an input of an electric power and converting most of the inputted electric power to heat, the sum of the electric power inputted into the second thermal compensation region and an electric power inputted into the second wavelength tuning region being always kept constant, and wherein a third thermal compensation region is provided adjacent to the phase control region, the third thermal compensation region receiving an input of an electric power and converting most of the inputted electric power to heat, the sum of the electric power inputted into the third thermal compensation region and an electric power inputted into the phase control region being always kept constant,
   wherein the thermal compensation regions are comprised of a non-active waveguide having a first single mesa structure,
   wherein most of the inputted electric power is converted to heat by injecting an electric current into the non-active waveguide or applying a voltage to the non-active waveguide,
   wherein the active region the first and second wavelength tuning regions and the phase control region are comprised of a waveguide having a second single mesa structure other than the first single mesa structure, and
   wherein the distance between the first single mesa structure and the second single mesa structure is greater than or equal to 3 μm and less than or equal to the thickness of a substrate of the wavelength tunable semiconductor laser device.

10. The wavelength tunable semiconductor laser device according to claim 9, further comprising a semiconductor insulating film insulated by doping ruthenium formed on two side surfaces of the first single mesa structure.

11. The wavelength tunable semiconductor laser device according to claim 9, further comprising a semiconductor insulating layer insulated by doping ruthenium formed on two side surfaces of the second single mesa structure.

12. The wavelength tunable semiconductor laser device according to claim 9, wherein each wavelength tuning region is partially or entirely configured by a non-active waveguide in which a distributed reflector-type diffraction grating is formed or by a non-active waveguide serving as the phase control region.

13. A wavelength tunable semiconductor laser device, comprising:
   a plurality of laser regions each having an active region for oscillating a laser beam and a wavelength tuning region for shifting a wavelength of the laser beam; and
   an optical coupler optically connected to the plurality of laser regions to provide optical coupling among the plurality of laser regions, wherein the plurality of laser regions are arranged in parallel to and adjacent to each other, and wherein a total sum of electric powers inputted into the wavelength tuning regions of the plurality of laser regions is always kept constant,
   wherein each laser region has a single mesa structure;
   wherein the wavelength tuning region of the laser region that is not driven is used as a thermal compensation region;
   wherein most of the inputted electric power is converted to heat by injecting an electric current into the thermal compensation region or applying a voltage to the thermal compensation region;
   wherein the distance between the single mesa structures is greater than or equal to 3 μm and less than or equal to the thickness of a substrate of the wavelength tunable semiconductor laser device.

14. The wavelength tunable semiconductor laser device according to claim 13, further comprising a semiconductor insulating layer insulated by doping ruthenium formed on two side surfaces of each single mesa structure.

15. The wavelength tunable semiconductor laser device according to claim 13, wherein each wavelength tuning region is partially or entirely configured by a non-active waveguide in which a distributed reflector-type diffraction grating is formed or by a non-active waveguide serving as the phase control region.

16. A control method for a wavelength tunable semiconductor laser device including an active region for oscillating a laser beam, a wavelength tuning region for shifting a wavelength of the laser beam, and a thermal compensation region adjacent to the wavelength tuning region for converting most of the inputted electric power to heat, comprising:
   when a laser beam is oscillated from the wavelength tunable semiconductor laser device, controlling an electric current or voltage applied to each of the wavelength tuning region and the thermal compensation region so that the sum of an electric power inputted into the wavelength tuning region and an electric power inputted into the thermal compensation region is always kept constant,
   wherein the thermal compensation region is comprised of a non-active waveguide having a first single mesa structure,
   wherein most of the inputted electric power is converted to heat by injecting an electric current into the non-active waveguide or applying a voltage to the non-active waveguide,
   wherein the active region and the wavelength tuning region are comprised of a waveguide having a second single mesa structure other than the first single mesa structure, and
   wherein the distance between the first single mesa structure and the second single mesa structure is greater than or equal to 3 μm and less than or equal to the thickness of a substrate of the wavelength tunable semiconductor laser device.

17. The control method for a wavelength tunable semiconductor laser device according to claim 16, further comprising:
   finding beforehand a dependency of spontaneously-emitted light on an electric current or voltage in each of the wavelength tuning region and the thermal compensation region;
   subtracting an electric power lost in the wavelength tuning region due to the spontaneously-emitted light and an electric power lost in the thermal compensation region due to the spontaneously-emitted light from the sum of the electric power inputted into the wavelength tuning region and the electric power inputted into the thermal compensation region; and
   controlling the electric current or voltage applied to each of the wavelength tuning region and the thermal compensation region so that an electric power remaining after the subtraction is always kept constant.

18. A control method for a wavelength tunable semiconductor laser device including an active region for oscillating a laser beam, a wavelength tuning region for shifting a wavelength of the laser beam, and a thermal compensation region adjacent to the wavelength tuning region for converting most of the inputted electric power to heat, when a laser beam is oscillated from the wavelength tunable semiconductor laser device, comprising:
   measuring an electric current-voltage characteristic of each of the wavelength tuning region and the thermal compensation region;
   finding an electric current-electric power characteristic of each of the wavelength tuning region and the thermal compensation region from the electric current-voltage characteristics; and
   on the basis of the electric current-voltage characteristics and the electric current-electric power characteristics, determining and controlling an electric current or voltage applied to each of the wavelength tuning region and the thermal compensation region so that the sum of an electric power inputted into the wavelength tuning region and an electric power inputted into the thermal compensation region is always kept constant,
   wherein the thermal compensation region is comprised of a non-active waveguide having a first single mesa structure,
   wherein most of the inputted electric power is converted to heat by injecting an electric current into the non-active waveguide or applying a voltage to the non-active waveguide,
   wherein the active region and the wavelength tuning region are comprised of a waveguide having a second single mesa structure other than the first single mesa structure, and
   wherein the distance between the first single mesa structure and the second single mesa structure is greater than or equal to 3 µm and less than or equal to the thickness of a substrate of the wavelength tunable semiconductor laser device.

19. The control method for a wavelength tunable semiconductor laser device according to claim 18, further comprising:
finding beforehand a dependency of spontaneously-emitted light on an electric current or voltage in each of the wavelength tuning region and the thermal compensation region;
subtracting an electric power lost in the wavelength tuning region due to the spontaneously-emitted light and an electric power lost in the thermal compensation region due to the spontaneously-emitted light from the sum of the electric power inputted into the wavelength tuning region and the electric power inputted into the thermal compensation region; and
controlling the electric current or voltage applied to each of the wavelength tuning region and the thermal compensation region so that an electric power remaining after the subtraction is always kept constant.

20. The control method for a wavelength tunable semiconductor laser device according to claim 18, wherein when the electric current or voltage applied to each of the wavelength tuning region and the thermal compensation region is determined, the electric current or voltage applied to each of the wavelength tuning region and the thermal compensation region is determined on the basis of a simultaneous equation of the electric current-electric power characteristic of the wavelength tuning region and the electric current-electric power characteristic of the thermal compensation region under a condition that the sum of the electric power inputted into the wavelength tuning region and the electric power inputted into the thermal compensation region is always kept constant.

21. The control method for a wavelength tunable semiconductor laser device according to claim 20, further comprising:
finding beforehand a dependency of spontaneously-emitted light on an electric current or voltage in each of the wavelength tuning region and the thermal compensation region;
subtracting an electric power lost in the wavelength tuning region due to the spontaneously-emitted light and an electric power lost in the thermal compensation region due to the spontaneously-emitted light from the sum of the electric power inputted into the wavelength tuning region and the electric power inputted into the thermal compensation region; and
controlling the electric current or voltage applied to each of the wavelength tuning region and the thermal compensation region so that an electric power remaining after the subtraction is always kept constant.

22. A controller for a wavelength tunable semiconductor laser device, comprising:
an active region for oscillating a laser beam;
a wavelength tuning region for shifting a wavelength of the laser beam; and
a thermal compensation region adjacent to the wavelength tuning region for converting most of the inputted electric power to heat, the controller further comprising a control unit for controlling an electric current or voltage applied to each of the wavelength tuning region and the thermal compensation region so that the sum of an electric power inputted into the wavelength tuning region and an electric power inputted into the thermal compensation region is always kept constant when the laser beam is oscillated from the wavelength tunable semiconductor laser device,
wherein the thermal compensation region is comprised of a non-active waveguide having a first single mesa structure,
wherein most of the inputted electric power is converted to heat by injecting an electric current into the non-active waveguide or applying a voltage to the non-active waveguide,
wherein the active region and the wavelength tuning region are comprised of a waveguide having a second single mesa structure other than the first single mesa structure, and
wherein the distance between the first single mesa structure and the second single mesa structure is greater than or equal to 3 µm and less than or equal to the thickness of a substrate of the wavelength tunable semiconductor laser device.

23. A controller for a wavelength tunable semiconductor laser device, comprising:
an active region for oscillating a laser beam;
a wavelength tuning region for shifting a wavelength of the laser beam; and
a thermal compensation region adjacent to the wavelength tuning region for converting most of the inputted electric power to heat, the controller further comprising:
an inputting unit for inputting an electric current or a voltage into each of the active region, the wavelength tuning region and the thermal compensation region;
a measuring unit for measuring an electric current-voltage characteristic of each of the wavelength tuning region and the thermal compensation region;
a storage unit for storing the measured electric current-voltage characteristics;
a processing unit for calculating an electric current-electric power characteristic of each of the wavelength tuning region and the thermal compensation region from the stored electric current-voltage characteristics, and for determining an electric current or voltage applied to each of the wavelength tuning region and the thermal compensation region so that the sum of an electric power inputted into the wavelength tuning region and an electric power inputted into the thermal compensation region is always kept constant, on the basis of the electric current-voltage characteristics and the electric current-electric power characteristics; and
a controlling unit for controlling the determined electric currents or voltages in order to input the determined electric currents or voltages into the wavelength tuning region and the thermal compensation region, respectively,
wherein the thermal compensation region is comprised of a non-active waveguide having a first single mesa structure,
wherein most of the inputted electric power is converted to heat by injecting electric current into the non-active waveguide or a plying a voltage to the non-active waveguide,
wherein the active region and the wavelength tuning region are comprised of a waveguide having a second single mesa structure other than the first single mesa structure, and
wherein the distance between the first single mesa structure and the second single mesa structure is greater than or equal to 3 µm and less than or equal to the thickness of a substrate of the wavelength tunable semiconductor laser device.

24. The controller for a wavelength tunable semiconductor laser device according to claim 23, wherein the storage unit stores a dependency of spontaneously-emitted light on an electric current or voltage in each of the wavelength tuning region and the thermal compensation region, and wherein the processing unit subtracts an electric power lost in the wavelength tuning region due to the spontaneously-emitted light and an electric power lost in the thermal compensation region due to the spontaneously-emitted light from the sum of the electric power inputted into the wavelength tuning region and the electric power inputted into the thermal compensation region, and determines the electric current or voltage applied to each of the wavelength tuning region and the thermal compensation region so that an electric power remaining after the subtraction is always kept constant.

25. The controller for a wavelength tunable semiconductor laser device according to claim 23, wherein when the processing unit determines the electric current or voltage applied to each of the wavelength tuning region and the thermal compensation region, the processing unit determines the electric current or voltage applied to each of the wavelength tuning region and the thermal compensation region on the basis of a simultaneous equation of the electric current-electric power characteristic of the wavelength tuning region and the electric current-electric power characteristic of the thermal compensation region under a condition that the sum of the electric power inputted into the wavelength tuning region and the electric power inputted into the thermal compensation region is always kept constant.

26. The controller for a wavelength tunable semiconductor laser device according to claim 25, wherein the storage unit stores a dependency of spontaneously-emitted light on an electric current or voltage in each of the wavelength tuning region and the thermal compensation region, and wherein the processing unit subtracts an electric power lost in the wavelength tuning region due to the spontaneously-emitted light and an electric power lost in the thermal compensation region due to the spontaneously-emitted light from the sum of the electric power inputted into the wavelength tuning region and the electric power inputted into the thermal compensation region, and determines the electric current or voltage applied to each of the wavelength tuning region and the thermal compensation region so that an electric power remaining after the subtraction is always kept constant.

\* \* \* \* \*